(12) United States Patent
Tanaka et al.

(10) Patent No.: US 12,122,883 B2
(45) Date of Patent: Oct. 22, 2024

(54) METHOD FOR PRODUCING RADIATION-SENSITIVE RESIN COMPOSITION

(71) Applicant: FUJIFILM Corporation, Tokyo (JP)

(72) Inventors: Takumi Tanaka, Shizuoka (JP); Hiroyuki Ezoe, Shizuoka (JP); Kenichi Harada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 527 days.

(21) Appl. No.: 17/534,397

(22) Filed: Nov. 23, 2021

(65) Prior Publication Data

US 2022/0081518 A1    Mar. 17, 2022

Related U.S. Application Data

(63) Continuation of application No. PCT/JP2020/018971, filed on May 12, 2020.

(30) Foreign Application Priority Data

Jun. 25, 2019  (JP) .................................. 2019-117232

(51) Int. Cl.
*C08J 3/09*     (2006.01)
*C08J 3/00*     (2006.01)
(Continued)

(52) U.S. Cl.
CPC ................. *C08J 3/005* (2013.01); *C08K 5/09* (2013.01); *C08L 25/18* (2013.01); *C08J 2325/18* (2013.01)

(58) Field of Classification Search
None
See application file for complete search history.

(56) References Cited

U.S. PATENT DOCUMENTS

2013/0022913 A1    1/2013   Tanaka et al.
2018/0087010 A1    3/2018   Takahashi et al.

FOREIGN PATENT DOCUMENTS

JP    2002351060    12/2002
JP    2009237531    10/2009
(Continued)

OTHER PUBLICATIONS

Machine translation of WO-2018043690-A1 (no date).*
(Continued)

*Primary Examiner* — Michael J Feely
(74) *Attorney, Agent, or Firm* — JCIPRNET

(57) ABSTRACT

A method for producing a radiation-sensitive resin composition includes a step 1 of putting at least a resin having a polarity that increases by an action of an acid, a photoacid generator, and a solvent into a stirring tank, and a step 2 of producing a radiation-sensitive resin composition by stirring and mixing the resin having a polarity that increases by the action of an acid, the photoacid generator, and the solvent in the stirring tank under a gas having an inert gas concentration of 90% by volume or more, in which in the step 2, an atmospheric pressure inside the stirring tank is higher than an atmospheric pressure outside the stirring tank, and in the step 2, a difference between the atmospheric pressure inside the stirring tank and the atmospheric pressure outside the stirring tank is 2.0 kPa or less.

8 Claims, 1 Drawing Sheet

(51) Int. Cl.
     *C08J 3/02*          (2006.01)
     *C08K 5/09*         (2006.01)
     *C08L 25/18*       (2006.01)

(56)            References Cited

FOREIGN PATENT DOCUMENTS

| | | | |
|---|---|---|---|
| JP | 2009249425 | 10/2009 | |
| JP | 2013007846 | 1/2013 | |
| JP | 2015011292 | 1/2015 | |
| WO | 2016181753 | 11/2016 | |
| WO | WO-2018043690 A1 * | 3/2018 | ............. C09K 15/06 |
| WO | WO-2018079449 A1 * | 5/2018 | ............. G03F 7/004 |

OTHER PUBLICATIONS

Machine translation of WO-2018079449-A1 (no date).*
"Search Report of Europe Counterpart Application", issued on Aug. 12, 2022, p. 1-p. 5.
"International Search Report (Form PCT/ISA/210) of PCT/JP2020/018971," mailed on Jul. 21, 2020, with English translation thereof, pp. 1-5.
"Written Opinion of the International Searching Authority (Form PCT/ISA/237)" of PCT/JP2020/018971, mailed on Jul. 21, 2020, with English translation thereof, pp. 1-6.

\* cited by examiner

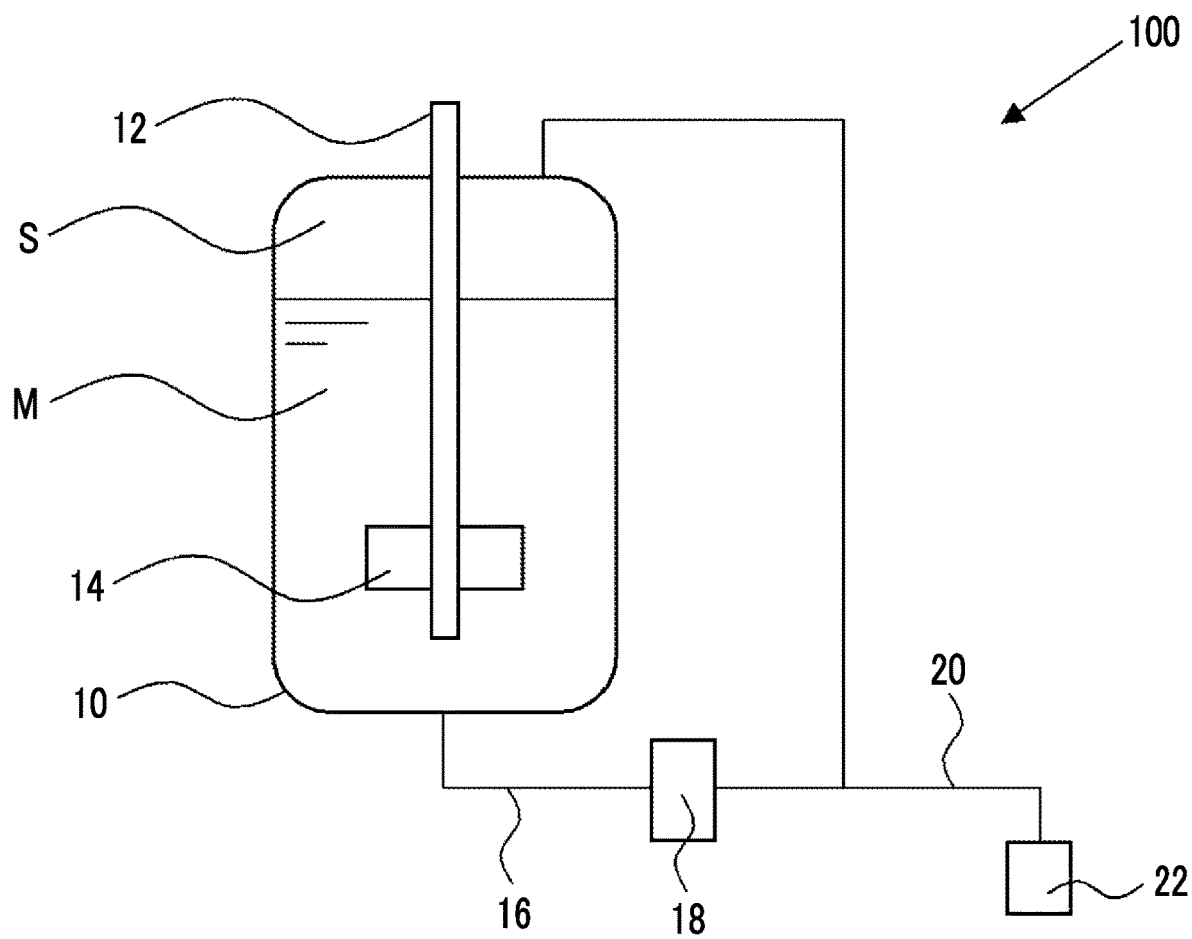

METHOD FOR PRODUCING RADIATION-SENSITIVE RESIN COMPOSITION

CROSS-REFERENCE TO RELATED APPLICATIONS

This application is a Continuation of PCT International Application No. PCT/JP2020/018971 filed on May 12, 2020, which claims priority under 35 U.S.C § 119(a) to Japanese Patent Application No. 2019-117232 filed on Jun. 25, 2019. Each of the above application(s) is hereby expressly incorporated by reference, in its entirety, into the present application.

BACKGROUND OF THE INVENTION

1. Field of the Invention

The present invention relates to a method for producing a radiation-sensitive resin composition.

2. Description of the Related Art

In processes for manufacturing semiconductor devices such as an integrated circuit (IC) and a large scale integrated circuit (LSI) in the related art, microfabrication by lithography using a radiation-sensitive resin composition has been performed.

Examples of the lithography method include a method of forming a resist film with a radiation-sensitive resin composition containing a resin having a polarity that increases by an acid, exposing the obtained film, and then developing the film.

As described in JP2015-011292A, a radiation-sensitive resin composition is usually produced by mixing various components.

SUMMARY OF THE INVENTION

On the other hand, in the formation of a pattern (resist pattern) using a radiation-sensitive resin composition, it is desirable that there are fewer defects in a pattern thus formed. Furthermore, in the present specification, a defect means, for example, that a pattern obtained by carrying out a development treatment has a dent or a chip, and the pattern does not have a predetermined size.

In addition, since the radiation-sensitive resin composition is often used after being stored for a predetermined period, it is desirable that a fluctuation in the sensitivity is small even in a case where the radiation-sensitive resin composition is used after being stored for a predetermined period.

The present inventors have produced a radiation-sensitive resin composition with reference to JP2015-011292A and have examined the characteristics, and as a result, they have found that there was room for a further improvement in terms of achieving both suppression of defects of a pattern and suppression of the fluctuation in a sensitivity after long-term storage described above.

An object of the present invention is to provide a method for producing a radiation-sensitive resin composition, in which the occurrence of defects in a pattern formed is suppressed and the fluctuation in a sensitivity after long-term storage is suppressed.

The present inventors have found that the objects can be accomplished by the following configurations.

(1) A method for producing a radiation-sensitive resin composition comprising:

a step 1 of putting at least a resin having a polarity that increases by an action of an acid, a photoacid generator, and a solvent into a stirring tank; and a step 2 of producing a radiation-sensitive resin composition by stirring and mixing the resin having a polarity that increases by the action of an acid, the photoacid generator, and the solvent in the stirring tank under a gas having an inert gas concentration of 90% by volume or more, in which in the step 2, an atmospheric pressure inside the stirring tank is higher than an atmospheric pressure outside the stirring tank, and in the step 2, a difference between the atmospheric pressure inside the stirring tank and the atmospheric pressure outside the stirring tank is 2.0 kPa or less.

(2) The method for producing a radiation-sensitive resin composition as described in (1), in which the inert gas concentration in the gas is 95% by volume or more.

(3) The method for producing a radiation-sensitive resin composition as described in (1) or (2), in which the difference between the atmospheric pressure inside the stirring tank and the atmospheric pressure outside the stirring tank is 0.8 kPa or less.

(4) The method for producing a radiation-sensitive resin composition as described in any one of (1) to (3), in which a gas in the stirring tank is substituted with the gas having an inert gas concentration of 90% by volume or more before the step 1.

(5) The method for producing a radiation-sensitive resin composition as described in any one of (1) to (3), in which a gas in the stirring tank is substituted with the gas having an inert gas concentration of 90% by volume or more in the step 1.

(6) The method for producing a radiation-sensitive resin composition as described in any one of (1) to (3), in which a gas in the stirring tank is substituted with the gas having an inert gas concentration of 90% by volume or more between the step 1 and the step 2.

(7) The method for producing a radiation-sensitive resin composition as described in any one of (1) to (6), in which a concentration of solid contents of the radiation-sensitive resin composition is 10% by mass or more.

(8) The method for producing a radiation-sensitive resin composition as described in any one of (1) to (7), in which the resin having a polarity that increases by the action of an acid has a repeating unit derived from hydroxystyrene.

According to the present invention, it is possible to provide a method for producing a radiation-sensitive resin composition, in which the occurrence of defects in a pattern thus formed is suppressed and a fluctuation in a sensitivity after long-term storage is suppressed.

BRIEF DESCRIPTION OF THE DRAWINGS

FIG. 1 shows a schematic view of an embodiment of a device used in a method for producing a radiation-sensitive resin composition of the embodiment of the present invention.

DESCRIPTION OF THE PREFERRED EMBODIMENTS

Hereinafter, an example of forms for carrying out the present invention will be described.

In the present specification, a numerical value range expressed using "to" means a range that includes the preceding and succeeding numerical values of "to" as a lower limit value and an upper limit value, respectively.

In notations for a group (atomic group) in the present specification, in a case where the group is cited without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

The bonding direction of divalent groups cited in the present specification is not limited unless otherwise specified. For example, in a compound represented by General Formula "LMN", M may be either *1-OCO—C(CN)=CH-*2 or *1-CH=C(CN)—COO-*2, assuming that in a case where M is —OCO—C(CN)=CH—, a position bonded to the L side is defined as *1 and a position bonded to the N side is defined as *2.

"(Meth)acryl" in the present specification is a generic term encompassing acryl and methacryl, and means "at least one of acryl or methacryl". Similarly, "(meth)acrylic acid" means "at least one of acrylic acid or methacrylic acid".

In the present specification, a weight-average molecular weight (Mw), a number-average molecular weight (Mn), and a dispersity (also described as a molecular weight distribution) (Mw/Mn) of a resin are defined as values expressed in terms of polystyrene by means of gel permeation chromatography (GPC) measurement (solvent: tetrahydrofuran, flow amount (amount of a sample injected): 10 µL, columns: TSK gel Multipore HXL-M manufactured by Tosoh Corporation, column temperature: 40° C., flow rate: 1.0 mL/min, and detector: differential refractive index detector) using a GPC apparatus (HLC-8120GPC manufactured by Tosoh Corporation).

"Radiation" in the present specification means, for example, a bright line spectrum of a mercury lamp, far ultraviolet rays typified by an excimer laser, extreme ultraviolet rays (EUV), X-rays, electron beams (EB), or the like. "Light" in the present specification means radiation.

As one of the features of the method for producing a radiation-sensitive resin composition of the embodiment of the present invention (hereinafter also simply described as "the composition of the embodiment of the present invention", "the composition", or "the resist composition"), production of a radiation-sensitive resin composition by stirring and mixing a resin having a polarity that increases by the action of an acid, a photoacid generator, and a solvent under a gas having an inert gas concentration of 90% by volume or more (hereinafter also simply described as a "specific gas"), as described in the step 2 which will be described later may be mentioned.

The present inventors have examined the problems of the related art, and have thus found that in the production of a radiation-sensitive resin composition, there is a fluctuation in a sensitivity after long-term storage of the radiation-sensitive resin composition due to moisture and oxygen incorporated into the radiation-sensitive resin composition. In the production method of the embodiment of the present invention, the respective components constituting the radiation-sensitive resin composition are stirred and mixed under a specific gas in order to prevent such incorporation of moisture and oxygen. At that time, it is possible to prevent moisture and oxygen in the air outside the stirring tank from being incorporated into the stirring tank by making the atmospheric pressure inside the stirring tank higher than the atmospheric pressure outside the stirring tank. In addition, the present inventors have found that in a case where the atmospheric pressure inside the stirring tank is too high than the atmospheric pressure outside the stirring tank, in other words, in a case where the atmospheric pressure of the specific gas is too high, the specific gas is dissolved in the radiation-sensitive resin composition, leading to defects in a pattern formed. Therefore, the present inventors have found that the defects of the pattern can be suppressed by controlling a difference between the atmospheric pressure inside the stirring tank and the atmospheric pressure outside the stirring tank to 2.0 kPa or less.

The production method of the embodiment of the present invention has the following steps 1 and 2.

Step 1: A step of putting at least a resin having a polarity that increases by an action of an acid, a photoacid generator, and a solvent into a stirring tank Step 2: A step of producing a radiation-sensitive resin composition by stirring and mixing the resin having a polarity that increases by the action of an acid, the photoacid generator, and the solvent in the stirring bank under a gas having an inert gas concentration of 90% by volume or more Hereinafter, a procedure of each step will be described in detail.

Furthermore, the production method of the embodiment of the present invention is preferably carried out in a clean room. The degree of cleanliness is preferably Class 6 or less, more preferably Class 5 or less, and still more preferably Class 4 or less in INTERNATIONAL STANDARD ISO 14644-1.

<Step 1>

The step 1 is a step of putting at least a resin having a polarity that increases by the action of an acid, a photoacid generator, and a solvent into the stirring tank.

Details of the resin having a polarity that increases by the action of an acid, the photoacid generator, and the solvent used in the step 1 will be described later.

In addition, in the step 1, other components other than the resin having a polarity that increases by the action of an acid, the photoacid generator, and the solvent may also be put into the stirring tank. Examples of other components include an acid diffusion control agent, a hydrophobic resin, a surfactant, an alkali-soluble resin having a phenolic hydroxyl group, an onium carboxylate salt, and a dissolution inhibiting compound. Details of other components will also be described later.

FIG. 1 shows a schematic view of an embodiment of a device used in the production method of the embodiment of the present invention.

A device 100 has a stirring tank 10, a stirring shaft 12 rotatably mounted in the stirring tank 10, a stirring blade 14 attached to the stirring shaft 12, a circulation pipe 16 having one end connected to a bottom part of the stirring tank 10 and another end connected to an upper part of the stirring tank 10, a filter 18 arranged in the middle of the circulation pipe 16, a discharge pipe 20 connected to the circulation pipe 16, and a discharge nozzle 22 arranged on an end part of the discharge pipe 20.

It is preferable that a liquid contact portion (a part in contact with the liquid) in the device is lined or coated with a fluorine resin and the like.

In addition, it is preferable that the device 100 is washed with a solvent in advance before carrying out the production method of the embodiment of the present invention. Examples of the solvent and the washing method used include known methods, and examples thereof include the solvent and the washing method of JP2015-197646A.

The stirring tank 10 is not particularly limited as long as it can contain a resin having a polarity that increases by the action of an acid, a photoacid generator, and a solvent, and examples thereof include known stirring tanks.

A shape of the bottom part of the stirring tank 10 is not particularly limited, examples thereof include a dish-like end plate shape, a semi-elliptical end plate shape, a flat end plate shape, and a conical end plate shape, and the dish-like end plate shape and the semi-elliptical end plate shape are preferable.

Baffle plates may be installed in the stirring tank 10 in order to improve the stirring efficiency.

The number of the baffle plates is not particularly limited, and is preferably 2 to 8.

A width of the baffle plate in the horizontal direction of the stirring tank 10 is not particularly limited, and is preferably ⅛ to ½ of the diameter of the stirring tank.

A length of the baffle plate in the height direction of the stirring tank is not particularly limited, but is preferably ½ or more, more preferably ⅔ or more, and still more preferably ¾ or more of the height from the bottom part of the stirring tank to the liquid level of the component to be put.

It is preferable that a drive source (for example, a motor) (not shown) is attached to the stirring shaft 12. In a case where the stirring shaft 12 is rotated by the drive source, the stirring blade 14 is rotated and each component put into the stirring tank 10 is stirred.

The shape of the stirring blade 14 is not particularly limited, and examples thereof include a paddle blade, a propeller blade, and a turbine blade.

Furthermore, the stirring tank 10 may have a material charging port for putting various materials into the stirring tank.

Moreover, the stirring tank 10 may have a gas introduction port for introducing a gas into the inside of the tank.

In addition, the stirring tank 10 may have a gas discharge port for discharging the gas inside the tank to the outside of the stirring tank.

A procedure for putting the resin having a polarity that increases by the action of an acid, the photoacid generator, and the solvent into the stirring tank 10 is not particularly limited.

Examples thereof include a method of that the above-mentioned components from a material charging port (not shown) of the stirring tank 10. In a case of putting the components, the components may be added sequentially or collectively. Furthermore, in a case of putting one component, the component may be put a plurality of times.

In addition, in a case where the respective components are sequentially put into the stirring tank 10, the putting order is not particularly limited. For example, in a case where five components of a resin having a polarity that increases by the action of an acid (denoted as "Polymer" in Tables 1 and 2), a photoacid generator, a solvent, an acid diffusion control agent, and an additive are put into the stirring tank 10, there may be 120 putting methods as shown in Tables 1 and 2 below.

Moreover, Tables 1 and 2 show the order (1 to 5) in which the five components are put into the stirring tank 10.

TABLE 1

| Example | Putting order | | | | |
|---|---|---|---|---|---|
| | 1 | 2 | 3 | 4 | 5 |
| 1 | Polymer | Solvent | Photoacid generator | Acid diffusion control agent | Additive |
| 2 | Polymer | Solvent | Photoacid generator | Additive | Acid diffusion control agent |
| 3 | Polymer | Solvent | Acid diffusion control agent | Photoacid generator | Additive |
| 4 | Polymer | Solvent | Acid diffusion control agent | Additive | Photoacid generator |
| 5 | Polymer | Solvent | Additive | Photoacid generator | Acid diffusion control agent |
| 6 | Polymer | Solvent | Additive | Acid diffusion control agent | Photoacid generator |
| 7 | Polymer | Photoacid generator | Solvent | Acid diffusion control agent | Additive |
| 8 | Polymer | Photoacid generator | Solvent | Additive | Acid diffusion control agent |
| 9 | Polymer | Photoacid generator | Acid diffusion control agent | Solvent | Additive |
| 10 | Polymer | Photoacid generator | Acid diffusion control agent | Additive | Solvent |
| 11 | Polymer | Photoacid generator | Additive | Solvent | Acid diffusion control agent |
| 12 | Polymer | Photoacid generator | Additive | Acid diffusion control agent | Solvent |
| 13 | Polymer | Acid diffusion control agent | Solvent | Photoacid generator | Additive |
| 14 | Polymer | Acid diffusion control agent | Solvent | Additive | Photoacid generator |
| 15 | Polymer | Acid diffusion control agent | Photoacid generator | Solvent | Additive |
| 16 | Polymer | Acid diffusion control agent | Photoacid generator | Additive | Solvent |
| 17 | Polymer | Acid diffusion control agent | Additive | Solvent | Photoacid generator |
| 18 | Polymer | Acid diffusion control agent | Additive | Photoacid generator | Solvent |

| # | | | | | |
|---|---|---|---|---|---|
| 19 | Polymer | Additive | Solvent | Photoacid generator | Acid diffusion control agent |
| 20 | Polymer | Additive | Solvent | Acid diffusion control agent | Photoacid generator |
| 21 | Polymer | Additive | Photoacid generator | Solvent | Acid diffusion control agent |
| 22 | Polymer | Additive | Photoacid generator | Acid diffusion control agent | Solvent |
| 23 | Polymer | Additive | Acid diffusion control agent | Solvent | Photoacid generator |
| 24 | Polymer | Additive | Acid diffusion control agent | Photoacid generator | Solvent |
| 25 | Solvent | Polymer | Photoacid generator | Acid diffusion control agent | Additive |
| 26 | Solvent | Polymer | Photoacid generator | Additive | Acid diffusion control agent |
| 27 | Solvent | Polymer | Acid diffusion control agent | Photoacid generator | Additive |
| 28 | Solvent | Polymer | Acid diffusion control agent | Additive | Photoacid generator |
| 29 | Solvent | Polymer | Additive | Photoacid generator | Acid diffusion control agent |
| 30 | Solvent | Polymer | Additive | Acid diffusion control agent | Photoacid generator |
| 31 | Solvent | Photoacid generator | Polymer | Acid diffusion control agent | Additive |
| 32 | Solvent | Photoacid generator | Polymer | Additive | Acid diffusion control agent |
| 33 | Solvent | Photoacid generator | Acid diffusion control agent | Polymer | Additive |
| 34 | Solvent | Photoacid generator | Acid diffusion control agent | Additive | Polymer |
| 35 | Solvent | Photoacid generator | Additive | Polymer | Acid diffusion control agent |
| 36 | Solvent | Photoacid generator | Additive | Acid diffusion control agent | Polymer |
| 37 | Solvent | Acid diffusion control agent | Polymer | Photoacid generator | Additive |
| 38 | Solvent | Acid diffusion control agent | Polymer | Additive | Photoacid generator |
| 39 | Solvent | Acid diffusion control agent | Photoacid generator | Polymer | Additive |
| 40 | Solvent | Acid diffusion control agent | Photoacid generator | Additive | Polymer |
| 41 | Solvent | Acid diffusion control agent | Additive | Polymer | Photoacid generator |
| 42 | Solvent | Acid diffusion control agent | Additive | Photoacid generator | Polymer |
| 43 | Solvent | Additive | Polymer | Photoacid generator | Acid diffusion control agent |
| 44 | Solvent | Additive | Polymer | Acid diffusion control agent | Photoacid generator |
| 45 | Solvent | Additive | Photoacid generator | Polymer | Acid diffusion control agent |
| 46 | Solvent | Additive | Photoacid generator | Acid diffusion control agent | Polymer |
| 47 | Solvent | Additive | Acid diffusion control agent | Polymer | Photoacid generator |
| 48 | Solvent | Additive | Acid diffusion control agent | Photoacid generator | Polymer |
| 49 | Photoacid generator | Polymer | Solvent | Acid diffusion control agent | Additive |
| 50 | Photoacid generator | Polymer | Solvent | Additive | Acid diffusion control agent |
| 51 | Photoacid generator | Polymer | Acid diffusion control agent | Solvent | Additive |
| 52 | Photoacid generator | Polymer | Acid diffusion control agent | Additive | Solvent |
| 53 | Photoacid generator | Polymer | Additive | Solvent | Acid diffusion control agent |
| 54 | Photoacid generator | Polymer | Additive | Acid diffusion control agent | Solvent |
| 55 | Photoacid generator | Solvent | Polymer | Acid diffusion control agent | Additive |
| 56 | Photoacid generator | Solvent | Polymer | Additive | Acid diffusion control agent |

| | | -continued | | | |
|---|---|---|---|---|---|
| 57 | Photoacid generator | Solvent | Acid diffusion control agent | Polymer | Additive |
| 58 | Photoacid generator | Solvent | Acid diffusion control agent | Additive | Polymer |
| 59 | Photoacid generator | Solvent | Additive | Polymer | Acid diffusion control agent |
| 60 | Photoacid generator | Solvent | Additive | Acid diffusion control agent | Polymer |

Table 2

| | Putting order | | | | |
|---|---|---|---|---|---|
| Example | 1 | 2 | 3 | 4 | 5 |
| 61 | Photoacid generator | Acid diffusion control agent | Polymer | Solvent | Additive |
| 62 | Photoacid generator | Acid diffusion control agent | Polymer | Additive | Solvent |
| 63 | Photoacid generator | Acid diffusion control agent | Solvent | Polymer | Additive |
| 64 | Photoacid generator | Acid diffusion control agent | Solvent | Additive | Polymer |
| 65 | Photoacid generator | Acid diffusion control agent | Additive | Polymer | Solvent |
| 66 | Photoacid generator | Acid diffusion control agent | Additive | Solvent | Polymer |
| 67 | Photoacid generator | Additive | Polymer | Solvent | Acid diffusion control agent |
| 68 | Photoacid generator | Additive | Polymer | Acid diffusion control agent | Solvent |
| 69 | Photoacid generator | Additive | Solvent | Polymer | Acid diffusion control agent |
| 70 | Photoacid generator | Additive | Solvent | Acid diffusion control agent | Polymer |
| 71 | Photoacid generator | Additive | Acid diffusion control agent | Polymer | Solvent |
| 72 | Photoacid generator | Additive | Acid diffusion control agent | Solvent | Polymer |
| 73 | Acid diffusion control agent | Polymer | Solvent | Photoacid generator | Additive |
| 74 | Acid diffusion control agent | Polymer | Solvent | Additive | Photoacid generator |
| 75 | Acid diffusion control agent | Polymer | Photoacid generator | Solvent | Additive |
| 76 | Acid diffusion control agent | Polymer | Photoacid generator | Additive | Solvent |
| 77 | Acid diffusion control agent | Polymer | Additive | Solvent | Photoacid generator |
| 78 | Acid diffusion control agent | Polymer | Additive | Photoacid generator | Solvent |
| 79 | Acid diffusion control agent | Solvent | Polymer | Photoacid generator | Additive |
| 80 | Acid diffusion control agent | Solvent | Polymer | Additive | Photoacid generator |
| 81 | Acid diffusion control agent | Solvent | Photoacid generator | Polymer | Additive |
| 82 | Acid diffusion control agent | Solvent | Photoacid generator | Additive | Polymer |
| 83 | Acid diffusion control agent | Solvent | Additive | Polymer | Photoacid generator |
| 84 | Acid diffusion control agent | Solvent | Additive | Photoacid generator | Polymer |
| 85 | Acid diffusion control agent | Photoacid generator | Polymer | Solvent | Additive |
| 86 | Acid diffusion control agent | Photoacid generator | Polymer | Additive | Solvent |
| 87 | Acid diffusion control agent | Photoacid generator | Solvent | Polymer | Additive |
| 88 | Acid diffusion control agent | Photoacid generator | Solvent | Additive | Polymer |
| 89 | Acid diffusion control agent | Photoacid generator | Additive | Polymer | Solvent |
| 90 | Acid diffusion control agent | Photoacid generator | Additive | Solvent | Polymer |
| 91 | Acid diffusion control agent | Additive | Polymer | Solvent | Photoacid generator |
| 92 | Acid diffusion control agent | Additive | Polymer | Photoacid generator | Solvent |
| 93 | Acid diffusion control agent | Additive | Solvent | Polymer | Photoacid generator |

-continued

| | | | | | |
|---|---|---|---|---|---|
| 94 | Acid diffusion control agent | Additive | Solvent | Photoacid generator | Polymer |
| 95 | Acid diffusion control agent | Additive | Photoacid generator | Polymer | Solvent |
| 96 | Acid diffusion control agent | Additive | Photoacid generator | Solvent | Polymer |
| 97 | Additive | Polymer | Solvent | Photoacid generator | Acid diffusion control agent |
| 98 | Additive | Polymer | Solvent | Acid diffusion control agent | Photoacid generator |
| 99 | Additive | Polymer | Photoacid generator | Solvent | Acid diffusion control agent |
| 100 | Additive | Polymer | Photoacid generator | Acid diffusion control agent | Solvent |
| 101 | Additive | Polymer | Acid diffusion control agent | Solvent | Photoacid generator |
| 102 | Additive | Polymer | Acid diffusion control agent | Photoacid generator | Solvent |
| 103 | Additive | Solvent | Polymer | Photoacid generator | Acid diffusion control agent |
| 104 | Additive | Solvent | Polymer | Acid diffusion control agent | Photoacid generator |
| 105 | Additive | Solvent | Photoacid generator | Polymer | Acid diffusion control agent |
| 106 | Additive | Solvent | Photoacid generator | Acid diffusion control agent | Polymer |
| 107 | Additive | Solvent | Acid diffusion control agent | Polymer | Photoacid generator |
| 108 | Additive | Solvent | Acid diffusion control agent | Photoacid generator | Polymer |
| 109 | Additive | Photoacid generator | Polymer | Solvent | Acid diffusion control agent |
| 110 | Additive | Photoacid generator | Polymer | Acid diffusion control agent | Solvent |
| 111 | Additive | Photoacid generator | Solvent | Polymer | Acid diffusion control agent |
| 112 | Additive | Photoacid generator | Solvent | Acid diffusion control agent | Polymer |
| 113 | Additive | Photoacid generator | Acid diffusion control | Polymer | Solvent |
| 114 | Additive | Photoacid generator | Acid diffusion control agent | Solvent | Polymer |
| 115 | Additive | Acid diffusion control agent | Polymer | Solvent | Photoacid generator |
| 116 | Additive | Acid diffusion control agent | Polymer | Photoacid generator | Solvent |
| 117 | Additive | Acid diffusion control agent | Solvent | Polymer | Photoacid generator |
| 118 | Additive | Acid diffusion control agent | Solvent | Photoacid generator | Polymer |
| 119 | Additive | Acid diffusion control agent | Photoacid generator | Polymer | Solvent |
| 120 | Additive | Acid diffusion control agent | Photoacid generator | Solvent | Polymer |

In addition, in a case where a component other than a solvent is put into the stirring tank, the component may be put into the stirring tank 10 as a solution in which the component is dissolved in the solvent. At that time, in order to remove a insoluble matter in the solution, the solution may be filtered and then put into the stirring tank 10.

Furthermore, in a case where the solvent is put into the stirring tank 10, the solvent may be filtered and then put into the stirring tank 10.

In addition, in a case where various components are put into the stirring tank 10, a liquid feeding pump may be used.

A concentration of the component in the solution in which the component is dissolved is not particularly limited, but is preferably 10% to 50% by mass with respect to a total mass of the solution.

A kind of a filter used for the filter filtration is not particularly limited, and a known filter is used.

A pore diameter (pore size) of the filter is preferably 0.20 µm or less, more preferably 0.10 µm or less, and still more preferably 0.05 µm or less.

As a material of the filter, a fluorine resin such as polytetrafluoroethylene, a polyolefin resin such as polypropylene and polyethylene, and a polyamide resin such as nylon 6 and nylon 66 are preferable.

As the filter, a filter which has been washed with an organic solvent in advance may be used.

In the filtration using a filter, a plurality of filters connected in series or in parallel may be used. In a case where the plurality of filters are used, a combination of filters having different pore diameters and/or materials may be used. In addition, in the filtration with a filter, circulatory filtration may be carried out. As a method of circulatory filtration, for example, the method disclosed in JP2002-62667A is preferable.

As the filter, a filter having a reduced amount of elutes as disclosed in JP2016-201426A is preferable.

Moreover, after the filter filtration, impurities may be further removed by an adsorbing material.

Usually, in a case where a resin having a polarity that increases by the action of an acid, a photoacid generator, and a solvent are put into a stirring tank, it is preferable that the components are put so that a space is generated in the stirring tank. More specifically, as shown in FIG. 1, it is preferable that each component is put into the stirring tank so that a space S (void S) is not generated in the stirring tank 10, which is not occupied by a mixture M containing at least a resin having a polarity that increases by the action of an acid, a photoacid generator, and a solvent.

An occupancy of the mixture containing at least the resin having a polarity that increases by the action of an acid, the photoacid generator, and the solvent in the stirring tank is not particularly limited, but is preferably 50% to 95% by volume, and more preferably 80% to 90% by volume.

Furthermore, an occupancy of the mixture is determined by Expression (1).

$$\text{Occupancy} = \{(\text{Volume of mixture in stirring tank}/\text{Volume of container in stirring tank})\} \times 100 \quad \text{Expression (1):}$$

In addition, a void ratio (proportion occupied by the space (void)) in the stirring tank is preferably 5% to 50% by volume, and more preferably 10% to 20% by volume.

The void ratio is determined by Expression (2).

$$\text{Void ratio} = \{1-(\text{Volume of mixture in stirring tank}/\text{Volume of container in stirring tank})\} \times 100 \quad \text{Expression (2):}$$

<Step 2>

The step 2 is a step of producing a radiation-sensitive resin composition by stirring and mixing the resin having a polarity that increases by the action of an acid, the photoacid generator, and the solvent in the stirring tank under a specific gas. More specifically, in the step 2, the resin having a polarity that increases by the action of an acid, the photoacid generator, and the solvent are stirred and mixed in the state where the space S shown in FIG. 1 is filled with the specific gas (charged state).

In the specific gas, the inert gas concentration is 90% by volume or more in a total volume of the specific gas. Among those, the inert gas concentration is preferably 95% by volume or more from at least one of the viewpoints that the occurrence of defects in a pattern formed is further suppressed or the fluctuation in a sensitivity after long-term storage is further suppressed (hereinafter simply also described as follows: "the effect of the present invention is more excellent". An upper limit thereof is not particularly limited, but may be 100% by mass.

Examples of the inert gas include nitrogen and noble gases such as helium and argon. Examples of a gas other than the inert gas in the specific gas include oxygen and water vapor.

In the step 2, it is sufficient that various components can be stirred and mixed in the presence of the specific gas, and a time (timing) for substituting the gas in the stirring tank with the specific gas is not particularly limited.

For example, a method in which a step 3 of substituting the gas in the stirring tank with a specific gas is carried out before the above-mentioned step 1 may be mentioned. That is, a method in which the gas in the stirring tank is substituted with the specific gas before putting the resin having a polarity that increases by the action of an acid, the photoacid generator, and the solvent into the stirring tank may be mentioned. Examples of the substituting method include a method of supplying (introducing) an inert gas into the stirring tank. In a case where the step 3 is carried out, it is preferable that the steps 1 and 2 are carried out while introducing the specific gas into the stirring tank in order to maintain the state where the gas in the stirring tank is the specific gas. That is, it is preferable to start the introduction of the specific gas into the stirring tank before the step 1, and then carry out the steps 1 and 2 in the presence of the specific gas (in the state where the space of the stirring tank is filled with the specific gas).

In addition, a method in which a step 4 of substituting the gas in the stirring tank with a specific gas is carried out in the above-mentioned step 1 may be mentioned. That is, a method in which the gas in the stirring tank is substituted with the specific gas at the same time as the time of charging the resin having a polarity that increases by the action of an acid, the photoacid generator, and the solvent into the stirring tank. Examples of the substituting method include a method of supplying (introducing) an inert gas into the stirring tank. In a case where the step 4 is carried out, it is preferable that the step 2 is carried out while introducing the specific gas into the stirring tank in order to maintain the state where the gas in the stirring tank is the specific gas. That is, in the step 1, it is preferable to start introducing the specific gas into the stirring tank and carry out the step 2 in the presence of the specific gas (in a state where the space of the stirring tank is filled with the specific gas).

In addition, a method in which a step 5 of substituting the gas in the stirring tank with a specific gas is carried out between the above-mentioned steps 1 and 2 may be mentioned. That is, a method in which the gas in the stirring tank is substituted with the specific gas after charging the resin having a polarity that increases by the action of an acid, the photoacid generator, and the solvent into the stirring tank may be mentioned. Examples of the substituting method include a method of supplying (introducing) an inert gas into the stirring tank. In a case where the step 5 is carried out, it is preferable to carry out the step 2 while introducing the specific gas into the stirring tank in order to maintain the state in which the gas in the stirring tank is the specific gas. That is, it is preferable to start the introduction of the specific gas into the stirring tank after the step 1, and then carry out the step 2 in the presence of the specific gas (in the state where the space of the stirring tank is filled with the specific gas).

Among those, it is preferable to carry out the step 3 from the viewpoint that the effect of the present invention is more excellent.

Furthermore, in a case where the inert gas is supplied (introduced) into the stirring tank, it may be supplied through a gas filter for the inert gas or compressed air.

In the step 2, the atmospheric pressure inside the stirring tank is adjusted to be higher than the atmospheric pressure outside the stirring tank. By maintaining this state, it is possible to suppress the gas containing moisture and oxygen outside the stirring tank from being incorporated into the stirring tank.

Examples of the method of maintaining the state include a method of continuously introducing the specific gas into the stirring tank.

In addition, in the step 2, the difference between the atmospheric pressure inside the stirring tank and the atmospheric pressure outside the stirring tank is adjusted to be 2.0 kPa or less. In other words, the difference between the atmospheric pressure of the specific gas in the space inside the stirring tank and the atmospheric pressure outside the stirring tank is adjusted to be 2.0 kPa or less. By maintaining this state, it is possible to suppress the dissolution of the specific gas into the mixture in the stirring tank, and as a result, it is possible to suppress the occurrence of defects in a pattern thus formed.

The difference is preferably 1.8 kPa or less, more preferably 1.5 kPa or less, and still more preferably 0.8 kPa or less from the viewpoint that the effect of the present invention is more excellent. The lower limit is not particularly limited, but is preferably 0.1 kPa or more.

Furthermore, a method for measuring the atmospheric pressure inside the stirring tank and the atmospheric pressure outside the stirring tank is not particularly limited, and is carried out using a commercially available barometer.

In the step 2, the resin having a polarity that increases by the action of an acid, the photoacid generator, and the solvent are stirred and mixed under a specific gas. A method for performing the stirring and mixing is not particularly limited, but is preferably carried out with by the above-mentioned stirring blade. Furthermore, in a case of performing the stirring and mixing, it is preferable to perform the stirring in consideration of a shape and a size of the stirring blade, an installation location, a stirring rotation speed, and the like so that the liquid is sufficiently stirred.

A temperature of the mixture containing the resin having a polarity that increases by the action of an acid, the photoacid generator, and the solvent during stirring and mixing is not particularly limited, but is preferably 15° C. to 32° C., and more preferably 20° C. to 24° C.

In addition, in a case of performing the stirring and mixing, the temperature of the mixture is preferably kept constant, and is preferably within ±10° C., more preferably within ±5° C., and still more preferably within ±1° C. from a set temperature.

A stirring and mixing time is not particularly limited, but is preferably 1 to 48 hours, and more preferably 15 to 24 hours from the viewpoint of a balance of the uniformity of the obtained radiation-sensitive resin composition and the productivity.

A rotation speed of the stirring blade during the stirring and mixing is not particularly limited, but is preferably 20 to 500 rpm, more preferably 40 to 350 rpm, and still more preferably 50 to 300 rpm from the viewpoint that the effect of the present invention is more excellent.

Furthermore, in a case of stopping the stirring and mixing, it is preferable to confirm that various components are dissolved in the solvent.

During the stirring and mixing, ultrasonic waves may be applied to the mixture.

A moisture content in a radiation-sensitive resin composition produced by the production method of the embodiment of the present invention is not particularly limited, but is preferably 0.10% by mass or less, and more preferably 0.06% by mass or less, and still more preferably 0.04% by mass or less from the viewpoint that the effect of the present invention is more excellent. A lower limit of the moisture content is not particularly limited, but is often 0.01% by mass or more.

Examples of a method for measuring the moisture content in the radiation-sensitive resin composition include a method using a Karl Fischer moisture measuring device.

An oxygen content in a radiation-sensitive resin composition produced by the production method of the embodiment of the present invention is not particularly limited, but is preferably 0.030 µg/µL or less, and more preferably 0.027 µg/µL from the viewpoint that the effect of the present invention is more excellent. A lower limit of the oxygen content is not particularly limited, but is often 0.001 µg/µL or more.

A dissolved gas content in a radiation-sensitive resin composition produced by the production method of the embodiment of the present invention is not particularly limited, but is preferably 0.210 µg/µL or less, and more preferably 0.190 µg/µL or less from the viewpoint that the effect of the present invention is more excellent. A lower limit of the dissolved gas content is not particularly limited, but is often 0.001 µg/µL or more.

Examples of a method for measuring the dissolved gas content in the radiation-sensitive resin composition include a method using gas chromatography (GC390 manufactured by GL Sciences Inc.) having a thermal conductivity detector (TCD).

Moreover, in the present specification, the dissolved gas content corresponds to a sum of the nitrogen content and the oxygen content.

After carrying out the step 2, a radiation-sensitive resin composition thus produced may be subjected to a filtration treatment.

For example, a method in which the radiation-sensitive resin composition produced in the stirring tank 10 is fed to the circulation pipe 16 and filtered with the filter 18 in the device 100 shown in FIG. 1 may be mentioned. In a case where the radiation-sensitive resin composition is fed from the stirring tank 10 to the circulation pipe 16, it is preferable to open a valve (not shown) to feed the radiation-sensitive resin composition to the circulation pipe 16.

The circulatory filtration may be carried out continuously a plurality of times. That is, the radiation-sensitive resin composition may be continuously fed to the circulation pipe and passed through the filter 18 a plurality of times.

A method for feeding the radiation-sensitive resin composition from the stirring tank 10 to the circulation pipe 16 is not particularly limited, and examples thereof include a method of feeding a liquid using gravity, a method of applying a pressure from a liquid level side of the radiation-sensitive resin composition, a method of setting a pressure on the circulation pipe 16 side to a negative pressure, and a method obtained by combination of two or more of these methods.

In a case of the method of applying a pressure from the liquid level side of the radiation-sensitive resin composition, examples of the method include a method of utilizing a flow pressure generated by feeding of liquid and a method of pressurizing the gas.

The flow pressure is preferably generated by, for example, a pump (a liquid feeding pump, a circulation pump, and the like), or the like. Examples of the pump include uses of a rotary pump, a diaphragm pump, a metering pump, a chemical pump, a plunger pump, a bellows pump, a gear pump, a vacuum pump, an air pump, and a liquid pump, as well as commercially available pumps as appropriate. A position where the pump is arranged is not particularly limited.

The gas used for pressurization is preferably a gas which is inert or non-reactive with respect to the radiation-sensitive resin composition, and specific examples thereof include nitrogen and noble gases such as helium and argon. It is preferable that the circulation pipe 16 side is not decompressed but has an atmospheric pressure.

As a method of making the circulation pipe 16 side a negative pressure, decompression by a pump is preferable, and decompression to vacuum is more preferable.

Examples of the filter 18 include the filter used in the filter filtration described in the step 1.

A differential pressure (a pressure difference between the upstream side and the downstream side) applied to the filter 18 is preferably 200 kPa or less, and more preferably 100 kPa or less.

In addition, in a case of performing the filtration with the filter 18, it is preferable that a change in the differential pressure during the filtration is small. The differential pressure before and after the filtration for a period from a point in time that 90% by mass of the solution to be filtered is finished to a point in time that the passage of the liquid through a filter is started is maintained to be preferably within ±50 kPa, and more preferably within ±20 kPa of the differential pressure before and after the filtration at the point in time that the passage of the liquid is started.

In a case of performing the filtration with the filter 18, a linear velocity is preferably in the range of 3 to 150 L/(hr·m$^2$), more preferably 5 to 120 L/(hr·m$^2$), and still more preferably 10 to 100 L/(hr·m$^2$).

Moreover, in the device 100 shown in FIG. 1, a buffer tank in which the filtered radiation-sensitive resin composition is stored may be arranged on the downstream side of the filter 18.

As shown in FIG. 1, the radiation-sensitive resin composition produced in the stirring tank 10 may be fed to the discharge pipe 20, discharged from the discharge nozzle 22 arranged at the end part of the discharge pipe 20, and contained in a predetermined container.

In a case where the radiation-sensitive resin composition is charged into the container, the charging rate is preferably 0.3 to 3 L/min, more preferably 0.4 to 2.0 L/min, an still more preferably 0.5 to 1.5 L/min, with a capacity of the container being, for example, 0.75 L or more and less than 5 L.

A plurality of discharge nozzles may be arranged in parallel and charging may be performed at the same time in order to improve a charge efficiency.

Examples of the container include a bloom-treated glass container and a container in which the liquid contact portion is treated to be a fluorine resin.

In a case where the radiation-sensitive resin composition is contained in the container, a space in the container (a region in the container not occupied by the radiation-sensitive resin composition) may be substituted with a predetermined gas. The gas is preferably a gas which is inert or non-reactive with respect to the radiation-sensitive resin composition, and specific examples thereof include nitrogen and noble gases such as helium and argon.

Before the radiation-sensitive resin composition is contained in the container, a degassing treatment for removing the dissolved gas in the radiation-sensitive resin composition may be carried out. Examples of the degassing method include an ultrasonic treatment and a defoaming treatment.
<Pattern Forming Method>

The radiation-sensitive resin composition produced by the above-mentioned production method is used for pattern formation.

More specifically, the procedure of the pattern forming method using the composition of the embodiment of the present invention is not particularly limited, but preferably has the following steps.

Step A: a step of forming a resist film on a substrate, using the composition of the embodiment of the present invention
Step B: a step of exposing the resist film
Step C: a step of developing the exposed resist film using a developer to form a pattern Hereinafter, the procedure of each of the steps will be described in detail.
(Step A: Resist Film Forming Step)

Step A is a step of forming a resist film on a substrate, using the composition of the embodiment of the present invention.

The composition of the embodiment of the present invention is as described above.

Examples of the method of forming a resist film on a substrate, using the composition include a method of applying the composition onto a substrate.

In addition, it is preferable that the composition before the application is filtered through a filter, as necessary. A pore size of the filter is preferably 0.1 µm or less, more preferably 0.05 µm or less, and still more preferably 0.03 µm or less. In addition, the filter is preferably a polytetrafluoroethylene-made, polyethylene-made, or nylon-made filter.

The composition can be applied onto a substrate (for example, silicon and silicon dioxide coating) as used in the manufacture of integrated circuit elements by a suitable application method such as ones using a spinner or a coater. As the application method, spin application using a spinner is preferable.

After applying the composition, the substrate may be dried to form a resist film. In addition, various underlying films (an inorganic film, an organic film, or an antireflection film) may be formed on the underlayer of the resist film.

Examples of the drying method include a heating method (pre-baking: PB). The heating may be performed using a unit included in an ordinary exposure machine and/or an ordinary development machine, and may also be performed using a hot plate or the like.

The heating temperature is preferably 80° C. to 150° C., and more preferably 80° C. to 140° C.

The heating time is preferably 30 to 1,000 seconds, and more preferably 40 to 800 seconds.

A film thickness of the resist film is not particularly limited, but in a case of a resist film for KrF exposure, the film thickness is preferably 0.2 to 12 µm, and more preferably 0.3 to 5 µm.

In addition, in a case of a resist film for ArF exposure or EUV exposure, the film thickness is preferably 30 to 700 nm, and more preferably 40 to 400 nm.

Moreover, a topcoat may be formed on the upper layer of the resist film, using the topcoat composition.

It is preferable that the topcoat composition is not mixed with the resist film and can be uniformly applied onto the upper layer of the resist film.

The film thickness of the topcoat is preferably 10 to 200 nm, and more preferably 20 to 100 nm.

The topcoat is not particularly limited, a topcoat known in the related art can be formed by a method known in the related art, and for example, the topcoat can be formed in accordance with the description in paragraphs [0072] to [0082] of JP2014-059543A.
(Step B: Exposing Step)

The step B is a step of exposing the resist film.

Examples of the exposing method include a method of irradiating a resist film thus formed with radiation through a predetermined mask.

Examples of the radiation include infrared light, visible light, ultraviolet light, far ultraviolet light, extreme ultraviolet light, X-rays, and electron beams (EB), preferably a far ultraviolet light having a wavelength of 250 nm or less, more preferably a far ultraviolet light having a wavelength of 220 nm or less, and particularly preferably a far ultraviolet light having a wavelength of 1 to 200 nm, specifically, KrF excimer laser (248 nm), ArF excimer laser (193 nm), F$_2$ excimer laser (157 nm), EUV (13 nm), X-rays, and EB.

It is preferable to bake (post-bake: PEB) after exposure and before developing.

The heating temperature is preferably 80° C. to 150° C., and more preferably 80° C. to 140° C.

The heating time is preferably 10 to 1,000 seconds, and more preferably 10 to 180 seconds.

The heating may be performed using a unit included in an ordinary exposure machine and/or an ordinary development machine, and may also be performed using a hot plate or the like.

This step is also described as a post-exposure baking.

(Step C: Developing Step)

The step C is a step of developing the exposed resist film using a developer to form a pattern.

Examples of the developing method include a method in which a substrate is immersed in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously jetted onto a substrate rotating at a constant rate while scanning a developer jetting nozzle at a constant rate (a dynamic dispense method).

Furthermore, after the step of performing development, a step of stopping the development may be carried out while substituting the solvent with another solvent.

The developing time is not particularly limited as long as it is a period of time where the unexposed area of a resin is sufficiently dissolved and is preferably 10 to 300 seconds, and more preferably 20 to 120 seconds.

The temperature of the developer is preferably 0° C. to 50° C., and more preferably 15° C. to 35° C.

Examples of the developer include an alkaline developer and an organic solvent developer.

As the alkaline developer, it is preferable to use an aqueous alkaline solution containing an alkali. Among those, the aqueous solutions of the quaternary ammonium salts typified by tetramethylammonium hydroxide (TMAH) are preferable as the alkaline developer. An appropriate amount of an alcohol, a surfactant, or the like may be added to the alkaline developer. The alkali concentration of the alkaline developer is usually 0.1% to 20% by mass. Further, the pH of the alkaline developer is usually 10.0 to 15.0.

The organic solvent developer is a developer containing an organic solvent.

Examples of the organic solvent used in the organic solvent developer include known organic solvents, and include an ester-based solvent, a ketone-based solvent, an alcohol-based solvent, an amide-based solvent, an ether-based solvent, and a hydrocarbon-based solvent.

(Other Steps)

It is preferable that the pattern forming method includes a step of performing washing using a rinsing liquid after the step C.

Examples of the rinsing liquid used in the rinsing step after the step of performing development using the developer include pure water. Further, an appropriate amount of a surfactant may be added to pure water.

An appropriate amount of a surfactant may be added to the rinsing liquid.

In addition, an etching treatment on the substrate may be carried out using a pattern thus formed as a mask. That is, the substrate (or the underlayer film and the substrate) may be processed using the pattern thus formed in the step C as a mask to form a pattern on the substrate.

A method for processing the substrate (or the underlayer film and the substrate) is not particularly limited, but a method in which a pattern is formed on a substrate by subjecting the substrate (or the underlayer film and the substrate) to dry etching using the pattern thus formed in the step C as a mask is preferable.

The dry etching may be one-stage etching or multi-stage etching. In a case where the etching is etching including a plurality of stages, the etchings at the respective stages maybe the same treatment or different treatments.

For etching, any of known methods can be used, and various conditions and the like are appropriately determined according to the type of a substrate, usage, and the like. Etching can be carried out, for example, in accordance with Journal of The International Society for Optical Engineering (Proc. of SPIE), Vol. 6924, 692420 (2008), JP2009-267112A, and the like. In addition, the etching can also be carried out in accordance with "Chapter 4 Etching" in "Semiconductor Process Text Book, 4$^{th}$ Ed., published in 2007, publisher: SEMI Japan".

Among those, oxygen plasma etching is preferable as the dry etching.

It is preferable that various materials (for example, a solvent, a developer, a rinsing liquid, a composition for forming an antireflection film, and a composition for forming a topcoat) used in the production method and the composition of the embodiments of the present invention do not contain impurities such as metals. The content of the impurities included in these materials is preferably 1 ppm by mass or less, more preferably 10 ppb by mass or less, still more preferably 100 ppt by mass or less, particularly preferably 10 ppt by mass or less, and most preferably 1 ppt by mass or less. Here, examples of the metal impurities include Na, K, Ca, Fe, Cu, Mg, Al, Li, Cr, Ni, Sn, Ag, As, Au, Ba, Cd, Co, Mo, Zr, Pb, Ti, V, W, and Zn.

Examples of a method for removing impurities such as metals from the various materials include filtration using a filter. A filter pore diameter of the filter is preferably 0.20 μm or less, more preferably 0.05 μm or less, and still more preferably 0.01 μm or less.

As a material of the filter, a fluorine resin such as polytetrafluoroethylene (PTFE) and perfluoroalkoxy alkane (PFA), a polyolefin resin such as polypropylene and polyethylene, and a polyamide resin such as nylon 6 and nylon 66 are preferable. As the filter, a filter which has been washed with an organic solvent in advance may be used. In the step of filtration using a filter, a plurality of filters or a plurality of kinds of filters connected in series or in parallel may be used. In a case of using the plural kinds of filters, a combination of filters having different pore diameters and/or materials may be used. In addition, various materials may be filtered plural times, and the step of filtering plural times may be a circulatory filtration step. As the circulatory filtration step, for example, the method disclosed in the specification of JP2002-62667A is preferable.

As the filter, a filter having a reduced amount of elutes as disclosed in the specification of JP2016-201426A is preferable.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, or organic adsorbing materials such as activated carbon can be used. Examples of the metal adsorbing material include those disclosed in the specification of JP2016-206500A.

In addition, examples of a method for reducing the impurities such as metals included in various materials include a method in which a raw material having a low metal content is selected as a raw material constituting various materials and the raw material constituting the various materials is subjected to filtration using a filter; and a method in which distillation and the like are performed under conditions suppressing contamination as much as possible by performing a lining or coating with a fluorine resin and the like in the inside of a device. Preferred conditions for the filtration using a filter performed on the raw materials constituting various materials are the same ones as the above-mentioned conditions.

In order to prevent impurities from being incorporated, it is preferable that various materials are stored in the container described in the specification of US2015/0227049A, the specification of JP2015-123351A, the specification of JP2017-13804A, or the like.

Various materials may be used after being diluted with the solvent used in the composition.

<Resin Having Polarity That Increases by Action of Acid>

The resin having a polarity that increases by the action of an acid (hereinafter also simply described as a "resin (A)") preferably has a repeating unit (A-a) having an acid-decomposable group (hereinafter simply a "repeating unit (A-a)").

The acid-decomposable group is a group that decomposes by the action of an acid to produce a polar group. The acid-decomposable group preferably has a structure in which the polar group is protected by an eliminable group that is eliminated by the action of an acid. That is, the resin (A) has a repeating unit (A-a) having a group that decomposes by the action of an acid to produce a polar group. A resin having this repeating unit (A-a) has an increased polarity by the action of an acid, and thus has an increased solubility in an alkaline developer, and a decreased solubility in an organic solvent.

As the polar group, an alkali-soluble group is preferable, and examples thereof include an acidic group such as a carboxyl group, a phenolic hydroxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, and an alcoholic hydroxyl group.

Among those, as the polar group, the carboxyl group, the phenolic hydroxyl group, the fluorinated alcohol group (preferably a hexafluoroisopropanol group), or the sulfonic acid group is preferable.

Examples of the eliminable group that is eliminated by the action of an acid include groups represented by Formulae (Y1) to (Y4).

—C(Rx$_1$)(Rx$_2$)(Rx$_3$)  Formula (Y1):

—C(=O)OC(Rx$_1$)(Rx$_2$)(Rx$_3$)  Formula (Y2):

—C(R$_{36}$)(R$_{37}$)(OR$_{38}$)  Formula (Y3):

—C(Rn)(H)(Ar)  Formula (Y4):

In Formula (Y1) and Formula (Y2), Rx$_1$ to Rx$_3$ each independently represent an (linear or branched) alkyl group or a (monocyclic or polycyclic) cycloalkyl group. Furthermore, in a case where all of Rx$_1$ to Rx$_3$ are each an (linear or branched) alkyl group, it is preferable that at least two of Rx$_1$, Rx$_2$, or R$_3$ are methyl groups.

Above all, it is preferable that Rx$_1$ to Rx$_3$ each independently represent a linear or branched alkyl group, and it is more preferable that Rx$_1$ to Rx$_3$ each independently represent the linear alkyl group.

Two of Rx$_1$ to Rx$_3$ may be bonded to each other to form a monocycle or a polycycle. As the alkyl group of each of Rx$_1$ to Rx$_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of Rx$_1$ to Rx$_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of Rx$_1$ to Rx$_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group is preferable, and a monocyclic cycloalkyl group having 5 or 6 carbon atoms is more preferable.

In the cycloalkyl group formed by the bonding of two of Rx$_1$ to Rx$_3$, for example, one of the methylene groups constituting the ring may be substituted with a heteroatom such as an oxygen atom, or a group having a heteroatom, such as a carbonyl group.

With regard to the group represented by Formula (Y1) or Formula (Y2), for example, an aspect in which Rx$_1$ is a methyl group or an ethyl group, and Rx$_2$ and Rx$_3$ are bonded to each other to form a cycloalkyl group is preferable.

In Formula (Y3), R$_{36}$ to R$_{38}$ each independently represent a hydrogen atom or a monovalent organic group. R$_{37}$ and R$_{38}$ may be bonded to each other to form a ring. Examples of the monovalent organic group include an alkyl group, a cycloalkyl group, an aryl group, an aralkyl group, and an alkenyl group. It is also preferable that R$_{36}$ is the hydrogen atom.

As Formula (Y3), a group represented by Formula (Y3-1) is preferable.

(Y3-1)

Here, L$_1$ and L$_2$ each independently represent a hydrogen atom, an alkyl group, a cycloalkyl group, an aryl group, or a group formed by combination thereof (for example, a group formed by combination of an alkyl group and an aryl group).

M represents a single bond or a divalent linking group.

Q represents an alkyl group which may have a heteroatom, a cycloalkyl group which may have a heteroatom, an aryl group which may have a heteroatom, an amino group, an ammonium group, a mercapto group, a cyano group, an aldehyde group, or a group formed by combination thereof (for example, a group formed by combination of an alkyl group and a cycloalkyl group).

In the alkyl group and the cycloalkyl group, for example, one of the methylene groups may be substituted with a heteroatom such as an oxygen atom or a group having a heteroatom, such as a carbonyl group.

In addition, it is preferable that one of L$_1$ or L$_2$ is a hydrogen atom, and the other is an alkyl group, a cycloalkyl group, an aryl group, or a group formed by combination of an alkylene group and an aryl group.

At least two of Q, M, or Li may be bonded to each other to form a ring (preferably a 5- or 6-membered ring).

From the viewpoint of pattern miniaturization, $L_2$ is preferably a secondary or tertiary alkyl group, and more preferably the tertiary alkyl group. Examples of the secondary alkyl group include an isopropyl group, a cyclohexyl group, and a norbornyl group, and examples of the tertiary alkyl group include a tert-butyl group and an adamantane ring group. In these aspects, since the glass transition temperature (Tg) and the activation energy are increased, it is possible to suppress fogging in addition to ensuring film hardness.

In Formula (Y4), Ar represents an aromatic ring group. Rn represents an alkyl group, a cycloalkyl group, or an aryl group. Rn and Ar may be bonded to each other to form a non-aromatic ring. Ar is more preferably the aryl group.

As the repeating unit (A-a), a repeating unit represented by Formula (A) is also preferable.

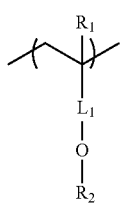

(A)

$L_1$ represents a divalent linking group which may have a fluorine atom or an iodine atom, $R_1$ represents a hydrogen atom, a fluorine atom, an iodine atom, a fluorine atom, an alkyl group which may have an iodine atom, or an aryl group which may have a fluorine atom or an iodine atom, and $R_2$ represents an eliminable group that is eliminated by the action of an acid and may have a fluorine atom or an iodine atom. It should be noted that at least one of $L_1$, $R_1$, or $R_2$ has a fluorine atom or an iodine atom.

$L_1$ represents a divalent linking group which may have a fluorine atom or an iodine atom. Examples of the divalent linking group which may have a fluorine atom or an iodine atom include —CO—, —O—, —S—, —SO—, —SO$_2$—, a hydrocarbon group which may have a fluorine atom or an iodine atom (for example, an alkylene group, a cycloalkylene group, an alkenylene group, and an arylene group), and a linking group formed by the linking of a plurality of these groups. Among those, $L_1$ is preferably —CO—, -arylene group-alkylene group having fluorine atom or iodine atom-from the viewpoint that the effect of the present invention is more excellent.

As the arylene group, a phenylene group is preferable.

The alkylene group may be linear or branched. The number of carbon atoms of the alkylene group is not particularly limited, but is preferably 1 to 10, and more preferably 1 to 3.

The total number of fluorine atoms and iodine atoms included in the alkylene group having a fluorine atom or an iodine atom is not particularly limited, but is preferably 2 or more, more preferably 2 to 10, and still more preferably 3 to 6 from the viewpoint that the effect of the present invention is more excellent.

$R_1$ represents a hydrogen atom, a fluorine atom, an iodine atom, an alkyl group which may have a fluorine atom or an iodine atom, or an aryl group which may have a fluorine atom or an iodine atom.

The alkyl group may be linear or branched. The number of carbon atoms of the alkyl group is not particularly limited, but is preferably 1 to 10, and more preferably 1 to 3.

The total number of fluorine atoms and iodine atoms included in the alkyl group having a fluorine atom or an iodine atom is not particularly limited, but is preferably 1 or more, more preferably 1 to 5, and still more preferably 1 to 3 from the viewpoint that the effect of the present invention is more excellent.

The alkyl group may have a heteroatom such as an oxygen atom, other than a halogen atom.

$R_2$ represents an eliminable group that is eliminated by the action of an acid and may have a fluorine atom or an iodine atom.

Examples of the eliminable group include groups represented by Formulae (Z1) to (Z4).

$$—C(Rx_{11})(Rx_{12})(Rx_{13}). \quad \text{Formula (Z1):}$$

$$—C(=O)OC(Rx_{11})(Rx_{12})(Rx_{13}). \quad \text{Formula (Z2):}$$

$$—C(R_{136})(R_{137})(OR_{138}). \quad \text{Formula (Z3):}$$

$$—C(Rn_1)(H)(Ar_1) \quad \text{Formula (Z4):}$$

In Formula (Z1) and Formula (Z2), $Rx_{11}$ to $Rx_{13}$ each independently represent an (linear or branched) alkyl group which may have a fluorine atom or an iodine atom, or a (monocyclic or polycyclic) cycloalkyl group which may have a fluorine atom or an iodine atom. Furthermore, in a case where all of $Rx_{11}$ to $Rx_{13}$ are each an (linear or branched) alkyl group, it is preferable that at least two of $Rx_{11}$, $Rx_{12}$, or $Rx_{13}$ are methyl groups.

$Rx_{11}$ to $Rx_{13}$ are the same as $Rx_1$ to $Rx_3$ in Formula (Y1) and Formula (Y2) described above, respectively, except that they may have a fluorine atom or an iodine atom, and have the same definitions and suitable ranges as those of the alkyl group and the cycloalkyl group.

In Formula (Z3), $R_{136}$ to $R_{138}$ each independently represent a hydrogen atom, or a monovalent organic group which may have a fluorine atom or an iodine atom. $R_{137}$ and $R_{138}$ may be bonded to each other to form a ring. Examples of the monovalent organic group which may have a fluorine atom or an iodine atom include an alkyl group which may have a fluorine atom or an iodine atom, a cycloalkyl group which may have a fluorine atom or an iodine atom, an aryl group which may have a fluorine atom or an iodine atom, an aralkyl group which may have a fluorine atom or an iodine atom, and a group formed by combination thereof (for example, a group formed by combination of the alkyl group and the cycloalkyl group).

Incidentally, the alkyl group, the cycloalkyl group, the aryl group, and the aralkyl group may include a heteroatom such as an oxygen atom, in addition to the fluorine atom and the iodine atom. That is, in the alkyl group, the cycloalkyl group, the aryl group, and the aralkyl group, for example, one of the methylene groups may be substituted with a heteroatom such as an oxygen atom or a group having a heteroatom, such as a carbonyl group.

As Formula (Z3), a group represented by Formula (Z3-1) is preferable.

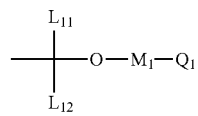

(Z3-1)

Here, $L_{11}$ and $L_{12}$ each independently represent a hydrogen atom; an alkyl group which may have a heteroatom selected from the group consisting of a fluorine atom, an iodine atom, and an oxygen atom; a cycloalkyl group which may have a heteroatom selected from the group consisting of a fluorine atom, an iodine atom, and an oxygen atom; an aryl group which may have a heteroatom selected from the group consisting of a fluorine atom, an iodine atom, and an oxygen atom; or a group formed by combination thereof (for example, a group formed by combination of an alkyl group and a cycloalkyl group, each of which may have a heteroatom selected from the group consisting of a fluorine atom, an iodine atom, and an oxygen atom).

$M_1$ represents a single bond or a divalent linking group.

$Q_1$ represents an alkyl group which may have a heteroatom selected from the group consisting of a fluorine atom, an iodine atom, and an oxygen atom; a cycloalkyl group which may have a heteroatom selected from the group consisting of a fluorine atom, an iodine atom, and an oxygen atom; an aryl group which may have a heteroatom selected from the group consisting of a fluorine atom, an iodine atom, and an oxygen atom; an amino group; an ammonium group; a mercapto group; a cyano group; an aldehyde group; a group formed by combination thereof (for example, a group formed by combination of the alkyl group and the cycloalkyl group, each of which may have a heteroatom selected from the group consisting of a fluorine atom, an iodine atom, and an oxygen atom).

In Formula (Z4), An represents an aromatic ring group which may have a fluorine atom or an iodine atom. $Rn_1$ is an alkyl group which may have a fluorine atom or an iodine atom, a cycloalkyl group which may have a fluorine atom or an iodine atom, or an aryl group which may have a fluorine atom or an iodine atom. $Rn_1$ and An may be bonded to each other to form a non-aromatic ring.

As the repeating unit (A-a), a repeating unit represented by General Formula (AI) is also preferable.

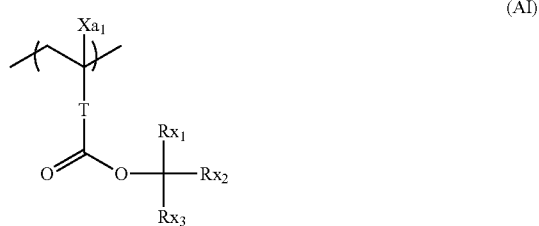

(AI)

In General Formula (AI), $Xa_1$ represents a hydrogen atom, or an alkyl group which may have a substituent.

T represents a single bond or a divalent linking group.

$Rx_1$ to $Rx_3$ each independently represent an (linear or branched) alkyl group or a (monocyclic or polycyclic) cycloalkyl group. It should be noted that in a case where all of $Rx_1$ to $Rx_3$ are (linear or branched) alkyl groups, it is preferable that at least two of $Rx_1$, $Rx_2$, or $Rx_3$ are methyl groups.

Two of $Rx_1$ to $Rx_3$ may be bonded to each other to form a (monocyclic or polycyclic) cycloalkyl group.

Examples of the alkyl group which may have a substituent, represented by $Xa_1$, include a methyl group and a group represented by —$CH_2$—$R_{11}$. $R_{11}$ represents a halogen atom (a fluorine atom or the like), a hydroxyl group, or a monovalent organic group, examples thereof include an alkyl group having 5 or less carbon atoms, which may be substituted with a halogen atom, an acyl group having 5 or less carbon atoms, which may be substituted with a halogen atom, and an alkoxy group having 5 or less carbon atoms, which may be substituted with a halogen atom; and an alkyl group having 3 or less carbon atoms is preferable, and a methyl group is more preferable. $Xa_1$ is preferably a hydrogen atom, a methyl group, a trifluoromethyl group, or a hydroxymethyl group.

Examples of the divalent linking group of T include an alkylene group, an aromatic ring group, a —COO-Rt- group, and an —O-Rt- group. In the formulae, Rt represents an alkylene group or a cycloalkylene group.

T is preferably the single bond or the —COO-Rt- group. In a case where T represents the —COO-Rt-group, Rt is preferably an alkylene group having 1 to 5 carbon atoms, and more preferably a —$CH_2$— group, a —$(CH_2)_2$— group, or a —$(CH_2)_3$— group.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group is preferable, and in addition, a polycyclic cycloalkyl group such as a norbornyl group, a tetracyclodecanyl group, a tetracyclododecanyl group, and an adamantyl group is also preferable. Among those, a monocyclic cycloalkyl group having 5 or 6 carbon atoms is preferable.

In the cycloalkyl group formed by the bonding of two of $Rx_1$ to $Rx_3$, for example, one of the methylene groups constituting the ring may be substituted with a heteroatom such as an oxygen atom, or a group having a heteroatom, such as a carbonyl group.

With regard to the repeating unit represented by General Formula (AI), for example, an aspect in which $Rx_1$ is a methyl group or an ethyl group, and $Rx_2$ and $Rx_3$ are bonded to each other to form the above-mentioned cycloalkyl group is preferable.

In a case where each of the groups has a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The substituent preferably has 8 or less carbon atoms.

The repeating unit represented by General Formula (AI) is preferably an acid-decomposable tertiary alkyl (meth) acrylate ester-based repeating unit (the repeating unit in which $Xa_1$ represents a hydrogen atom or a methyl group, and T represents a single bond).

The resin (A) may have one kind of the repeating unit (A-a) alone or may have two or more kinds thereof.

A content of the repeating unit (A-a) (a total content in a case where two or more kinds of the repeating units (A-a) are present) is preferably 15% to 80% by mole, and more preferably 20% to 70% by mole with respect to all repeating units in the resin (A).

The resin (A) preferably has at least one repeating unit selected from the group consisting of repeating units represented by General Formulae (A-VIII) to (A-XII) as the repeating unit (A-a).

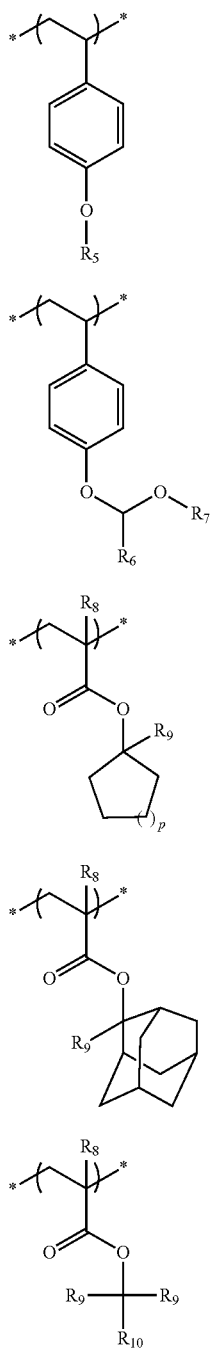

In General Formula (A-VIII), R5 represents a tert-butyl group or a —CO—O-(tert-butyl) group.

In General Formula (A-IX), $R_6$ and $R_7$ each independently represent a monovalent organic group. Examples of the monovalent organic group include an alkyl group, a cycloalkyl group, an aryl group, an aralkyl group, and an alkenyl group.

In General Formula (A-X), p represents 1 or 2.

In General Formulae (A-X) to (A-XII), $R_8$ represents a hydrogen atom or an alkyl group having 1 to 3 carbon atoms, and $R_9$ represents an alkyl group having 1 to 3 carbon atoms.

In General Formula (A-XII), $R_{10}$ represents an alkyl group having 1 to 3 carbon atoms or an adamantyl group.

(Repeating Unit Having Acid Group)

The resin (A) may have a repeating unit having an acid group.

As the repeating unit having an acid group, a repeating unit represented by General Formula (B) is preferable.

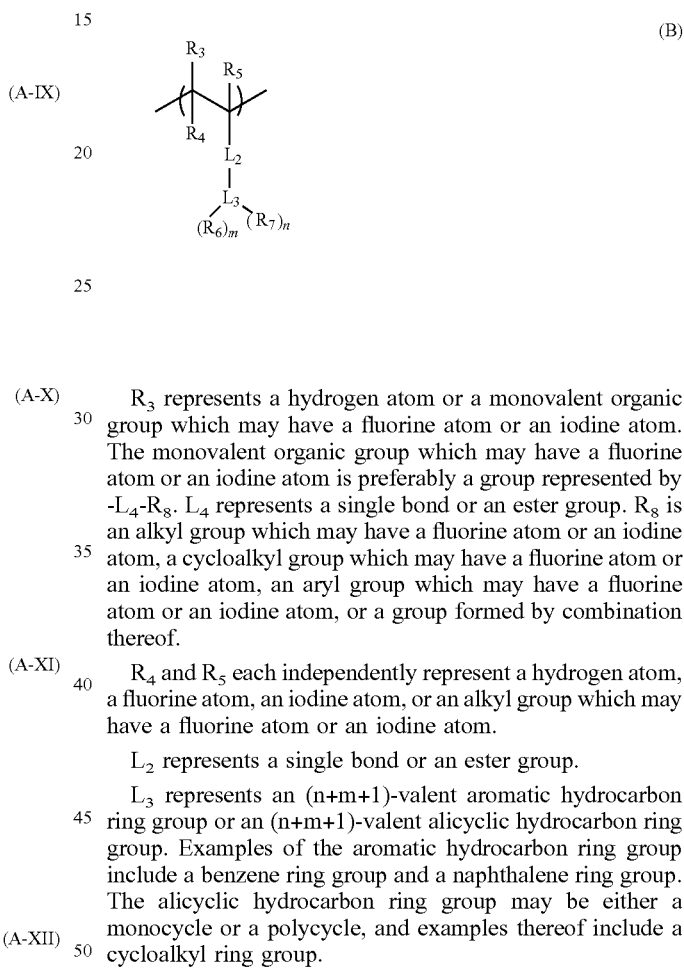

$R_3$ represents a hydrogen atom or a monovalent organic group which may have a fluorine atom or an iodine atom. The monovalent organic group which may have a fluorine atom or an iodine atom is preferably a group represented by $-L_4-R_8$. $L_4$ represents a single bond or an ester group. $R_8$ is an alkyl group which may have a fluorine atom or an iodine atom, a cycloalkyl group which may have a fluorine atom or an iodine atom, an aryl group which may have a fluorine atom or an iodine atom, or a group formed by combination thereof.

$R_4$ and $R_5$ each independently represent a hydrogen atom, a fluorine atom, an iodine atom, or an alkyl group which may have a fluorine atom or an iodine atom.

$L_2$ represents a single bond or an ester group.

$L_3$ represents an (n+m+1)-valent aromatic hydrocarbon ring group or an (n+m+1)-valent alicyclic hydrocarbon ring group. Examples of the aromatic hydrocarbon ring group include a benzene ring group and a naphthalene ring group. The alicyclic hydrocarbon ring group may be either a monocycle or a polycycle, and examples thereof include a cycloalkyl ring group.

$R_6$ represents a hydroxyl group or a fluorinated alcohol group (preferably a hexafluoroisopropanol group). Furthermore, in a case where $R_6$ is a hydroxyl group, $L_3$ is preferably the (n+m+1)-valent aromatic hydrocarbon ring group.

$R_7$ represents a halogen atom. Examples of the halogen atom include a fluorine atom, a chlorine atom, a bromine atom, or an iodine atom.

m represents an integer of 1 or more. m is preferably an integer of 1 to 3 and more preferably an integer of 1 or 2.

n represents 0 or an integer of 1 or more. n is preferably an integer of 1 to 4.

Furthermore, (n+m+1) is preferably an integer of 1 to 5.

As the repeating unit having an acid group, a repeating unit represented by General Formula (I) is also preferable.

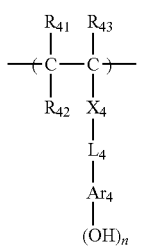

(I)

In General Formula (I), $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, in which case $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents an (n+1)-valent aromatic ring group, and in a case where $Ar_4$ is bonded to $R_{42}$ to form a ring, $Ar_4$ represents an (n+2)-valent aromatic ring group.

n represents an integer of 1 to 5.

As the alkyl group represented by each of $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group is preferable, an alkyl group having 8 or less carbon atoms is more preferable, and an alkyl group having 3 or less carbon atoms is still more preferable.

The cycloalkyl group of each of $R_{41}$, $R_{42}$, and $R_{43}$ in General Formula (I) may be monocyclic or polycyclic. Among those, a monocyclic cycloalkyl group having 3 to 8 carbon atoms, such as a cyclopropyl group, a cyclopentyl group, and a cyclohexyl group, is preferable.

Examples of the halogen atom of each of $R_{41}$, $R_{42}$, and $R_{43}$ in General Formula (I) include a fluorine atom, a chlorine atom, a bromine atom, and an iodine atom, and the fluorine atom is preferable.

As the alkyl group included in the alkoxycarbonyl group of each of $R_{41}$, $R_{42}$, and $R_{43}$ in General Formula (I), the same ones as the alkyl group in each of $R_{41}$, $R_{42}$, and $R_{43}$ are preferable.

$Ar_4$ represents an (n+1)-valent aromatic ring group. The divalent aromatic ring group in a case where n is 1 may have a substituent, and is preferably for example, an arylene group having 6 to 18 carbon atoms, such as a phenylene group, a tolylene group, a naphthylene group, and an anthracenylene group, or an aromatic ring group including a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring.

Specific examples of the (n+1)-valent aromatic ring group in a case where n is an integer of 2 or more include groups formed by removing any (n−1) hydrogen atoms from the above-described specific examples of the divalent aromatic ring group. The (n+1)-valent aromatic ring group may further have a substituent.

Examples of the substituent which can be contained in the alkyl group, the cycloalkyl group, the alkoxycarbonyl group, the alkylene group, and the (n+1)-valent aromatic ring group, each mentioned above, include the alkyl groups; the alkoxy groups such as a methoxy group, an ethoxy group, a hydroxyethoxy group, a propoxy group, a hydroxypropoxy group, and a butoxy group; the aryl groups such as a phenyl group; and the like, as mentioned for each of $R_{41}$, $R_{42}$, and $R_{43}$ in General Formula (I).

Examples of the alkyl group of $R_{64}$ in —CONR$_{64}$— represented by $X_4$ ($R_{64}$ represents a hydrogen atom or an alkyl group) include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, and an alkyl group having 8 or less carbon atoms, is preferable.

As $X_4$, a single bond, —COO—, or —CONH— is preferable, and the single bond or —COO— is more preferable.

As the alkylene group in $L_4$, an alkylene group having 1 to 8 carbon atoms, such as a methylene group, an ethylene group, a propylene group, a butylene group, a hexylene group, and an octylene group, is preferable.

As $Ar_4$, an aromatic ring group having 6 to 18 carbon atoms is preferable, and a benzene ring group, a naphthalene ring group, and a biphenylene ring group are more preferable.

Specific examples of the repeating unit represented by General Formula (I) will be shown below, but the present invention is not limited thereto. In the formulae, a represents 1 or 2.

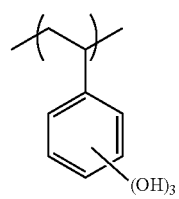

(B-1)

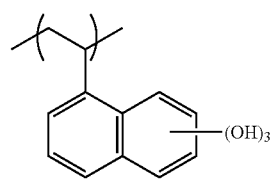

(B-2)

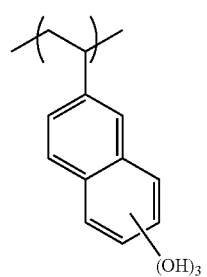

(B-3)

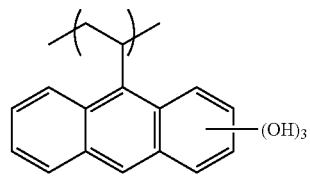

(B-4)

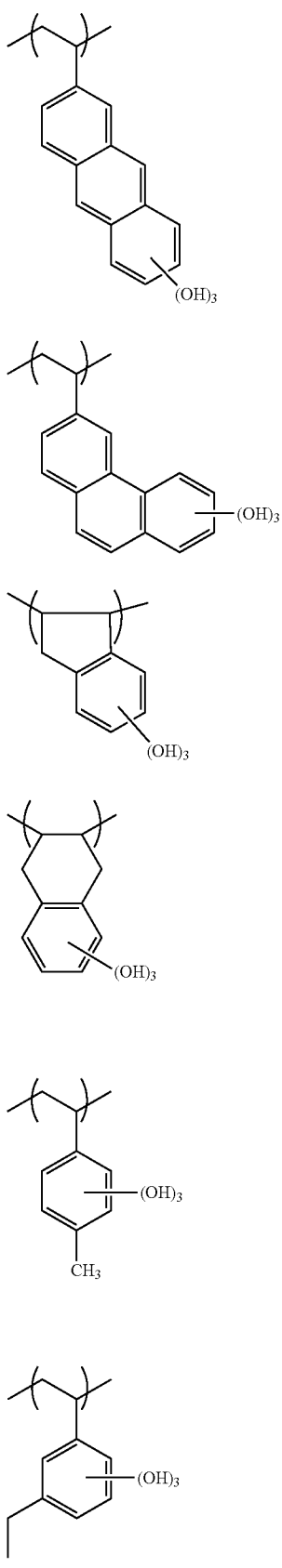
(B-5)
(B-6)
(B-7)
(B-8)
(B-9)
(B-10)
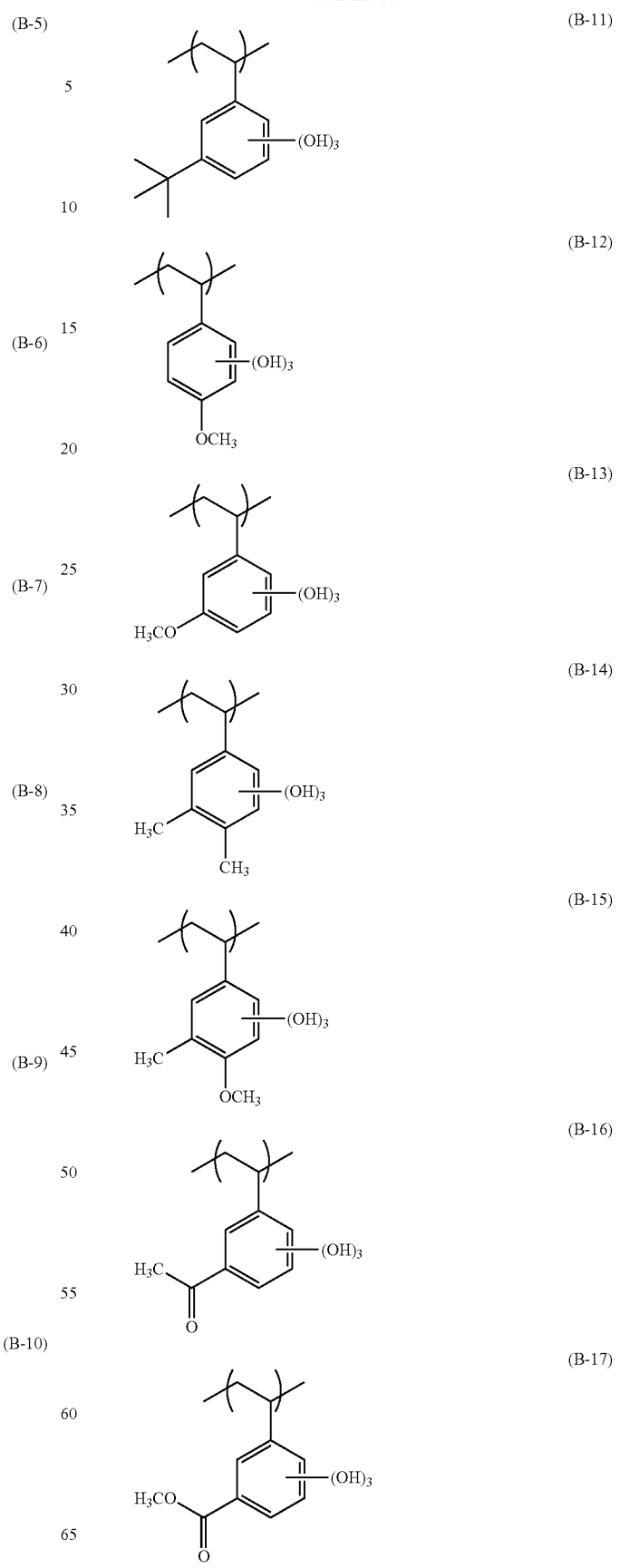
(B-11)
(B-12)
(B-13)
(B-14)
(B-15)
(B-16)
(B-17)

-continued
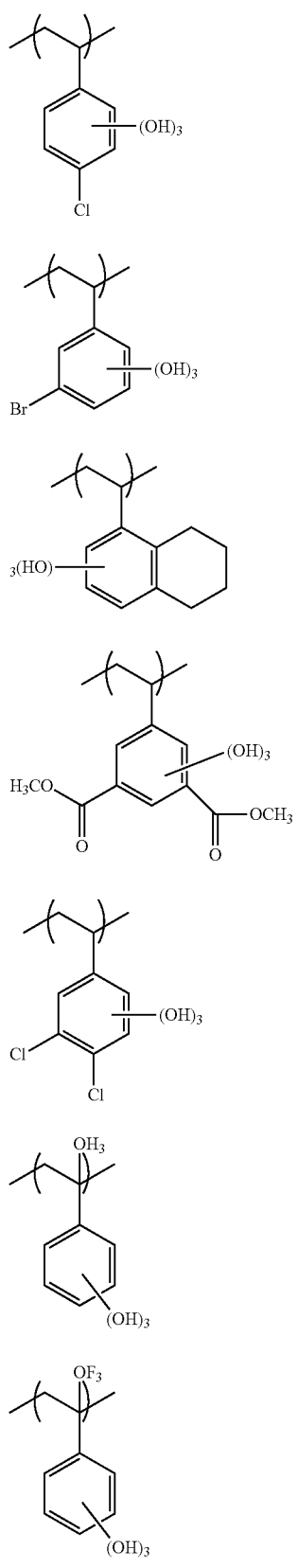
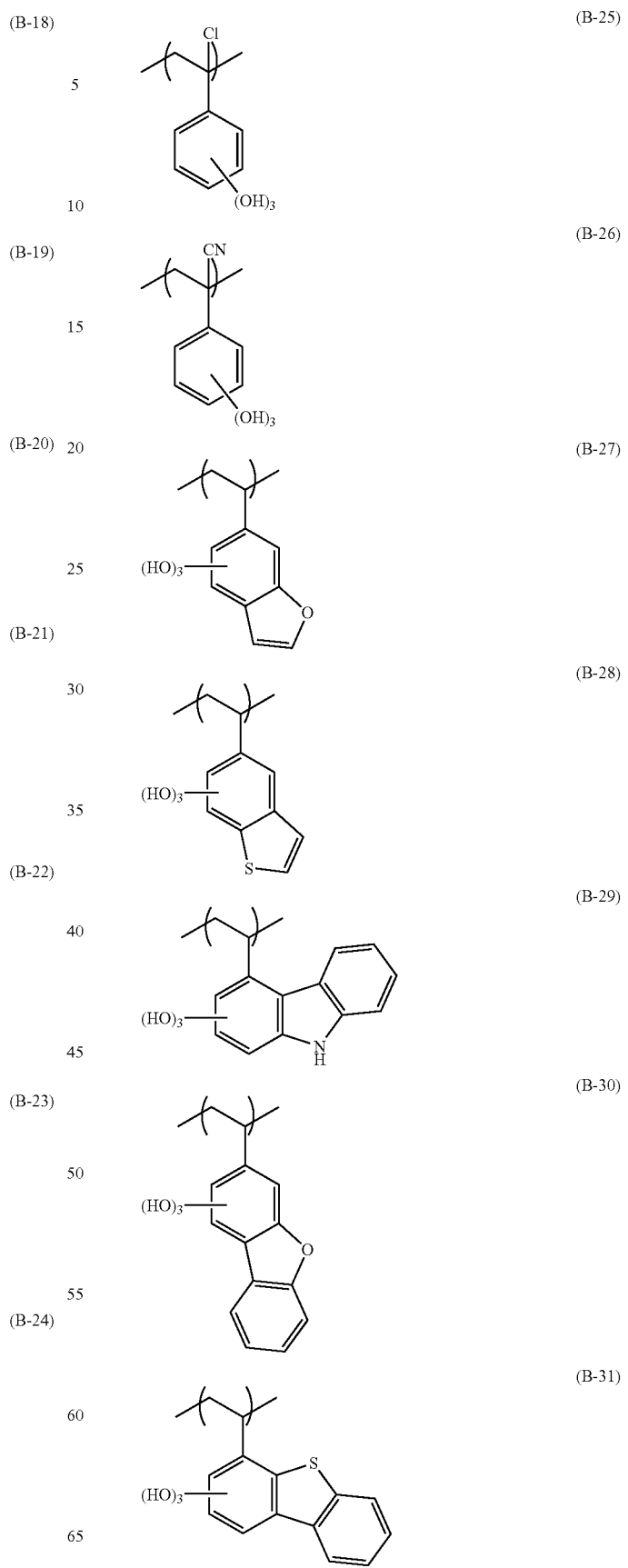

(B-32) 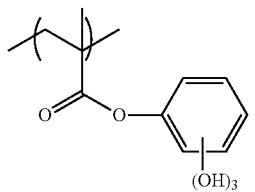

(B-33) 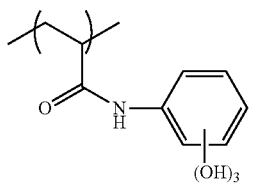

(B-34) 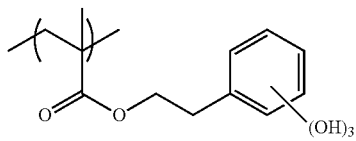

(B-35) 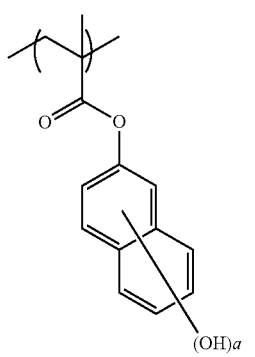

(B-36) 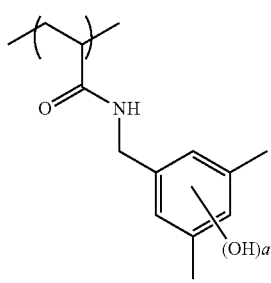

(B-37) 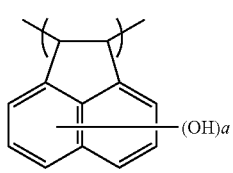

(B-38) 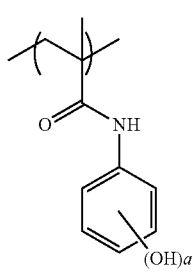

(Repeating Unit Derived from Hydroxystyrene (A-1))

The resin (A) preferably has a repeating unit (A-1) derived from hydroxystyrene as the repeating unit having an acid group.

Examples of the repeating unit (A-1) derived from hydroxystyrene include a repeating unit represented by General Formula (1).

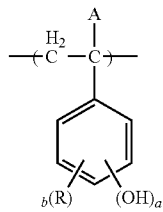

(1)

In General Formula (1),

A represents a hydrogen atom, an alkyl group, a cycloalkyl group, a halogen atom, or a cyano group.

R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group, or an aryloxycarbonyl group, and in a case where a plurality of R's are present, R's may be the same as or different from each other. In a case where there are a plurality of R's, R's may be bonded to each other to form a ring. As R, the hydrogen atom is preferable.

a represents an integer of 1 to 3, and b represents an integer of 0 to (5-a).

As the repeating unit (A-1), a repeating unit represented by General Formula (A-I) is preferable.

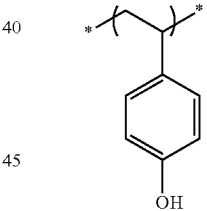

(A-I)

The composition containing the resin (A) having the repeating unit (A-1) is preferable for KrF exposure, EB exposure, or EUV exposure. A content of the repeating unit (A-1) in such a case is preferably 30% to 100% by mole, more preferably 40% to 100% by mole, and still more preferably 50% to 100% by mole with respect to all repeating units in the resin (A).

(Repeating unit (A-2) Having at Least One selected from Group Consisting of Lactone Structure, Sultone Structure, Carbonate Structure, and Hydroxyadamantane Structure)

The resin (A) may have a repeating unit (A-2) having at least one selected from the group consisting of a lactone structure, a carbonate structure, a sultone structure, and a hydroxyadamantane structure.

The lactone structure or the sultone structure in a repeating unit having the lactone structure or the sultone structure is not particularly limited, but is preferably a 5- to 7-membered ring lactone structure or a 5- to 7-membered ring sultone structure, and more preferably a 5- to 7-membered ring lactone structure to which another ring structure is fused to form a bicyclo structure or a spiro structure, or a 5- to 7-membered ring sultone structure to which another ring structure is fused so as to form a bicyclo structure or a spiro structure.

Examples of the repeating unit having the lactone structure or the sultone structure include the repeating units described in paragraphs [0094] to [0107] of WO2016/136354A.

The resin (A) may have a repeating unit having a carbonate structure. The carbonate structure is preferably a cyclic carbonic acid ester structure.

Examples of the repeating unit having a carbonate structure include the repeating unit described in paragraphs [0106] to [0108] of WO2019/054311A.

The resin (A) may have a repeating unit having a hydroxyadamantane structure. Examples of the repeating unit having a hydroxyadamantane structure include a repeating unit represented by General Formula (AIIa).

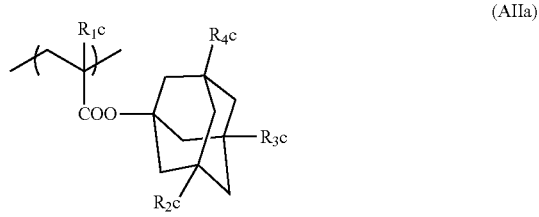

In General Formula (AIIa), $R_1c$ represents a hydrogen atom, a methyl group, a trifluoromethyl group, or a hydroxymethyl group. $R_2c$ to $R_4c$ each independently represent a hydrogen atom or a hydroxyl group. It should be noted that at least one of $R_2c$, or $R_4c$ represents a hydroxyl group. It is preferable that one or two of $R_2c$ to $R_4c$ are hydroxyl groups, and the rest are hydrogen atoms.
(Repeating Unit Having Fluorine Atom or Iodine Atom)

The resin (A) may have a repeating unit having a fluorine atom or an iodine atom.

Examples of the repeating unit having a fluorine atom or an iodine atom include the repeating units described in paragraphs [0080] and [0081] of JP2019-045864A.
(Repeating Unit Having Photoacid Generating Group)

The resin (A) may have, as a repeating unit other than those above, a repeating unit having a group that generates an acid upon irradiation with radiation.

Examples of the repeating unit having a fluorine atom or an iodine atom include the repeating units described in paragraphs [0092] to [0096] of JP2019-045864A.
(Repeating Unit Having Alkali-Soluble Group)

The resin (A) may have a repeating unit having an alkali-soluble group.

Examples of the alkali-soluble group include a carboxyl group, a sulfonamide group, a sulfonylimide group, a bis-sulfonylimide group, or an aliphatic alcohol group (for example, a hexafluoroisopropanol group) in which the α-position is substituted with an electron-withdrawing group, and the carboxyl group is preferable. By allowing the resin (A) to have a repeating unit having an alkali-soluble group, the resolution for use in contact holes increases.

Examples of the repeating unit having an alkali-soluble group include a repeating unit in which an alkali-soluble group is directly bonded to the main chain of a resin such as a repeating unit with acrylic acid and methacrylic acid, or a repeating unit in which an alkali-soluble group is bonded to the main chain of the resin through a linking group. Further, the linking group may have a monocyclic or polycyclic cyclic hydrocarbon structure.

The repeating unit having an alkali-soluble group is preferably a repeating unit with acrylic acid or methacrylic acid.
(Repeating Unit Having Neither Acid-Decomposable Group Nor Polar Group)

The resin (A) may further have a repeating unit having neither an acid-decomposable group nor a polar group. The repeating unit having neither an acid-decomposable group nor a polar group preferably has an alicyclic hydrocarbon structure.

Examples of the repeating unit having neither an acid-decomposable group nor a polar group include the repeating units described in paragraphs [0236] and [0237] of the specification of US2016/0026083A and the repeating units described in paragraph [0433] of the specification of US2016/0070167A.

The resin (A) may have a variety of repeating structural units, in addition to the repeating structural units described above, for the purpose of adjusting dry etching resistance, suitability for a standard developer, adhesiveness to a substrate, a resist profile, resolving power, heat resistance, sensitivity, and the like.
(Characteristics of Resin (A))

In the resin (A), all repeating units are preferably composed of repeating units derived from a (meth)acrylate-based monomer. In this case, any of a resin in which all repeating units are derived from a methacrylate-based monomer, a resin in which all repeating units are derived from an acrylate-based monomer, and a resin in which all repeating units are derived from a methacrylate-based monomer and an acrylate-based monomer may be used. The repeating units derived from the acrylate-based monomer are preferably 50% by mole or less with respect to all repeating units in the resin (A).

In a case where the composition is for argon fluoride (ArF) exposure, it is preferable that the resin (A) does not substantially have an aromatic group from the viewpoint of the transmittance of ArF light. More specifically, the repeating unit having an aromatic group is preferably 5% by mole or less, more preferably 3% by mole or less, and ideally 0% by mole with respect to all repeating units in the resin (A), that is, it is still more preferable that the repeating unit having an aromatic group is not included.

In addition, in a case where the composition is for ArF exposure, the resin (A) preferably has a monocyclic or polycyclic alicyclic hydrocarbon structure, and preferably does not include either a fluorine atom or a silicon atom.

In a case where the composition is for krypton difluoride (KrF) exposure, EB exposure, or EUV exposure, the resin (A) preferably has a repeating unit having an aromatic hydrocarbon group, and more preferably has a repeating unit having a phenolic hydroxyl group.

Examples of the repeating unit having a phenolic hydroxyl group include a repeating unit derived from hydroxystyrene (A-1) and a repeating unit derived from hydroxystyrene (meth)acrylate.

In addition, in a case where the composition is for KrF exposure, EB exposure, or EUV exposure, it is also preferable that the resin (A) has a repeating unit having a structure in which a hydrogen atom of the phenolic hydroxyl group is protected by a group (eliminable group) that is eliminable through decomposition by the action of an acid.

In a case where the composition is for KrF exposure, EB exposure, or EUV exposure, a content of the repeating unit having an aromatic hydrocarbon group included in the resin (A) is preferably 30% to 100% by mole, more preferably 40% to 100% by mole, and still more preferably 50% to 100% by mole, with respect to all repeating units in the resin (A).

The resin (A) can be synthesized in accordance with an ordinary method (for example, radical polymerization).

The weight-average molecular weight (Mw) of the resin (A) is preferably 1,000 to 200,000, more preferably 3,000 to 20,000, and still more preferably 5,000 to 15,000. By setting the weight-average molecular weight (Mw) of the resin (A) to 1,000 to 200,000, it is possible to prevent deterioration of heat resistance and dry etching resistance, and it is also possible to prevent deterioration of the film forming property due to deterioration of developability and an increase in viscosity. Incidentally, the weight-average molecular weight (Mw) of the resin (A) is a value expressed in terms of polystyrene as measured by the above-mentioned GPC method.

The dispersity (molecular weight distribution) of the resin (A) is usually 1 to 5, preferably 1 to 3, and more preferably 1.1 to 2.0. The smaller the dispersity, the better the resolution and the resist shape, and the smoother the side wall of a pattern, the more excellent the roughness.

In the composition of the embodiment of the present invention, the content of the resin (A) is preferably 50% to 99.9% by mass, and more preferably 60% to 99.0% by mass with respect to the total solid content of the composition.

In addition, the resin (A) may be used alone or in combination of two or more kinds thereof.

Furthermore, in the present specification, the solid content means a component that can form a resist film excluding the solvent. Even in a case where the properties of the components are liquid, they are treated as solid contents.

<Photoacid Generator (P)>

The composition of the embodiment of the present invention contains a photoacid generator (P). The photoacid generator (P) is not particularly limited as long as it is a compound that generates an acid upon irradiation with radiation.

The photoacid generator (P) may be in a form of a low-molecular-weight compound or a form incorporated into a part of a polymer. Furthermore, a combination of the form of a low-molecular-weight compound and the form incorporated into a part of a polymer may also be used.

In a case where the photoacid generator (P) is in the form of the low-molecular-weight compound, the weight-average molecular weight (Mw) is preferably 3,000 or less, more preferably 2,000 or less, and still more preferably 1,000 or less.

In a case where the photoacid generator (P) is in the form incorporated into a part of a polymer, it may be incorporated into the resin (A) or into a resin that is different from the resin (A).

In the present invention, the photoacid generator (P) is preferably in the form of a low-molecular-weight compound.

The photoacid generator (P) is not particularly limited as long as it is a known one, but a compound that generates an organic acid upon irradiation with radiation is preferable, and a photoacid generator having a fluorine atom or an iodine atom in the molecule is more preferable.

Examples of the organic acid include sulfonic acids (an aliphatic sulfonic acid, an aromatic sulfonic acid, and a camphor sulfonic acid), carboxylic acids (an aliphatic carboxylic acid, an aromatic carboxylic acid, and an aralkyl-carboxylic acid), a carbonylsulfonylimide acid, a bis(alkylsulfonyl)imide acid, and a tris(alkylsulfonyl)methide acid.

The volume of an acid generated from the photoacid generator (P) is not particularly limited, but from the viewpoint of suppression of diffusion of an acid generated to the unexposed area upon exposure and improvement of the resolution, the volume is preferably 240 Å$^3$ or more, more preferably 305 Å$^3$ or more, and still more preferably 350 Å$^3$ or more, and particularly preferably 400 Å$^3$ or more. Incidentally, from the viewpoint of the sensitivity or the solubility in an application solvent, the volume of the acid generated from the photoacid generator (P) is preferably 1,500 Å$^3$ or less, more preferably 1,000 Å$^3$ or less, and still more preferably 700 Å$^3$ or less.

The value of the volume is obtained using "WinMOPAC" manufactured by Fujitsu Limited. For the computation of the value of the volume, first, the chemical structure of the acid according to each example is input, next, using this structure as the initial structure, the most stable conformation of each acid is determined by molecular force field computation using a Molecular Mechanics (MM) 3 method, and thereafter, with respect to the most stable conformation, molecular orbital computation using a parameterized model number (PM) 3 method is performed, whereby the "accessible volume" of each acid can be computed.

The structure of an acid generated from the photoacid generator (P) is not particularly limited, but from the viewpoint that the diffusion of the acid is suppressed and the resolution is improved, it is preferable that the interaction between the acid generated from the photoacid generator (P) and the resin (A) is strong. From this viewpoint, in a case where the acid generated from the photoacid generator (P) is an organic acid, it is preferable that a polar group is further contained, in addition to an organic acid group such as a sulfonic acid group, a carboxylic acid group, a carbonylsulfonylimide acid group, a bissulfonylimide acid group, and a trissulfonylmethide acid group.

Examples of the polar group include an ether group, an ester group, an amide group, an acyl group, a sulfo group, a sulfonyloxy group, a sulfonamide group, a thioether group, a thioester group, a urea group, a carbonate group, a carbamate group, a hydroxyl group, and a mercapto group.

The number of the polar groups contained in the acid generated is not particularly limited, and is preferably 1 or more, and more preferably 2 or more. It should be noted that from the viewpoint that excessive development is suppressed, the number of the polar groups is preferably less than 6, and more preferably less than 4.

Among those, the photoacid generator (P) is preferably a photoacid generator consisting of an anionic moiety and a cationic moiety from the viewpoint that the effect of the present invention is more excellent.

Examples of the photoacid generator (P) include the photoacid generators described in paragraphs [0144] to [0173] of JP2019-045864A.

The content of the photoacid generator (P) is not particularly limited, but from the viewpoint that the effect of the present invention is more excellent, the content is preferably 5% to 50% by mass, more preferably 10% to 40% by mass, and still more preferably 10% to 35% by mass with respect to the total solid content of the composition.

The photoacid generators (P) may be used alone or in combination of two or more kinds thereof. In a case where two or more kinds of the photoacid generators (P) are used in combination, the total amount thereof is preferably within the range.

<Acid Diffusion Control Agent (Q)>

The composition of the embodiment of the present invention may contain an acid diffusion control agent (Q).

The acid diffusion control agent (Q) acts as a quencher that suppresses a reaction of an acid-decomposable resin in the unexposed area by excessive generated acids by trapping the acids generated from a photoacid generator (P) and the like upon exposure. For example, a basic compound (DA), a basic compound (DB) having basicity reduced or lost upon irradiation with radiation, an onium salt (DC) which is a relatively weak acid with respect to the photoacid generator (P), a low-molecular-weight compound (DD) having a nitrogen atom, and a group that is eliminated by the action of an acid, an onium salt compound (DE) having a nitrogen atom in the cationic moiety, can be used as the acid diffusion control agent (Q).

In the composition of the embodiment of the present invention, a known acid diffusion control agent can be appropriately used. For example, the known compounds disclosed in paragraphs [0627] to [0664] of the specification of US2016/0070167A, paragraphs [0095] to [0187] of the specification of US2015/0004544A, paragraphs [0403] to [0423] of the specification of US2016/0237190A, and paragraphs [0259] to [0328] of the specification of US2016/0274458A can be suitably used as the acid diffusion control agent (Q).

Examples of the basic compound (DA) include the repeating units described in paragraphs [0188] to [0208] of JP2019-045864A.

In the composition of the embodiment of the present invention, the onium salt (DC) which is a relatively weak acid with respect to the photoacid generator (P) can be used as the acid diffusion control agent (Q).

In a case where the photoacid generator (P) and the onium salt that generates an acid which is a relatively weak acid with respect to an acid generated from the photoacid generator (P) are mixed and used, an acid generated from the photoacid generator (P) upon irradiation with actinic rays or radiation produces an onium salt having a strong acid anion by discharging the weak acid through salt exchange in a case where the acid collides with an onium salt having an unreacted weak acid anion. In this process, the strong acid is exchanged with a weak acid having a lower catalytic ability, and thus, the acid is apparently deactivated and the acid diffusion can be controlled.

Examples of the onium salt that is relatively weak acid with respect to the photoacid generator (P) include the onium salts described in paragraphs [0226] to [0233] of JP2019-070676A.

In a case where the composition of the embodiment of the present invention includes an acid diffusion control agent (Q), a content of the acid diffusion control agent (Q) (a total content in a case where a plurality of kinds of the acid diffusion control agents are present) is preferably 0.1% to 10.0% by mass, and more preferably 0.1% to 5.0% by mass, with respect to the total solid content of the composition.

In the composition of the embodiment of the present invention, the acid diffusion control agents (Q) may be used alone or in combination of two or more kinds thereof.

<Hydrophobic Resin (E)>

The composition of the embodiment of the present invention may contain a hydrophobic resin different from the resin (A), in addition to the resin (A), as the hydrophobic resin (E).

Although it is preferable that the hydrophobic resin (E) is designed to be unevenly distributed on a surface of the resist film, it does not necessarily need to have a hydrophilic group in the molecule as different from the surfactant, and does not need to contribute to uniform mixing of polar materials and non-polar materials.

Examples of the effect of addition of the hydrophobic resin (E) include a control of static and dynamic contact angles of a surface of the resist film with respect to water and suppression of out gas.

The hydrophobic resin (E) preferably has any one or more of a "fluorine atom", a "silicon atom", and a "$CH_3$ partial structure which is contained in a side chain moiety of a resin" from the viewpoint of uneven distribution on the film surface layer, and more preferably has two or more kinds thereof. Incidentally, the hydrophobic resin (E) preferably has a hydrocarbon group having 5 or more carbon atoms. These groups may be contained in the main chain of the resin or may be substituted in a side chain.

In a case where hydrophobic resin (E) includes a fluorine atom and/or a silicon atom, the fluorine atom and/or the silicon atom in the hydrophobic resin may be included in the main chain or a side chain of the resin.

In a case where the hydrophobic resin (E) contains a fluorine atom, as a partial structure having a fluorine atom, an alkyl group having a fluorine atom, a cycloalkyl group having a fluorine atom, or an aryl group having a fluorine atom is preferable.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and the alkyl group may further have a substituent other than a fluorine atom.

The cycloalkyl group having a fluorine atom is a monocyclic or polycyclic cycloalkyl group in which at least one hydrogen atom is substituted with a fluorine atom, and may further have a substituent other than a fluorine atom.

Examples of the aryl group having a fluorine atom include an aryl group such as a phenyl group and a naphthyl group, in which at least one hydrogen atom is substituted with a fluorine atom, and the aryl group may further have a substituent other than a fluorine atom.

Examples of the repeating unit having a fluorine atom or a silicon atom include those exemplified in paragraph [0519] of US2012/0251948A.

Furthermore, as described above, it is also preferable that the hydrophobic resin (E) contains a $CH_3$ partial structure in a side chain moiety.

Here, the $CH_3$ partial structure contained in the side chain moiety in the hydrophobic resin includes a $CH_3$ partial structure contained in an ethyl group, a propyl group, and the like.

On the other hand, a methyl group bonded directly to the main chain of the hydrophobic resin (E) (for example, an α-methyl group in the repeating unit having a methacrylic acid structure) makes only a small contribution of uneven distribution on the surface of the hydrophobic resin (E) due to the effect of the main chain, and it is therefore not included in the $CH_3$ partial structure in the present invention.

With regard to the hydrophobic resin (E), reference can be made to the description in paragraphs [0348] to [0415] of JP2014-010245A, the contents of which are incorporated herein by reference.

Furthermore, the resins described in JP2011-248019A, JP2010-175859A, and JP2012-032544A can also be preferably used as the hydrophobic resin (E).

In a case where the composition of the embodiment of the present invention contains the hydrophobic resin (E), a content of the hydrophobic resin (E) is preferably 0.01% to 20% by mass, and more preferably 0.1% to 15% by mass with respect to the total solid content of the composition.

<Solvent (F)>

The composition of the embodiment of the present invention may contain a solvent (F).

In a case where the composition of the embodiment of the present invention is a radiation-sensitive resin composition for EUV, it is preferable that the solvent (F) contains at least one solvent of (M1) propylene glycol monoalkyl ether carboxylate or (M2) at least one selected from the group consisting of a propylene glycol monoalkyl ether, a lactic acid ester, an acetic acid ester, an alkoxypropionic acid ester, a chain ketone, a cyclic ketone, a lactone, and an alkylene carbonate as the solvent. The solvent in this case may further contain components other than the components (M1) and (M2).

The solvent containing the components (M1) and (M2) is preferable since a use of the solvent in combination with the above-mentioned resin (A) makes it possible to form a pattern having a small number of development defects can be formed while improving the coating property of the composition.

In a case where the composition of the embodiment of the present invention is a radiation-sensitive resin composition for ArF, examples of the solvent (F) include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may contain a ring, alkylene carbonate, alkyl alkoxyacetate, and alkyl pyruvate.

A content of the solvent (F) in the composition of the embodiment of the present invention is preferably set so that the concentration of solid contents is 0.5% to 40% by mass.

Among those, the concentration of solid contents is preferably 10% by mass or more from the viewpoint that the effect of the present invention is more excellent.

<Surfactant (H)>

The composition of the embodiment of the present invention may contain a surfactant (H). By incorporation of the surfactant (H), it is possible to form a pattern having more excellent adhesiveness and fewer development defects.

As the surfactant (H), fluorine-based and/or silicon-based surfactants are preferable.

Examples of the fluorine-based and/or silicon-based surfactants include the surfactants described in paragraph [0276] of the specification of US2008/0248425A. In addition, EFTOP EF301 or EF303 (manufactured by Shin-Akita Chemical Co., Ltd.); FLUORAD FC430, 431, or 4430 (manufactured by Sumitomo 3M Inc.); MEGAFACE F171, F173, F176, F189, F113, F110, F177, F120, or R08 (manufactured by DIC Corporation); SURFLON S-382, SC101, 102, 103, 104, 105, or 106 (manufactured by Asahi Glass Co., Ltd.); TROYSOL S-366 (manufactured by Troy Corporation); GF-300 or GF-150 (manufactured by Toagosei Co., Ltd.); SURFLON S-393 (manufactured by AGC Seimi Chemical Co., Ltd.); EFTOP EF121, EF122A, EF122B, RF122C, EF125M, EF135M, EF351, EF352, EF801, EF802, or EF601 (manufactured by JEMCO Inc.); PF636, PF656, PF6320, or PF6520 (manufactured by OMNOVA Solutions Inc.); KH-20 (manufactured by Asahi Kasei Corporation); or FTX-204G, 208G, 218G, 230G, 204D, 208D, 212D, 218D, or 222D (manufactured by NEOS COMPANY LIMITED) may be used. In addition, a polysiloxane polymer, KP-341 (manufactured by Shin-Etsu Chemical Co., Ltd.), can also be used as the silicon-based surfactant.

Moreover, the surfactant (H) may be synthesized using a fluoroaliphatic compound manufactured using a telomerization method (also referred to as a telomer method) or an oligomerization method (also referred to as an oligomer method), in addition to the known surfactants as shown above. Specifically, a polymer including a fluoroaliphatic group derived from fluoroaliphatic compound may be used as the surfactant (H). This fluoroaliphatic compound can be synthesized, for example, by the method described in JP2002-90991A.

As the polymer having a fluoroaliphatic group, a copolymer of a monomer having a fluoroaliphatic group and (poly(oxyalkylene))acrylate and/or (poly(oxyalkylene)) methacrylate is preferable, and the polymer may be unevenly distributed or block-copolymerized. Furthermore, examples of the poly(oxyalkylene) group include a poly (oxyethylene) group, a poly(oxypropylene) group, and a poly(oxybutylene) group, and the group may also be a unit such as those having alkylenes having different chain lengths within the same chain length such as poly(block-linked oxyethylene, oxypropylene, and oxyethylene) and poly(block-linked oxyethylene and oxypropylene). In addition, the copolymer of a monomer having a fluoroaliphatic group and (poly(oxyalkylene))acrylate (or methacrylate) is not limited only to a binary copolymer but may also be a ternary or higher copolymer obtained by simultaneously copolymerizing monomers having two or more different fluoroaliphatic groups or two or more different (poly(oxyalkylene)) acrylates (or methacrylates).

Examples of a commercially available surfactant thereof include MEGAFACE F-178, F-470, F-473, F-475, F-476, and F-472 (manufactured by DIC Corporation), a copolymer of acrylate (or methacrylate) having a $C_6F_{13}$ group and (poly(oxyalkylene))acrylate (or methacrylate), and a copolymer of acrylate (or methacrylate) having a $C_3F_7$ group, (poly(oxyethylene))acrylate (or methacrylate), and (poly (oxypropylene))acrylate (or methacrylate).

In addition, a surfactant other than the fluorine-based surfactant and/or the silicon-based surfactants described in paragraph [0280] of the specification of US2008/0248425A may be used.

These surfactants (H) may be used alone or in combination of two or more kinds thereof.

The content of the surfactant (H) is preferably 0.0001% to 2% by mass and more preferably 0.0005% to 1% by mass with respect to the total solid content of the composition.

<Other Additives>

The composition of the embodiment of the present invention may further contain a crosslinking agent, an alkali-soluble resin, a dissolution inhibiting compound, a dye, a plasticizer, a photosensitizer, a light absorber, and/or a compound that accelerates solubility in a developer.

EXAMPLES

Hereinbelow, the present invention will be described in more detail with reference to Examples. The materials, the amounts of materials used, the proportions, the treatment details, the treatment procedure, and the like shown in Examples below may be modified as appropriate as long as the modifications do not depart from the spirit of the present invention. Therefore, the scope of the present invention should not be construed as being limited to Examples shown below.

<Synthesis of Resin (A)>

In Examples and Comparative Examples, resins A-1 to A-51 exemplified below were used as the resin (A). As the resins A-1 to A-51, those synthesized based on known techniques were used.

The compositional ratio (molar ratio; corresponding in order from the left), the weight-average molecular weight (Mw), and the dispersity (Mw/Mn) of each repeating unit in the resin (A) are shown in Table 3.

Furthermore, the weight-average molecular weight (Mw) and the dispersity (Mw/Mn) of the resins A-1 to A-51 are value expressed in terms of polystyrenes, as measured by the above-mentioned GPC method (carrier: tetrahydrofuran (THF)). In addition, the compositional ratio (ratio based on % by mole) of the repeating unit in the resin was measured by $^{13}$C-nuclear magnetic resonance (NMR).

TABLE 3

| Resin | Molar ratio of repeating units | | | | | Mw | Mw/Mn |
|---|---|---|---|---|---|---|---|
| A-1  | 64 | 18 | 18 |    |    | 21,000 | 1.5 |
| A-2  | 62 | 13 | 20 | 5  |    | 13,000 | 1.3 |
| A-3  | 75 | 20 | 5  |    |    | 10,000 | 1.4 |
| A-4  | 40 | 18 | 42 |    |    | 28,000 | 1.9 |
| A-5  | 70 | 25 | 5  |    |    | 7,000  | 1.7 |
| A-6  | 53 | 12 | 35 |    |    | 15,000 | 1.6 |
| A-7  | 70 | 12 | 18 |    |    | 17,000 | 1.6 |
| A-8  | 60 | 20 | 20 |    |    | 12,000 | 2.8 |
| A-9  | 75 | 25 |    |    |    | 21,000 | 1.3 |
| A-10 | 75 | 25 |    |    |    | 21,000 | 1.3 |
| A-11 | 65 | 25 | 10 |    |    | 21,000 | 1.3 |
| A-12 | 68 | 25 | 7  |    |    | 21,000 | 1.9 |
| A-13 | 65 | 25 | 10 |    |    | 21,000 | 1.4 |
| A-14 | 55 | 35 | 10 |    |    | 21,000 | 1.4 |
| A-15 | 65 | 25 | 10 |    |    | 21,000 | 1.3 |
| A-16 | 65 | 25 | 10 |    |    | 21,000 | 1.3 |
| A-17 | 65 | 25 | 10 |    |    | 21,000 | 1.3 |
| A-18 | 40 | 50 | 10 |    |    | 13,000 | 1.4 |
| A-19 | 45 | 55 |    |    |    | 18,000 | 1.7 |
| A-20 | 20 | 10 | 40 | 30 |    | 10,500 | 1.6 |
| A-21 | 40 | 40 | 20 |    |    | 8,000  | 1.6 |
| A-22 | 40 | 40 | 10 | 10 |    | 13,500 | 1.7 |
| A-23 | 50 | 50 |    |    |    | 10,000 | 1.6 |
| A-24 | 35 | 45 | 20 |    |    | 9,000  | 1.7 |
| A-25 | 50 | 10 | 40 |    |    | 7,500  | 1.6 |
| A-26 | 50 | 50 |    |    |    | 8,600  | 1.6 |
| A-27 | 45 | 15 | 5  | 35 |    | 7,600  | 1.6 |
| A-28 | 20 | 15 | 55 | 10 |    | 8,300  | 1.7 |
| A-29 | 35 | 15 | 25 | 25 |    | 10,000 | 1.7 |
| A-30 | 50 | 25 | 25 |    |    | 9,000  | 1.8 |
| A-31 | 40 | 10 | 35 | 5  | 10 | 10,000 | 1.7 |
| A-32 | 40 | 60 |    |    |    | 8,000  | 1.6 |
| A-33 | 30 | 60 | 10 |    |    | 8,600  | 1.5 |
| A-34 | 25 | 25 | 50 |    |    | 9,000  | 1.8 |
| A-35 | 30 | 50 | 20 |    |    | 8,000  | 1.6 |
| A-36 | 40 | 35 | 25 |    |    | 8,000  | 1.5 |
| A-37 | 30 | 10 | 50 | 10 |    | 6,000  | 1.5 |
| A-38 | 10 | 30 | 40 | 20 |    | 8,000  | 1.7 |
| A-39 | 35 | 40 | 25 |    |    | 12,000 | 1.8 |
| A-40 | 35 | 40 | 25 |    |    | 4,000  | 1.4 |
| A-41 | 30 | 20 | 20 | 30 |    | 3,000  | 1.4 |
| A-42 | 15 | 35 | 20 | 5  | 25 | 4,000  | 1.3 |
| A-43 | 20 | 20 | 40 | 20 |    | 15,000 | 1.8 |
| A-44 | 10 | 20 | 50 | 20 |    | 6,500  | 1.5 |
| A-45 | 40 | 15 | 30 | 15 |    | 8,000  | 1.5 |
| A-46 | 10 | 20 | 20 | 30 | 20 | 5,500  | 1.7 |
| A-47 | 35 | 35 | 30 |    |    | 7,200  | 1.5 |
| A-48 | 25 | 45 | 30 |    |    | 7,600  | 1.9 |
| A-49 | 60 | 40 |    |    |    | 6,800  | 1.6 |
| A-50 | 19 | 32 | 34 | 4  | 11 | 8,000  | 1.6 |
| A-51 | 10 | 30 | 20 | 25 | 15 | 7,600  | 1.7 |

TABLE 3-continued
| Resin | Molar ratio of repeating units | Mw | Mw/Mn |
|---|---|---|---|
(A-1)
(A-2)
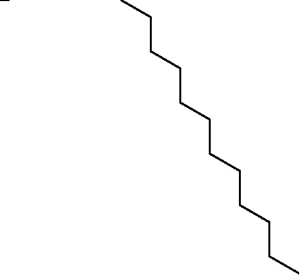
(A-3)
(A-4)
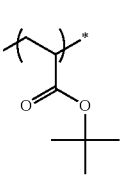
(A-5)
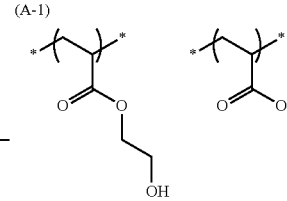
(A-6)

TABLE 3-continued
| Resin | Molar ratio of repeating units | Mw | Mw/Mn |
|---|---|---|---|
| |  (A-7) | | |
| |  (A-8) | | |
| |  (A-9) | | |
| |  (A-10) | | |
| |  (A-11) | | |
| |  (A-12) | | |
| |  (A-13) | | |

TABLE 3-continued

| Resin | Molar ratio of repeating units | Mw | Mw/Mn |
|---|---|---|---|

(A-14)

(A-15)

(A-16)

(A-17)

(A-18)

(A-19)

TABLE 3-continued

| Resin | Molar ratio of repeating units | Mw | Mw/Mn |
|---|---|---|---|

(A-20)

(A-21)

(A-22)

(A-23)

(A-24)

TABLE 3-continued
| Resin | Molar ratio of repeating units | Mw | Mw/Mn |
|---|---|---|---|
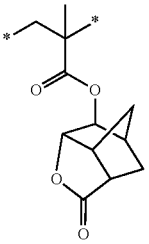
(A-25)
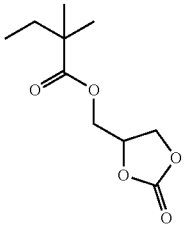
(A-26)
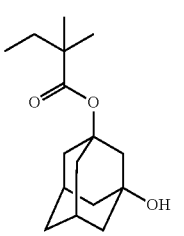
(A-27)
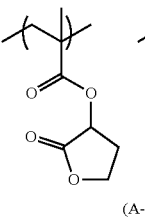
(A-28)
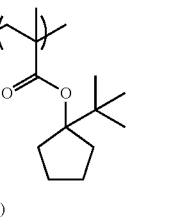
(A-29)

TABLE 3-continued

| Resin | Molar ratio of repeating units | Mw | Mw/Mn |
|---|---|---|---|

(A-30)

(A-31)

(A-32)

(A-33)

(A-34)

TABLE 3-continued

| Resin | Molar ratio of repeating units | Mw | Mw/Mn |
|---|---|---|---|

TABLE 3-continued

| Resin | Molar ratio of repeating units | Mw | Mw/Mn |
|---|---|---|---|

(A-40)

(A-41)

(A-42)

(A-43)

TABLE 3-continued

| Resin | Molar ratio of repeating units | Mw | Mw/Mn |
|---|---|---|---|
| (A-44) | | | |
| (A-45) | | | |
| (A-46) | | | |
| (A-47) | | | |
| (A-48) | | | |
| (A-49) | | | |

TABLE 3-continued
| Resin | Molar ratio of repeating units | Mw | Mw/Mn |
|---|---|---|---|
(A-50)
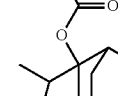
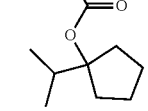
(A-51)
<Photoacid Generator>
The structures of compounds P-1 to P-55 used as the photoacid generator in Examples and Comparative Examples are shown below.
(P-1)
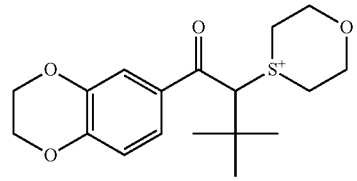
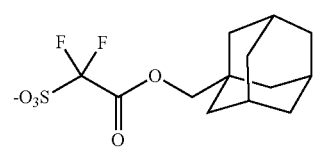
(P-2)
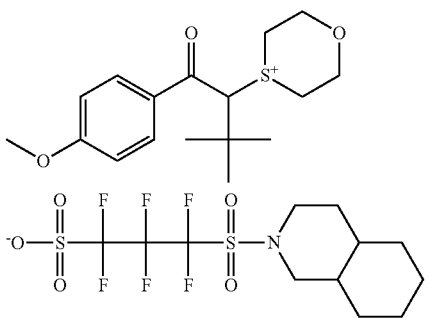
(P-3)
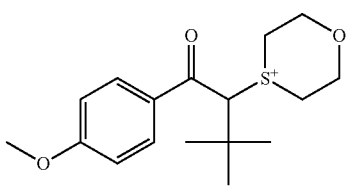
C₄F₉SO₃⁻

-continued
(P-4)
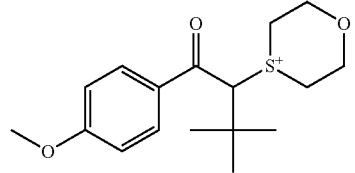
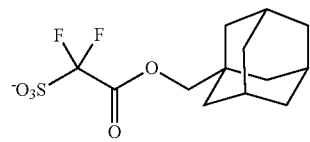
(P-5)
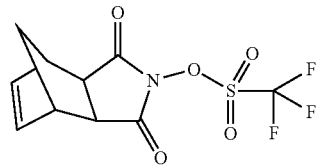
(P-6)
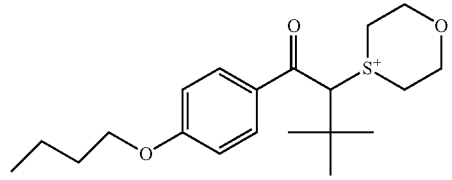
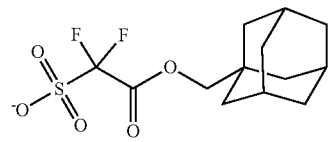
(P-7)
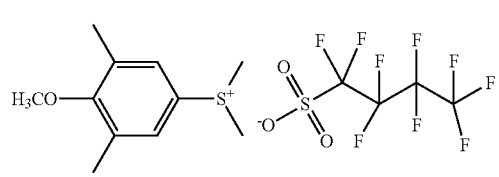
(P-8)
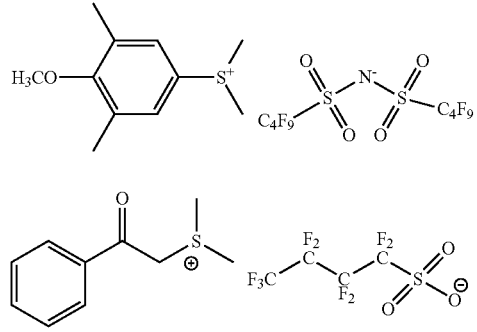
(P-9)
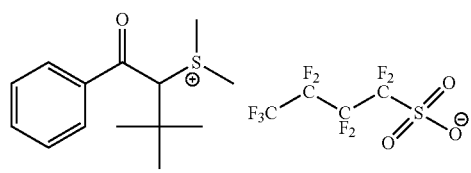
(P-10)
-continued
(P-11)
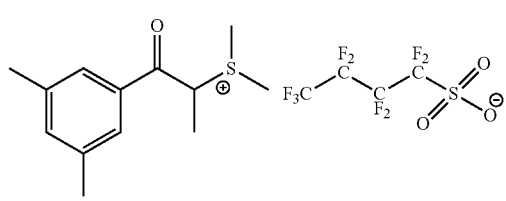
(P-12)
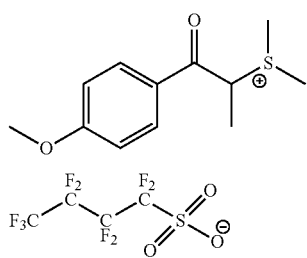
(P-13)
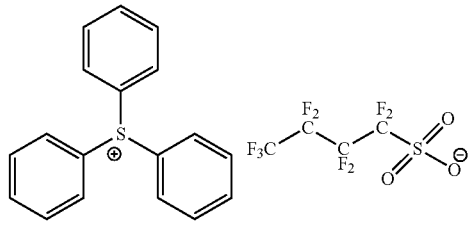
(P-14)
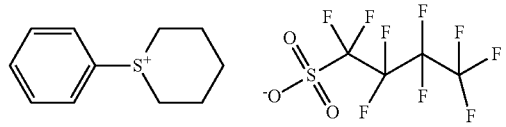
(P-15)
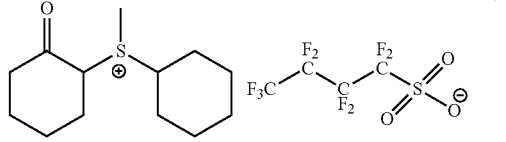
(P-16)
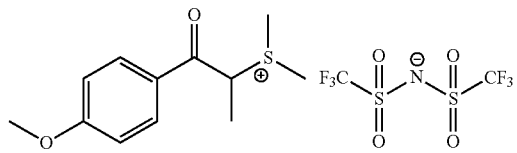
(P-17)
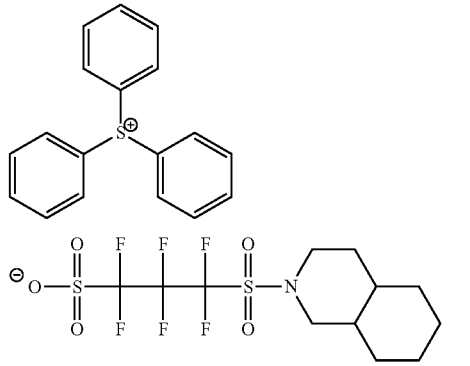

-continued
(P-18)
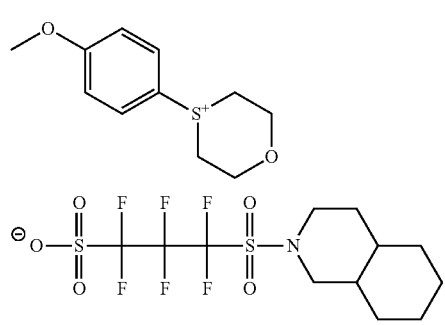
(P-19)
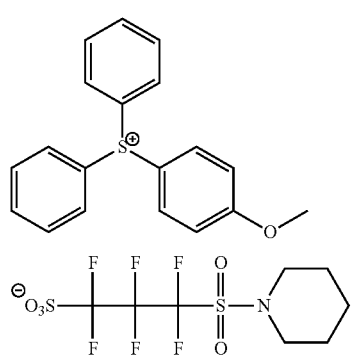
(P-20)
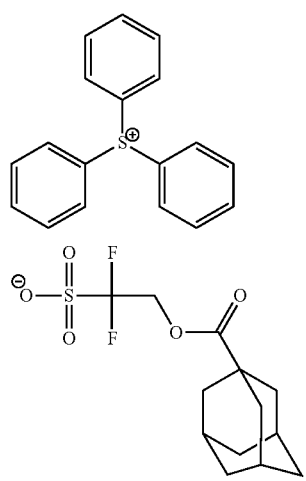
(P-21)
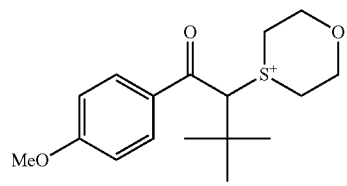
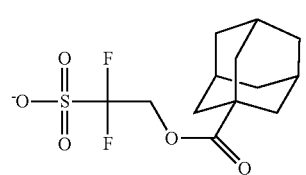
-continued
(P-22)
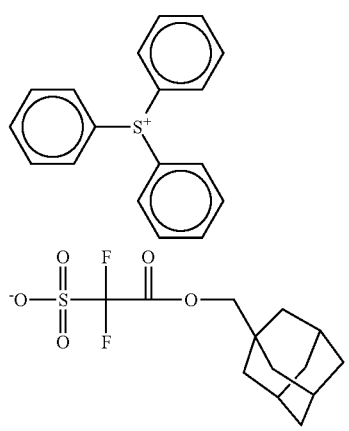
(P-23)
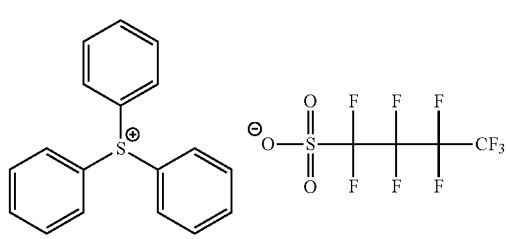
(P-24)
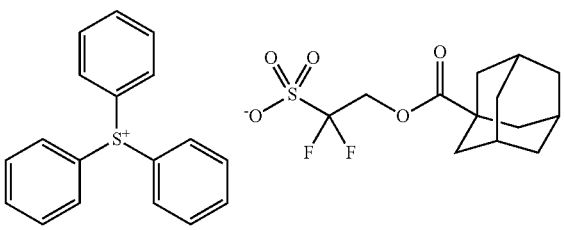
(P-25)
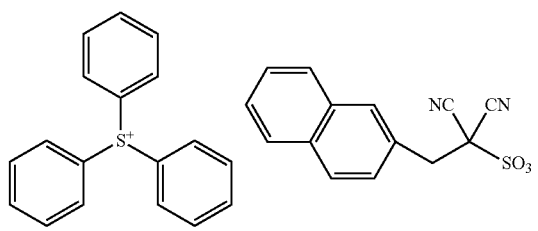
(P-26)
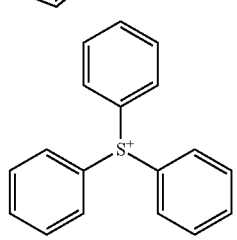

(P-27)
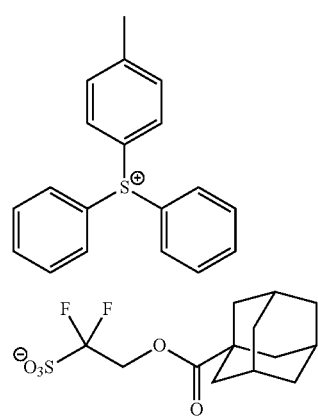
(P-28)
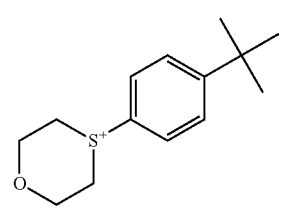
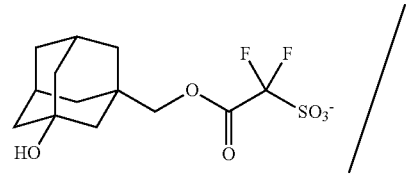
(P-29)
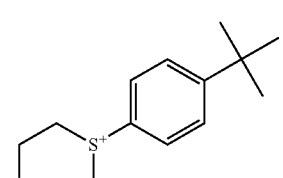
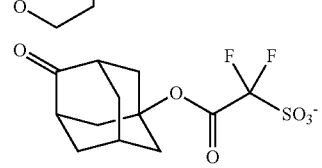
(P-30)
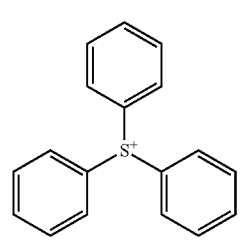
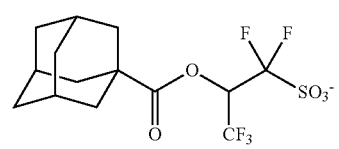
(P-31)
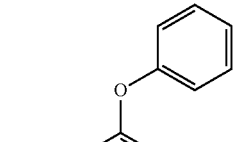
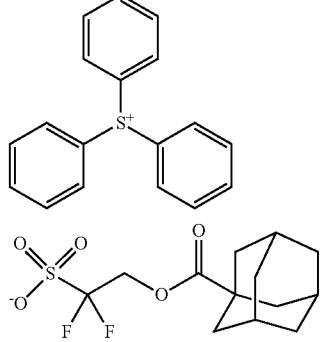
(P-32)
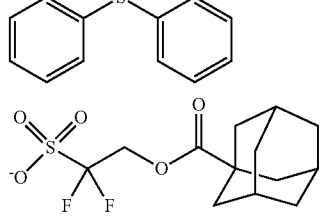
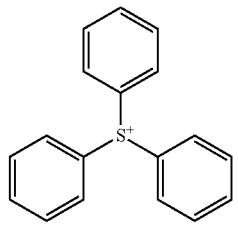
(P-33)
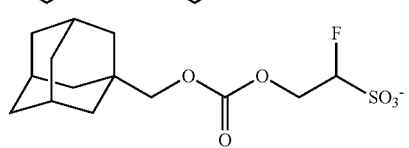
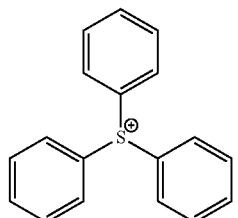
(P-34)
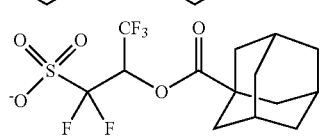
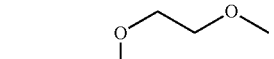
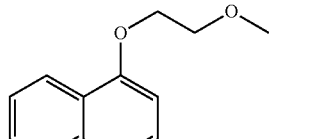
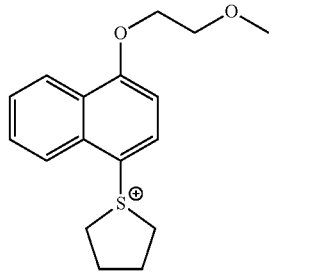
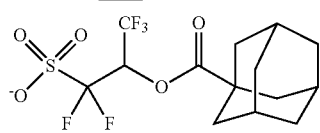

-continued
(P-35)
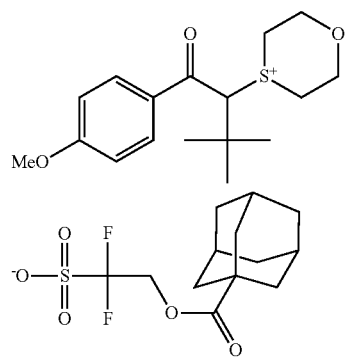
(P-36)
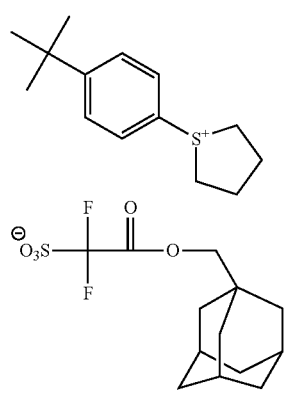
(P-37)
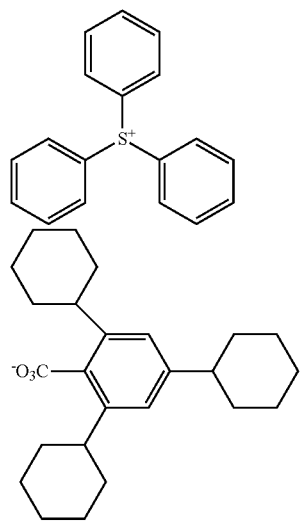
(P-38)
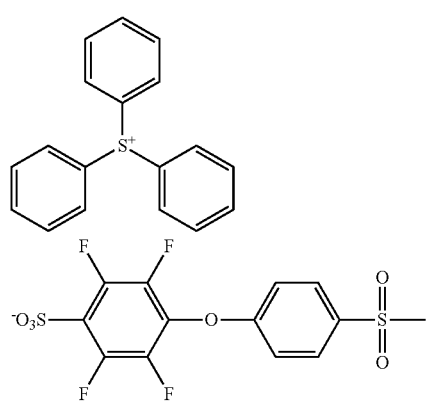
-continued
(P-39)
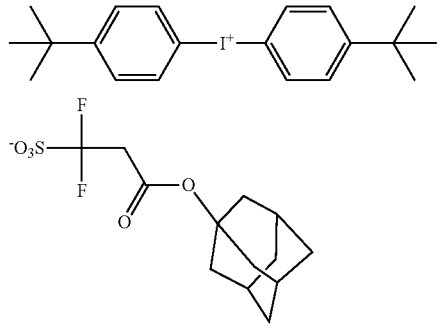
(P-40)
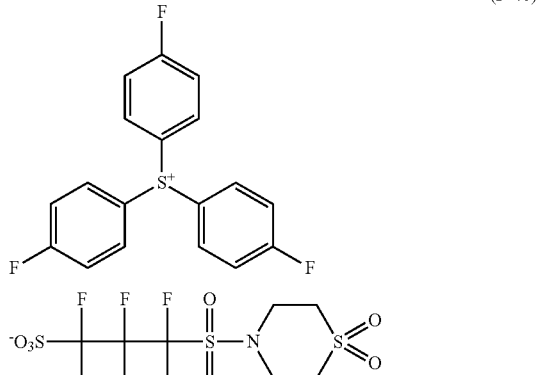
(P-41)
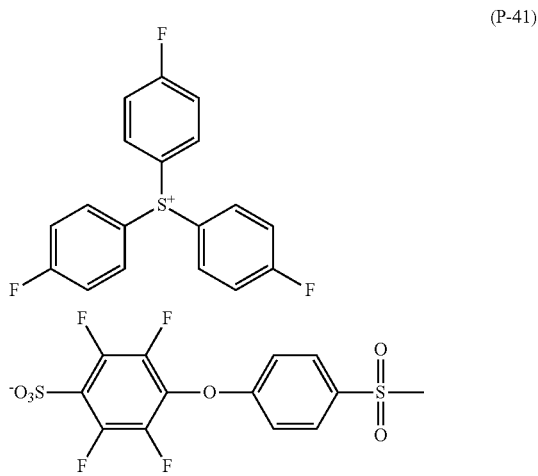
(P-42)
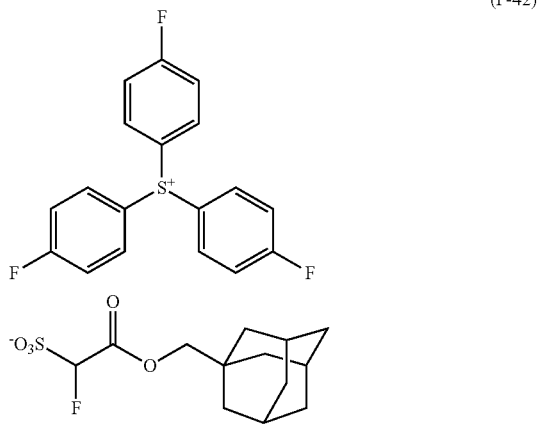

-continued
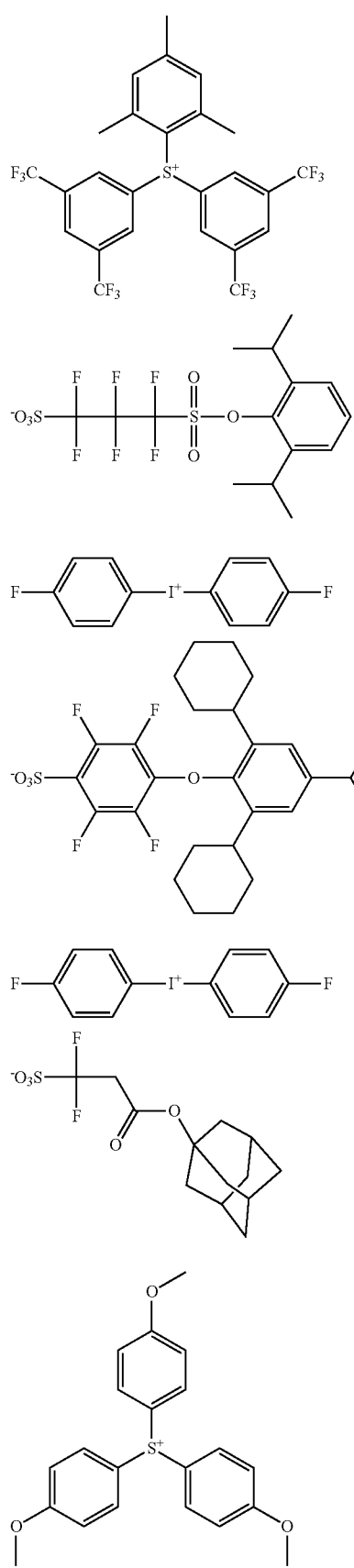
(P-43)
(P-44)
(P-45)
(P-46)
-continued
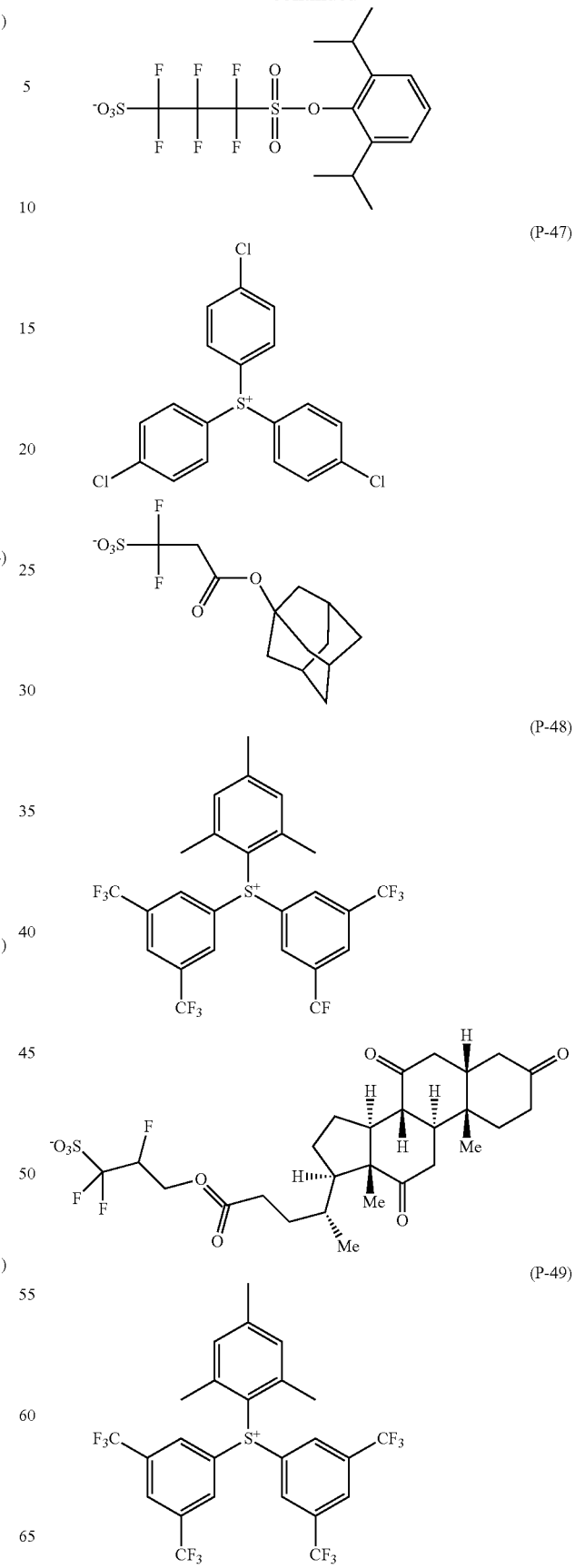
(P-47)
(P-48)
(P-49)

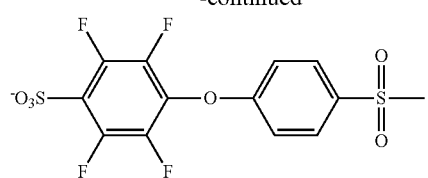
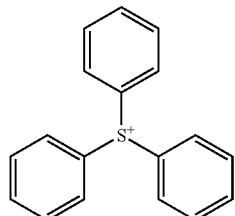
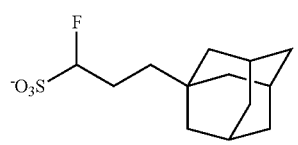
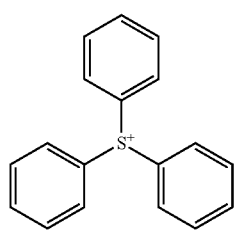
(P-51)
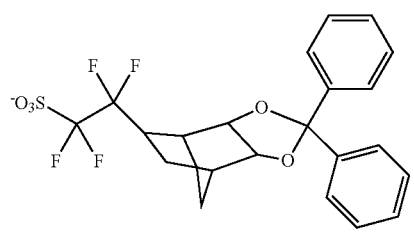
(P-52)
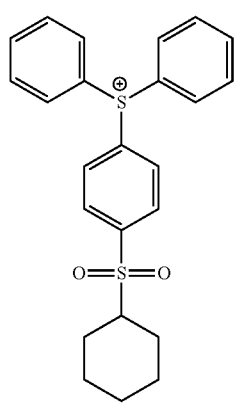
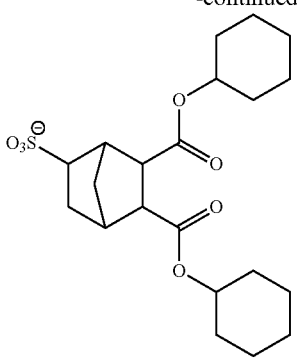
(P-50)
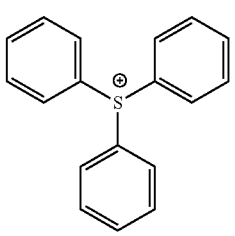
(P-53)
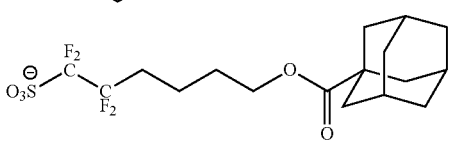
(P-54)
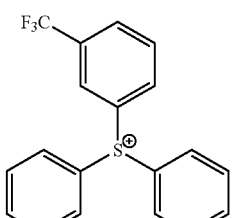
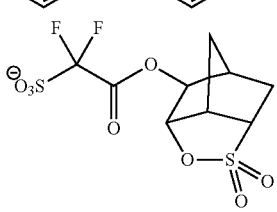
(P-55)
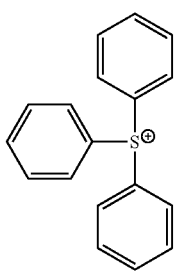
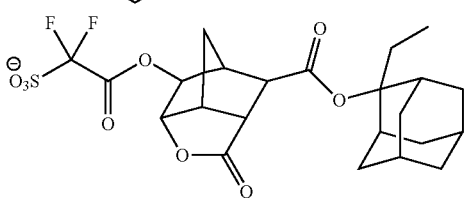

<Acid Diffusion Control Agent (Q)>
The structures of compounds Q-1 to Q-23 used as the acid diffusion control agent in Examples and Comparative Examples are shown below.
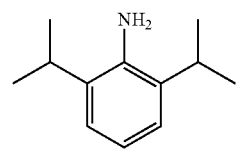 (Q-1)
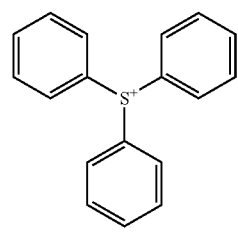 (Q-2)
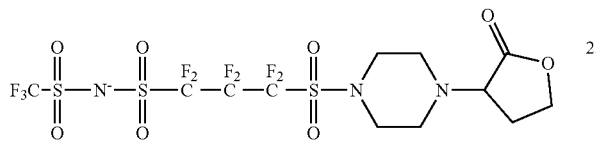 (Q-3)
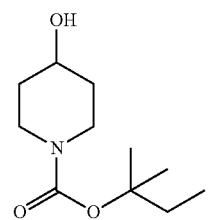 (Q-4)
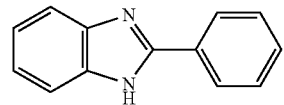 (Q-5)
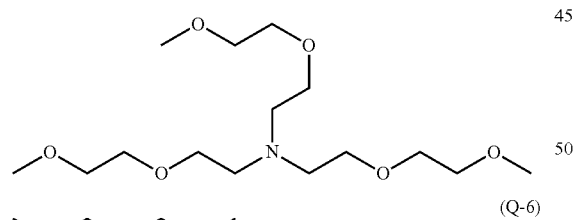 (Q-6)
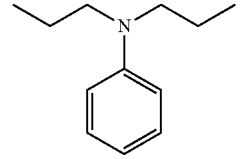 (Q-7)
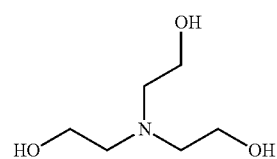 (Q-8)
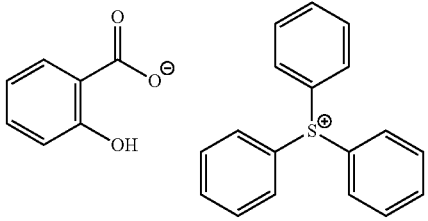 (Q-8)
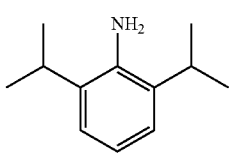 (Q-9)
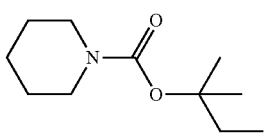 (Q-10)
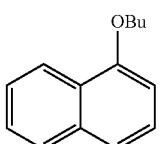 (Q-11)
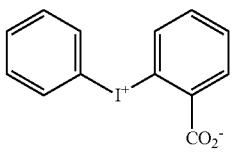 (Q-11)
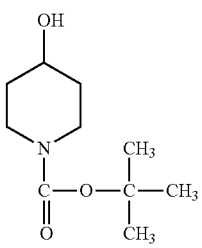 (Q-12)
(Q-13)
(Q-14)
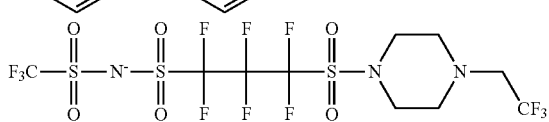

(Q-15) 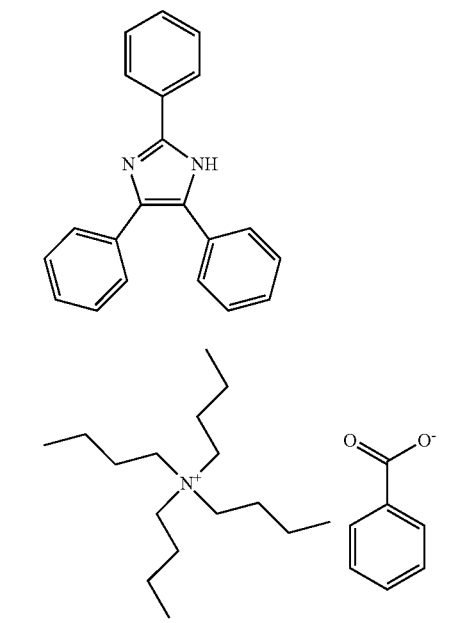

(Q-16) 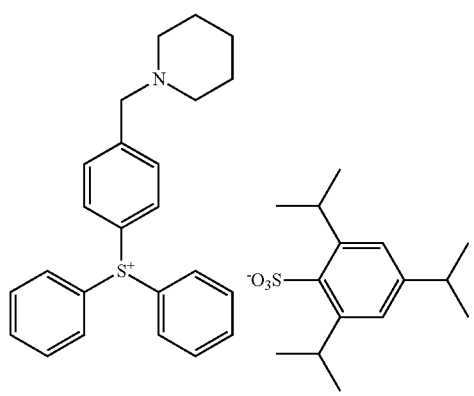

(Q-17) 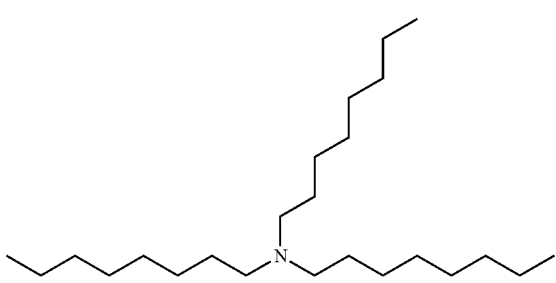

(Q-18) 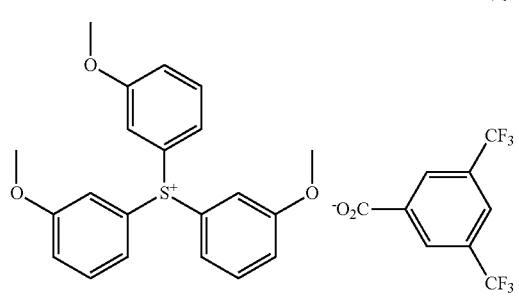

(Q-19)

(Q-20) 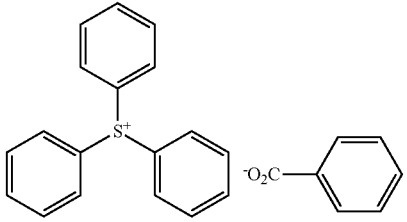

(Q-21) 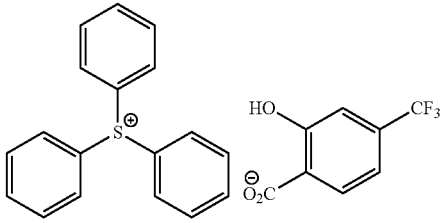

(Q-22) 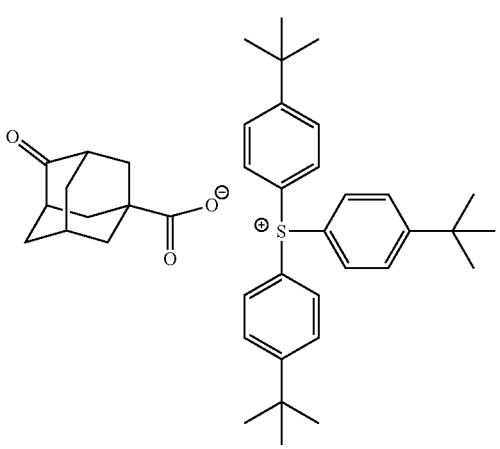

(Q-23) 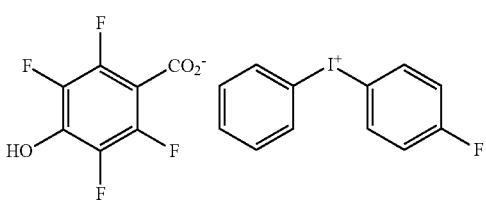

<Hydrophobic Resin (E)>

The structures of resins E-1 to E-17 used as the hydrophobic resin (E) in Examples and Comparative Examples are shown below. As the resins E-1 to E-17, those synthesized based on known techniques were used.

The compositional ratio (molar ratio; corresponding in order from the left), the weight-average molecular weight (Mw), and the dispersity (Mw/Mn) of each repeating unit in the hydrophobic resin (E) are shown in Table 4.

Furthermore, the weight-average molecular weight (Mw) and the dispersity (Mw/Mn) of the resins E-1 to E-17 were value expressed in terms of polystyrenes measured by the above-mentioned GPC method (carrier: tetrahydrofuran (THF)). In addition, the compositional ratio (ratio based on % by mole) of the repeating unit in the resin was measured by $^{13}$C-nuclear magnetic resonance (NMR).

TABLE 4
| Resin | Molar ratio of repeating units | | | | Mw | Mw/Mn |
|---|---|---|---|---|---|---|
| E-1 | 60 | 40 | | | 10,000 | 1.4 |
| E-2 | 50 | 50 | | | 12,000 | 1.5 |
| E-3 | 50 | 50 | | | 9,000 | 1.5 |
| E-4 | 50 | 50 | | | 15,000 | 1.5 |
| E-5 | 50 | 50 | | | 10,000 | 1.5 |
| E-6 | 100 | | | | 23,000 | 1.7 |
| E-7 | 70 | 30 | | | 7,200 | 1.8 |
| E-8 | 50 | 50 | | | 15,000 | 1.7 |
| E-9 | 50 | 50 | | | 10,000 | 1.7 |
| E-10 | 50 | 50 | | | 7,700 | 1.8 |
| E-11 | 100 | | | | 13,000 | 1.4 |
| E-12 | 40 | 50 | 5 | 5 | 6,000 | 1.4 |
| E-13 | 50 | 50 | | | 10,000 | 1.7 |
| E-14 | 10 | 85 | 5 | | 11,000 | 1.4 |
| E-15 | 80 | 20 | | | 13,000 | 1.4 |
| E-16 | 40 | 30 | 30 | | 8,000 | 1.6 |
| E-17 | 80 | 20 | | | 14,000 | 1.7 |
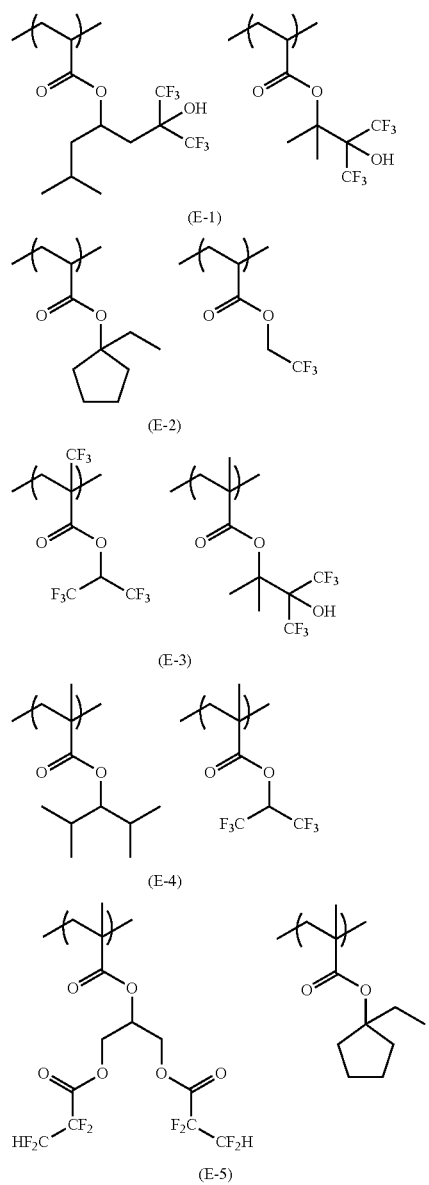

TABLE 4-continued

| Resin | Molar ratio of repeating units | Mw | Mw/Mn |
|---|---|---|---|

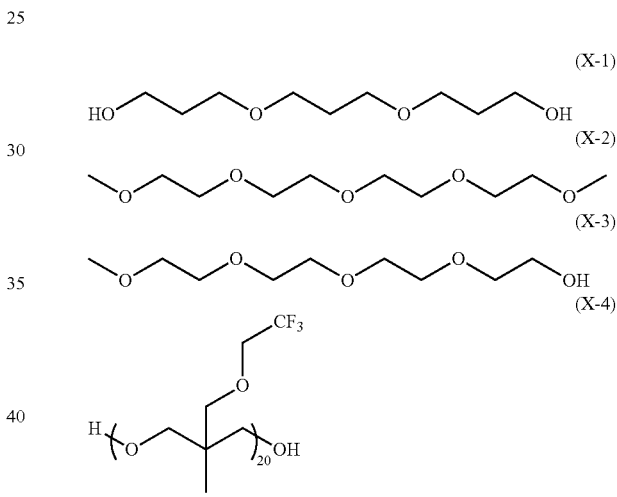

<Solvent>

Solvents used in Examples and Comparative Examples are shown below.

PGMEA: Propylene glycol monomethyl ether acetate
PGME: Propylene glycol monomethyl ether
EL: Ethyl lactate
BA: Butyl acetate
MAK: 2-Heptanone
MMP: Methyl 3-methoxypropionate
γ-BL: γ-Butyrolactone
CyHx: Cyclohexanone <Surfactant (H)>

Surfactants used in Examples and Comparative Examples are shown below.

H-1: MEGAFACE R-41 (manufactured by DIC Corporation)
H-2: MEGAFACE F176 (manufactured by DIC Corporation)
H-3: MEGAFACE R08 (manufactured by DIC Corporation)

<Additive (X)>

Additives used in Examples and Comparative Examples are shown below.

X-5: Polyvinyl Methyl Ether LUTONAL M40 (manufactured by BASF)
X-6: KF-53 (manufactured by Shin-Etsu Chemical Co., Ltd.)
X-7: Salicylic acid

Examples and Comparative Examples

A resist composition as shown in Tables 5 to 7 which will be described later was prepared by performing an operation which will be described later in a clean room of Class 1000 having a temperature of 22.0° C., a humidity of 58%, and an atmospheric pressure of 102.6 kPa, and applied to each of Examples and Comparative Examples shown in Tables 9 to 11.

First, each component was put into a stirring tank arranged in the clean room so as to have a composition of the resist composition (resists 1 to 48) described in Tables 5 to 7, and the above-mentioned step 1 was carried out. At that time, with regard to the addition of a solvent, the solvent was passed through a polyethylene filter having a pore size of 0.01 μm and put into the stirring tank. In addition, with regard to putting the components other than the solvent, first, a part of the solvent used for preparing each resist composition was passed through a polyethylene filter having a pore size of 0.01 µm, and each component was dissolved in the solvent which had been passed therethrough to prepare a diluted solution. Thereafter, the obtained diluted solution was passed through a filter and put into a stirring tank.

A void ratio (proportion occupied by a space (void)) inside the stirring tank after putting each component was 15% by volume. In other words, an occupancy of the mixture in the stirring tank was 85% by volume.

Furthermore, the dilution concentration of the diluted solution and the type of filter were changed according to a resist composition to be prepared.

Specifically, in a case where the resist composition (resist 1 to 15) in Table 5 was prepared, the dilution concentration of the diluted solution in which the resin had been dissolved was 50% by mass, the dilution concentration of the diluted solution in which the other materials (the photoacid generator, the acid diffusion control agent, the additive 1, and the additive 2) had been dissolved was 20% by mass, a polyethylene filter having a pore size of 0.1 µm was used as a filter used for the diluted solution in which the resin had been dissolved, and a polyethylene filter having a pore size of 0.05 µm was used as a filter used for the diluted solution in which the other materials (the photoacid generator, the acid diffusion control agent, the additive 1, and the additive 2) had been dissolved. Furthermore, the resists 1 to 15 were used for KrF exposure, as will be described later.

In a case where the resist composition (resists 16 to 31) in Table 6 was prepared, the dilution concentration was 10% by mass and the polyethylene filter having a pore size of 0.02 µm was used as a filter. Furthermore, the resists 16 to 31 were used for ArF exposure, as will be described later.

In a case where the resist composition (resists 32 to 48) shown in Table 7 was prepared, the dilution concentration was 5% by mass and the polyethylene filter having a pore size of 0.01 µm was used as a filter. Furthermore, the resists 32 to 48 were used for EUV exposure, as will be described later.

Moreover, in each of Examples and Comparative Examples shown in Tables 9 to 11, the substitution of a gas in the stirring tank was carried out by the method shown in Table 8.

For example, in the production method 1 described in Table 8, a nitrogen gas was introduced into the stirring tank between the step 1 and the step 2, which will be described later, to substitute the gas in the stirring tank. At that time, a difference between the atmospheric pressure inside the stirring tank and the atmospheric pressure outside the stirring tank (the atmospheric pressure inside the stirring tank—the atmospheric pressure outside the stirring tank) was 1.5 kPa, and a content of the nitrogen gas in the specific gas (in the gas inside the stirring tank) was 91% by volume.

In addition, for example, in the production method 2 shown in Table 8, while the step 1 was carried out (in other words, while each component was put into the stirring tank), a nitrogen gas was introduced into the stirring tank to substitute the gas in the stirring tank. At that time, a difference between the atmospheric pressure inside the stirring tank and the atmospheric pressure outside the stirring tank (the atmospheric pressure inside the stirring tank—the atmospheric pressure outside the stirring tank) was 1.5 kPa, and a content of the nitrogen gas in the specific gas (in the gas inside the stirring tank) was 91% by volume.

In addition, for example, in the production method 3 shown in Table 8, before the step 1 was carried out (in other words, before each component was put into the stirring tank), a nitrogen gas was introduced into the stirring tank to substitute the gas in the stirring tank. At that time, a difference between the atmospheric pressure inside the stirring tank and the atmospheric pressure outside the stirring tank (the atmospheric pressure inside the stirring tank—the atmospheric pressure outside the stirring tank) was 1.5 kPa, and a content of the nitrogen gas in the specific gas (in the gas inside the stirring tank) was 91% by volume.

As described above, the "Timing for starting gas charge" column shown in Table 8 indicates a timing at which substitution of the gas in the stirring tank is carried out. Furthermore, in the comparative manufacturing method 1, the substitution was not carried out. In addition, after substituting the gas in the stirring tank, a predetermined gas was continuously introduced so that the inert gas concentration and the differential pressure shown in Table 8 in the state in the stirring tank were maintained even in the subsequent treatment. For example, in a case where the substitution of the gas was carried out before the step 1, the inert gas concentration and the differential pressure in the stirring tank were maintained in the subsequent steps 1 and 2.

In addition, the "Type" column shown in Table 8 indicates the type of an inert gas introduced into the stirring tank, and the "Inert gas concentration (% by volume)" column indicates the concentration (% by volume) of the inert gas in a gas introduced into the stirring tank.

In addition, the "Differential pressure (kPa)" column shown in Table 8 indicates the difference between the atmospheric pressure inside the stirring tank and the atmospheric pressure outside the stirring tank (atmospheric pressure inside the stirring tank—atmospheric pressure outside the stirring tank). That is, in the production methods 1 to 7 and the comparative production methods 2 to 5 shown in Table 8, the atmospheric pressure inside the stirring tank was higher than the atmospheric pressure outside the stirring tank.

Next, as shown in FIG. 1, the stirring shaft to which the stirring blade was attached, arranged in the stirring tank, was rotated to stir and mix each component, thereby carrying out the step 2. The temperature of the mixture at the time of stirring and mixing was 22° C.

Furthermore, in a case where the resist composition (resists 1 to 15) in Table 5 was prepared, the rotation speed of the stirring blade was 300 rpm. Moreover, in a case where the resist composition (resists 16 to 31) shown in Table 6 was prepared, the rotation speed of the stirring blade was 60 rpm. In addition, in a case where the resist composition (resist 32 to 48) shown in Table 7 was prepared, the rotation speed of the stirring blade was 60 rpm.

Furthermore, in each of Examples and Comparative Examples, the gas shown in Table 8 was continuously introduced into the stirring tank while the step 2 was carried out, and a predetermined differential pressure condition was maintained. For example, the resist 1 was prepared by the production method 1 in Example A1 of Table 9, the differential pressure of 1.5 kPa of the production method 1 was maintained in the step 2 of stirring and mixing the respective components, and a nitrogen gas was introduced into the stirring tank so that the specific gas have a nitrogen gas concentration of 91% by volume.

After completion of the stirring, the mixture in the stirring tank was pumped to the circulation pipe connected to the stirring tank as shown in FIG. 1 by using a liquid feeding pump. Furthermore, the circulation pipe is a pipe in which one end is connected to the bottom part of the stirring tank and the other end is connected to the upper part of the stirring tank, a filter is arranged in the middle thereof, and filtration using the filter is carried out by circulating the circulation pipe. The circulation was carried out until the amount of liquid upon the passage of the mixture through the filter reached four times the total amount of liquid in the pipe.

Moreover, the type of the filter was changed according to a resist composition to be prepared.

Specifically, in a case where the resist composition (resist 1 to 15) shown in Table 5 was prepared, a 2-stage filter composed of a filter consisting of nylon 66 having a pore size of 0.02 μm and a polyethylene filter having a pore size of 0.01 μm was used.

In a case where the resist composition (resists 16 to 31) shown in Table 6 was prepared, a 2-stage filter composed of a filter consisting of nylon 6 having a pore size of 0.01 μm and a polyethylene filter having a pore size of 0.003 μm was used.

In a case where the resist composition (resists 32 to 48) shown in Table 7 was prepared, a 2-stage filter composed of a filter consisting of nylon 6 having a pore size of 0.005 μm and a polyethylene filter having a pore size of 0.003 μm was used.

After the circulatory filtration treatment was completed, the obtained resist composition was charged into a container for evaluation through a discharge pipe and a discharge nozzle as shown in FIG. 1. The gas in the container was substituted with the specific gas charged in the stirring tank in each of Examples and Comparative Examples.

In Tables 5 to 7, "TMAH (2.38%)" represents an aqueous solution having a tetramethylammonium hydroxide content of 2.38% by mass.

"TMAH (1.00%)" represents an aqueous solution having a tetramethylammonium hydroxide content of 1.00% by mass.

"TMAH (3.00%)" means an aqueous solution having a tetramethylammonium hydroxide content of 3.00% by mass.

"nBA" represents butyl acetate.

In Tables 5 to 7, the "Content" column of each component indicates a content (% by mass) of each component with respect to the total solid content in the resist composition.

In Tables 5 to 7, the numerical value in the "Solvent" column indicates a content mass ratio of each component.

In Tables 5 to 7, the "Solid content" column indicates a total concentration of solid contents (% by mass) in the resist composition.

TABLE 5

| Resist composition | Resin Type | Resin Content | Photoacid generator Type | Photoacid generator Content | Acid diffusion control agent Type | Acid diffusion control agent Content | Additive 1 Type | Additive 1 Content | Additive 2 Type | Additive 2 Content |
|---|---|---|---|---|---|---|---|---|---|---|
| Resist 1 | A-1 | 83.71% | P-1 | 1.20% | Q-1 | 0.03% | X-1 | 15% | H-1 | 0.06% |
| Resist 2 | A-2 | 90.40% | P-2 | 2.50% | Q-2 | 0.10% | X-2 | 6.95% | X-4 | 0.05% |
| Resist 3 | A-3 | 97.15% | P-3 | 2.70% | Q-3 | 0.10% | — | — | H-1 | 0.05% |
| Resist 4 | A-4 | 87.65% | P-4 | 3.10% | Q-4 | 0.20% | X-3 | 9% | H-1 | 0.05% |
| Resist 5 | A-5 | 95.1% | P-5 | 4.5% | Q-4 | 0.3% | — | — | X-4 | 0.1% |
| Resist 6 | A-6 | 97% | P-1 | 2.90% | Q-2 | 0.10% | — | — | — | — |
| Resist 7 | A-7 | 88.67% | P-6 | 1.20% | Q-3 | 0.04% | X-2 | 10% | X-4 | 0.09% |
| Resist 8 | A-8 | 95.8% | P-7/P-8 | 1.0%/1.0% | Q-5 | 0.10% | X-5 | 2.00% | X-6 | 0.10% |
| Resist 9 | A-9 | 98.55% | P-9 | 1.20% | Q-6 | 0.20% | — | — | X-4 | 0.05% |
| Resist 10 | A-10 | 98.55% | P-10/P-11 | 0.6%/0.6% | Q-6 | 0.20% | — | — | H-1 | 0.05% |
| Resist 11 | A-11 | 98.60% | P-12/P-13 | 0.6%/0.6% | Q-6 | 0.20% | — | — | — | — |
| Resist 12 | A-12 | 97.80% | P-14 | 1.95% | Q-7 | 0.07% | X-7 | 0.09% | H-1 | 0.09% |
| Resist 13 | A-13/A-14 | 49.275%/49.275% | P-12/P-15 | 0.6%/0.6% | Q-2/Q-4 | 0.1%/0.1% | — | — | X-4 | 0.05% |
| Resist 14 | A-15/A-16 | 49.275%/49.275% | P-12/P-16 | 0.6%/0.6% | Q-4 | 0.20% | — | — | — | — |
| Resist 15 | A-17/A-18 | 49.275%/49.275% | P-2 | 1.20% | Q-6/Q-8 | 0.1%/0.1% | — | — | H-1 | 0.05% |

| Resist composition | Solvent | Solid contents | Forming condition Film thickness | Forming condition PB | Forming condition PEB | Forming condition Developer |
|---|---|---|---|---|---|---|
| Resist 1 | PGMEA/PGME (50/50) | 40% | 11.0 μm | 130° C./60 sec | 120° C./60 sec | TMAH (2.38%) |
| Resist 2 | PGMEA | 33% | 11.0 μm | 130° C./60 sec | 120° C./60 sec | TMAH (2.38%) |
| Resist 3 | PGMEA/PGME (70/30) | 33% | 11.0 μm | 130° C./60 sec | 120° C./60 sec | TMAH (2.38%) |
| Resist 4 | PGMEA/EL (80/20) | 31% | 11.0 μm | 130° C./60 sec | 120° C./60 sec | TMAH (2.38%) |
| Resist 5 | PGMEA/BA (50/50) | 35% | 7.5 μm | 110° C./60 sec | 110° C./60 sec | TMAH (2.38%) |
| Resist 6 | MAK/MMP (60/40) | 28% | 9.0 μm | 130° C./60 sec | 120° C./60 sec | TMAH (2.38%) |
| Resist 7 | PGMEA/PGME (50/50) | 39% | 11.0 μm | 130° C./60 sec | 120° C./60 sec | TMAH (2.38%) |
| Resist 8 | PGMEA/EL (70/30) | 35% | 8.0 μm | 150° C./60 sec | 110° C./60 sec | TMAH (2.38%) |
| Resist 9 | PGMEA/PGME (80/20) | 28% | 5.0 μm | 130° C./60 sec | 120° C./60 sec | TMAH (2.38%) |

TABLE 5-continued

| | | | | | | |
|---|---|---|---|---|---|---|
| Resist 10 | PGMEA/PGME (80/20) | 32% | 10.0 μm | 130° C./60 sec | 120° C./60 sec | TMAH (2.38%) |
| Resist 11 | PGMEA/PGME (80/20) | 27% | 5.0 μm | 130° C./60 sec | 120° C./60 sec | TMAH (2.38%) |
| Resist 12 | PGMEA/PGME (20/80) | 28% | 5.0 um | 140° C./60 sec | 110° C./60 sec | TMAH (2.38%) |
| Resist 13 | PGMEA/PGME (80/20) | 32% | 10.0 μm | 130° C./60 sec | 120° C./60 sec | TMAH (2.38%) |
| Resist 14 | PGMEA/PGME (80/20) | 32% | 10.0 μm | 130° C./60 sec | 120° C./60 sec | TMAH (2.38%) |
| Resist 15 | PGMEA/PGME (80/20) | 32% | 10.0 μm | 130° C./60 sec | 110° C./60 sec | TMAH (2.38%) |

TABLE 6

| Resist composition | Resin | | Photoacid generator | | Acid diffusion control agent | | Additive 1 | | Additive 2 | | Solvent |
|---|---|---|---|---|---|---|---|---|---|---|---|
| | Type | Content | Type | Content | Type | Content | Type | Content | Type | Content | |
| Resist 16 | A-19 | 89.20% | P-17/P-18 | 3.6%/6.1% | Q-9 | 0.30% | — | — | E-1 | 0.80% | PGMEA/PGME (80/20) |
| Resist 17 | A-20 | 90.70% | P-19 | 7.90% | Q-10 | 0.40% | — | — | E-2 | 1.00% | PGMEA/PGME (90/10) |
| Resist 18 | A-21 | 88.20% | P-20/P-21 | 5.2%/5.2% | Q-10 | 0.50% | — | — | E-3 | 0.90% | PGMEA/PGME/γ-BL (70/20/10) |
| Resist 19 | A-22 | 87.50% | P-22 | 8.20% | Q-4/Q-2 | 0.3%/2.5% | — | — | E-4 | 1.50% | PGMEA/CyHx (60/40) |
| Resist 20 | A-23 | 82.88% | P-23 | 11.30% | Q-11 | 5.10% | — | — | E-5 | 0.72% | PGMEA/γ-BL (80/20) |
| Resist 21 | A-24 | 86.90% | P-24 | 10.20% | Q-4/Q-8 | 0.3%/2.0% | — | — | E-6 | 0.60% | PGMEA/PGME (80/20) |
| Resist 22 | A-25 | 85% | P-25/P-26 | 6%/6.7% | Q-8 | 2% | — | — | E-7 | 0.30% | PGMEA/CyHx/γ-BL (69/30/1) |
| Resist 23 | A-26 | 89% | P-27 | 8% | Q-8 | 2% | — | — | E-8 | 1.0% | PGMEA/CyHx/γ-BL (45/30/25) |
| Resist 24 | A-27 | 85.60% | P-28/P-29 | 6.1%/4.2% | Q-12 | 2.40% | — | — | E-9 | 1.70% | PGMEA/PGME/MAK/γ-BL (85/6.5/6.5/1) |
| Resist 25 | A-28 | 83.50% | P-30 | 12.50% | Q-13 | 1% | — | — | E-10 | 3% | PGMEA/γ-BL (80/20) |
| Resist 26 | A-29 | 82.40% | P-31/P-24 | 5.2%/7.7% | Q-3/Q-2 | 0.2%/4.0% | — | — | E-11 | 0.50% | PGMEA/γ-BL (95/5) |
| Resist 27 | A-30 | 87.40% | P-32 | 11.30% | Q-3 | 0.70% | — | — | E-12 | 0.60% | PGMEA/CyHx/γ-BL (69/30/1) |
| Resist 28 | A-31 | 87.40% | P-33/P-34 | 2.8%/6.3% | Q-14 | 3.20% | — | — | E-13 | 0.30% | PGMEA/PGME/γ-BL (80/15/5) |
| Resist 29 | A-32 | 92.60% | P-1 | 6.50% | Q-4 | 0.40% | — | — | E-14 | 0.50% | PGMEA/PGME (80/20) |
| Resist 30 | A-33 | 87.85% | P-35 | 9.80% | Q-2 | 1.90% | — | — | E-15 | 0.45% | PGMEA/PGME (90/10) |
| Resist 31 | A-34 | 89.30% | P-36 | 9.10% | Q-6 | 0.60% | — | — | E-16 | 1.00% | PGMEA/PGME (90/10) |

| Resist composition | Forming condition | | | | |
|---|---|---|---|---|---|
| | Solid contents | Film thickness | PB | PEB | Developer |
| Resist 16 | 3% | 90 nm | 100° C./60 sec | 100° C./60 sec | TMAH (2.38%) |
| Resist 17 | 3% | 90 nm | 100° C./60 sec | 95° C./60 sec | TMAH (2.38%) |
| Resist 18 | 3% | 90 nm | 90° C./60 sec | 90° C./60 sec | TMAH (2.38%) |
| Resist 19 | 3% | 90 nm | 110° C./60 sec | 95° C./60 sec | nBA |
| Resist 20 | 3% | 90 nm | 100° C./60 sec | 90° C./60 sec | nBA |
| Resist 21 | 3% | 90 nm | 90° C./60 sec | 100° C./60 sec | nBA |
| Resist 22 | 3% | 90 nm | 100° C./60 sec | 95° C./60 sec | TMAH (2.38%) |
| Resist 23 | 3% | 90 nm | 110° C./60 sec | 90° C./60 sec | TMAH (2.38%) |
| Resist 24 | 3% | 90 nm | 110° C./60 sec | 90° C./60 sec | TMAH (2.38%) |
| Resist 25 | 3% | 90 nm | 100° C./60 sec | 90° C./60 sec | TMAH (2.38%) |

TABLE 6-continued

| Resist 26 | 4% | 120 nm | 90° C./60 sec | 90° C./60 sec | TMAH (2.38%) |
| --- | --- | --- | --- | --- | --- |
| Resist 27 | 4% | 120 nm | 110° C./60 sec | 100° C./60 sec | TMAH (2.38%) |
| Resist 28 | 6% | 170 nm | 100° C./60 sec | 90° C./60 sec | TMAH (2.38%) |
| Resist 29 | 6% | 170 nm | 90° C./60 sec | 90° C./60 sec | TMAH (2.38%) |
| Resist 30 | 4% | 130 nm | 100° C./60 sec | 90° C./60 sec | nBA |
| Resist 31 | 6% | 170 nm | 100° C./60 sec | 90° C./60 sec | nBA |

TABLE 7

| Resist composition | Resin Type | Resin Content | Photoacid generator Type | Photoacid generator Content | Acid diffusion control agent Type | Acid diffusion control agent Content | Additive 1 Type | Additive 1 Content | Additive 2 Type | Additive 2 Content | Solvent | Solid contents | Film thickness | Forming condition PB | Forming condition PEB | Developer |
|---|---|---|---|---|---|---|---|---|---|---|---|---|---|---|---|---|
| Resist 32 | A-35 | 74.00% | P-37/P-38 | 7.5%/7.5% | Q-4 | 1.00% | — | — | — | — | PGMEA/PGME/EL (30/20/50) | 1.4% | 50 nm | 100° C./60 sec | 120° C./60 sec | TMAH (2.38%) |
| Resist 33 | A-35 | 74.00% | P-37/P-38 | 7.5%/7.5% | Q-4 | 1.00% | — | — | — | — | PGMEA/PGME/EL (30/20/50) | 1.4% | 50 nm | 100° C./60 sec | 120° C./60 sec | nBA |
| Resist 34 | A-36 | 79.20% | P-39 | 20.0% | Q-15 | 0.80% | — | — | — | — | PGMEA/EL 60/40 | 1.6% | 55 nm | 120° C./60 sec | 90° C./60 sec | TMAH (2.38%) |
| Resist 35 | A-37 | 71.92% | P-40 | 26.0% | Q-16 | 2.08% | — | — | — | — | PGMEA/PGME (90/10) | 1.3% | 50 nm | 90° C./60 sec | 105° C./30 sec | TMAH (1.00%) |
| Resist 36 | A-38 | 80.00% | P-41/P-42 | 8%/8% | Q-2 | 4.00% | — | — | — | — | PGMEA | 1.6% | 55 nm | 100° C./45 sec | 100° C./50 sec | TMAH (2.38%) |
| Resist 37 | A-39 | 74.70% | P-43 | 20.0% | Q-17 | 5.00% | — | — | H-2 | 0.30% | EL | 1.4% | 50 nm | 100° C./60 sec | 120° C./60 sec | TMAH (3.00%) |
| Resist 38 | A-40 | 80.70% | P-44/P-45 | 13%/3% | Q-15 | 1.30% | — | — | E-17 | 2.00% | PGMEA | 1.4% | 55 nm | 120° C./60 sec | 120° C./60 sec | TMAH (2.38%) |
| Resist 39 | A-41 | 78.40% | P-46 | 20.0% | Q-18 | 1.60% | — | — | — | — | PGMEA/EL/γ-BL (30/90/10) | 1.6% | 55 nm | 100° C./60 sec | 90° C./60 sec | TMAH (2.38%) |
| Resist 40 | A-42 | 72.40% | P-47 | 20.0% | Q-15/Q-17 | 1.6%/6.0% | — | — | — | — | PGMEA/PGME (90/10) | 2.1% | 65 nm | 100° C./60 sec | 100° C./60 sec | TMAH (2.38%) |
| Resist 41 | A-43 | 78.40% | P-48 | 20.0% | Q-15 | 1.60% | — | — | — | — | PGMEA/PGME (60/40) | 2.1% | 60 nm | 100° C./60 sec | 100° C./60 sec | TMAH (2.38%) |
| Resist 42 | A-44 | 69.50% | P-37/P-49 | 12%/9% | Q-2 | 9.00% | — | — | H-3 | 0.50% | PGMEA/EL (80/20) | 1.4% | 50 nm | 100° C./60 sec | 110° C./60 sec | TMAH (2.38%) |
| Resist 43 | A-45 | 80.00% | P-37/P-23 | 5%/8% | Q-19 | 7.00% | — | — | — | — | PGMEA/EL (80/20) | 1.6% | 55 nm | 90° C./60 sec | 100° C./60 sec | TMAH (2.38%) |
| Resist 44 | A-46 | 83.00% | P-50/P-51 | 5%/8% | Q-20 | 4.00% | — | — | — | — | PGMEA/EL/CyHx (30/40/30) | 1.5% | 50 nm | 100° C./60 sec | 100° C./60 sec | TMAH (2.38%) |
| Resist 45 | A-47 | 57% | P-52/P-53 | 12%/4% | Q-21 | 27% | — | — | — | — | PGMEA/EL (70/30) | 1.3% | 50 nm | 90° C./60 sec | 100° C./60 sec | TMAH (2.38%) |
| Resist 46 | A-48/A-49 | 41%/41% | P-54 | 14% | Q-8 | 4% | — | — | — | — | PGMEA/PGME (20/80) | 1.6% | 55 nm | 100° C./60 sec | 100° C./60 sec | TMAH (2.38%) |
| Resist 47 | A-50 | 75.20% | P-55 | 22.60% | Q-22 | 2.20% | — | — | — | — | PGMEA/PGME/γ-BL (79.5/19.5/1.0) | 1.4% | 50 nm | 100° C./45 sec | 100° C./60 sec | TMAH (2.38%) |
| Resist 48 | A-51 | 97% | — | — | Q-23 | 3% | — | — | — | — | PGMEA/CyHx/PGME (16/80/4) | 1.4% | 55 nm | 120° C./60 sec | 100° C./60 sec | TMAH (2.38%) |

TABLE 8

| Production method | Timing for starting gas charge | Type | Inert gas concentration (% by volume) | Differential pressure (kPa) |
|---|---|---|---|---|
| Comparative production method 1 | — | — | 80 | 0.0 |
| Comparative production method 2 | Between steps 1 and 2 | $N_2$ | 97 | 2.2 |
| Comparative production method 3 | Between steps 1 and 2 | Dry air | 80 | 2.2 |
| Comparative production method 4 | Between steps 1 and 2 | Dry air | 80 | 1.5 |
| Comparative production method 5 | Between steps 1 and 2 | $O_2$ | <70 | 1.5 |
| Production method 1 | Between steps 1 and 2 | $N_2$ | 91 | 1.5 |
| Production method 2 | During step 1 | $N_2$ | 91 | 1.5 |
| Production method 3 | Before step 1 | $N_2$ | 91 | 1.5 |
| Production method 4 | Before step 1 | $N_2$ | 91 | 0.5 |
| Production method 5 | Before step 1 | $N_2$ | 97 | 1.5 |
| Production method 6 | Before step 1 | $N_2$ | 97 | 0.5 |
| Production method 7 | Before step 1 | Ar | 97 | 0.5 |

In the tables, "<70" means less than 70% by volume.

<Evaluation of Moisture>

A Karl Fischer moisture measuring device (product name "MKC-710M", manufactured by Kyoto Denshi Kogyo Co., Ltd., Karl Fischer titration formula) was used for measuring a moisture in the prepared resist composition.

<Evaluation of Gas>

The dissolved gas concentration (μg/μL) in the prepared resist composition was measured using gas chromatography (GC390 manufactured by GL Sciences Inc.) having a TCD detector, and a column charged with a molecular sieve 5A. For a calibration curve, air was used, and a total value of the oxygen concentration and the nitrogen concentration was determined under the conditions of 25° C. and 1 atm.

Furthermore, the "Dissolved gas" column in Tables 9 to 11 indicates the total value of the oxygen concentration and the nitrogen concentration.

Examples A1 to A21 and Comparative Examples A1 to A33: KrF Exposure Experiment (Pattern Formation 1)

Using a spin coater "ACT-8" manufactured by Tokyo Electron Limited, an antireflection film was not provided on a silicon wafer (8-inch diameter) treated with HMDS (hexamethyldisilazane), and as shown in Table 9, each of the prepared resist compositions (resists 1 to 15) was applied to the wafer and baked under a PB condition corresponding to each resist composition shown in Table 5, thereby forming a resist film having a film thickness corresponding to each resist composition shown in Table 5.

The obtained resist film was subjected to pattern exposure through a mask having a line-and-space pattern so that a space width and a pitch width of the pattern were 5 μm and 20 μm, respectively, using a KrF excimer laser scanner (manufactured by ASML; PAS5500/850C, wavelength 248 nm, NA=0.60, σ=0.75).

The resist film after exposure was baked under a PEB condition corresponding to each resist composition shown in Table 5, then developed with a developer corresponding to each resist composition shown in Table 5 for 30 seconds, and spin-dried to obtain an isolated space pattern having a space width of 5 μm and a pitch width of 20 μm.

Furthermore, a scanning electron microscope (938011 manufactured by Hitachi High-Technologies Corporation) was used for the measurement of a pattern size.

(Evaluation of Defects)

A defect distribution on a silicon wafer was detected using KLA2360 (manufactured by KLA Tencor), and a shape of the defect was observed using SEMVision G3 (manufactured by AMAT). Among the observed defects, the number of defects in a mode in which there was a dent in the pattern part and a mode in which the pattern edge part was missing was counted, and a defect generation density (count/cm$^2$) was totalized by dividing the number by a scanned area of the defect inspection and evaluated according to the following criteria. The results are shown in Table 9.

A: The generation density is less than 0.05 count/cm$^2$.

B: The generation density is 0.05 count/cm$^2$ or more and less than 0.10 count/cm$^2$.

C: The generation density is 0.10 count/cm$^2$ or more.

(Evaluation of Sensitivity after Long-Term Storage)

Using the resist composition immediately after being produced as described above and the resist composition stored at room temperature for 3 months, the sensitivity was evaluated according to the following procedure.

As a method for evaluating the sensitivity, the irradiation energy upon finishing a line-and-space pattern having a space width of 5 μm and a pitch width of 20 μm was used as a sensitivity in the procedure (Pattern Formation 1).

The difference between the sensitivity in a case where the resist composition immediately after the production was used and the sensitivity in a case where the resist composition stored at room temperature for 3 months was used was evaluated according to the following criteria. The results are shown in Table 9.

A: The difference in the sensitivity is 0 mJ/cm$^2$ or more and less than 0.2 mJ/cm$^2$.

B: The difference in the sensitivity is 0.2 mJ/cm$^2$ or more and less than 0.4 mJ/cm$^2$.

C: The difference in the sensitivity is 0.4 mJ/cm$^2$ or more and less than 0.6 mJ/cm$^2$.

D: The difference in the sensitivity is 0.6 mJ/cm$^2$ or more.

TABLE 9

| | | | Resist composition | | | Evaluation | |
|---|---|---|---|---|---|---|---|
| | Production method | Type | Moisture (% by mass) | $O_2$ in dissolved gas (μg/μL) | Dissolved gas (μg/μL) | Evaluation of selectivity | Evaluation of defects |
| Comparative Example A1 | Comparative production method 1 | Resist 1 | 0.13 | 0.035 | 0.176 | D | A |
| Comparative Example A2 | Comparative production method 2 | Resist 1 | 0.07 | 0.024 | 0.221 | C | C |

TABLE 9-continued

| | | | Resist composition | | | Evaluation | |
|---|---|---|---|---|---|---|---|
| | Production method | Type | Moisture (% by mass) | $O_2$ in dissolved gas (μg/μL) | Dissolved gas (μg/μL) | Evaluation of selectivity | Evaluation of defects |
| Comparative Example A3 | Comparative production method 3 | Resist 1 | 0.07 | 0.044 | 0.221 | D | C |
| Comparative Example A4 | Comparative production method 4 | Resist 1 | 0.07 | 0.041 | 0.206 | D | B |
| Comparative Example A5 | Comparative production method 5 | Resist 1 | 0.07 | 0.094 | 0.206 | D | B |
| Example A1 | Production method 1 | Resist 1 | 0.07 | 0.030 | 0.206 | C | B |
| Example A2 | Production method 2 | Resist 1 | 0.05 | 0.030 | 0.206 | C | B |
| Example A3 | Production method 3 | Resist 1 | 0.04 | 0.030 | 0.206 | B | B |
| Example A4 | Production method 4 | Resist 1 | 0.04 | 0.028 | 0.185 | B | A |
| Example A5 | Production method 5 | Resist 1 | 0.04 | 0.023 | 0.206 | A | B |
| Example A6 | Production method 6 | Resist 1 | 0.04 | 0.023 | 0.185 | A | A |
| Example A7 | Production method 7 | Resist 1 | 0.04 | 0.023 | 0.185 | A | A |
| Comparative Example A6 | Comparative production method 1 | Resist 2 | 0.12 | 0.035 | 0.174 | D | A |
| Comparative Example A7 | Comparative production method 1 | Resist 3 | 0.12 | 0.035 | 0.174 | D | A |
| Comparative Example A8 | Comparative production method 1 | Resist 4 | 0.12 | 0.035 | 0.173 | D | A |
| Comparative Example A9 | Comparative production method 1 | Resist 5 | 0.13 | 0.035 | 0.174 | D | A |
| Comparative Example A10 | Comparative production method 1 | Resist 6 | 0.12 | 0.034 | 0.172 | D | A |
| Comparative Example A11 | Comparative production method 1 | Resist 7 | 0.13 | 0.035 | 0.175 | D | A |
| Comparative Example A12 | Comparative production method 1 | Resist 8 | 0.13 | 0.035 | 0.174 | D | A |
| Comparative Example A13 | Comparative production method 1 | Resist 9 | 0.12 | 0.034 | 0.172 | D | A |
| Comparative Example A14 | Comparative production method 1 | Resist 10 | 0.12 | 0.035 | 0.174 | D | A |
| Comparative Example A15 | Comparative production method 1 | Resist 11 | 0.12 | 0.034 | 0.172 | D | A |
| Comparative Example A16 | Comparative production method 1 | Resist 12 | 0.12 | 0.034 | 0.172 | D | A |
| Comparative Example A17 | Comparative production method 1 | Resist 13 | 0.12 | 0.035 | 0.174 | D | A |
| Comparative Example A18 | Comparative production method 1 | Resist 14 | 0.12 | 0.035 | 0.174 | D | A |
| Comparative Example A19 | Comparative production method 1 | Resist 15 | 0.12 | 0.035 | 0.174 | D | A |
| Comparative Example A20 | Comparative production method 2 | Resist 2 | 0.06 | 0.024 | 0.219 | C | C |
| Comparative Example A21 | Comparative production method 2 | Resist 3 | 0.06 | 0.024 | 0.219 | C | C |
| Comparative Example A22 | Comparative production method 2 | Resist 4 | 0.06 | 0.024 | 0.218 | C | C |
| Comparative Example A23 | Comparative production method 2 | Resist 5 | 0.06 | 0.024 | 0.219 | C | C |
| Comparative Example A24 | Comparative production method 2 | Resist 6 | 0.06 | 0.024 | 0.217 | C | C |
| Comparative Example A25 | Comparative production method 2 | Resist 7 | 0.06 | 0.024 | 0.221 | C | C |
| Comparative Example A26 | Comparative production method 2 | Resist 8 | 0.06 | 0.024 | 0.219 | C | C |
| Comparative Example A27 | Comparative production method 2 | Resist 9 | 0.06 | 0.024 | 0.217 | C | C |
| Comparative Example A28 | Comparative production method 2 | Resist 10 | 0.06 | 0.024 | 0.218 | C | C |
| Comparative Example A29 | Comparative production method 2 | Resist 11 | 0.06 | 0.023 | 0.216 | C | C |
| Comparative Example A30 | Comparative production method 2 | Resist 12 | 0.06 | 0.024 | 0.217 | C | C |
| Comparative Example A31 | Comparative production method 2 | Resist 13 | 0.06 | 0.024 | 0.218 | C | C |
| Comparative Example A32 | Comparative production method 2 | Resist 14 | 0.06 | 0.024 | 0.218 | C | C |
| Comparative Example A33 | Comparative production method 2 | Resist 15 | 0.06 | 0.024 | 0.218 | C | C |
| Example A8 | Production method 6 | Resist 2 | 0.04 | 0.022 | 0.183 | A | A |
| Example A9 | Production method 6 | Resist 3 | 0.04 | 0.022 | 0.183 | A | A |
| Example A10 | Production method 6 | Resist 4 | 0.04 | 0.022 | 0.183 | A | A |
| Example A11 | Production method 6 | Resist 5 | 0.04 | 0.023 | 0.184 | A | A |
| Example A12 | Production method 6 | Resist 6 | 0.04 | 0.022 | 0.182 | A | A |
| Example A13 | Production method 6 | Resist 7 | 0.04 | 0.023 | 0.185 | A | A |
| Example A14 | Production method 6 | Resist 8 | 0.04 | 0.023 | 0.184 | A | A |
| Example A15 | Production method 6 | Resist 9 | 0.04 | 0.022 | 0.182 | A | A |
| Example A16 | Production method 6 | Resist 10 | 0.04 | 0.022 | 0.183 | A | A |
| Example A17 | Production method 6 | Resist 11 | 0.04 | 0.022 | 0.181 | A | A |
| Example A18 | Production method 6 | Resist 12 | 0.04 | 0.022 | 0.182 | A | A |
| Example A19 | Production method 6 | Resist 13 | 0.04 | 0.022 | 0.183 | A | A |
| Example A20 | Production method 6 | Resist 14 | 0.04 | 0.022 | 0.183 | A | A |
| Example A21 | Production method 6 | Resist 15 | 0.04 | 0.022 | 0.183 | A | A |

As shown in Table 9, it was confirmed that a desired effect can be obtained by the production method of the embodiment of the present invention.

Above all, from the comparison of Examples A1 to A3, it was confirmed that in a case where the step 3 is carried out, a more excellent effect can be obtained.

Furthermore, from the comparison of Examples A3 and A4, it was confirmed that in a case where the difference between the atmospheric pressure inside the stirring tank and the atmospheric pressure outside the stirring tank is 0.8 kPa or less, a more excellent effect can be obtained.

In addition, from the comparison of Examples A3 and A5 and the comparison of Examples A4 and A6, it was confirmed that in a case where the inert gas concentration in the gas is 95% by volume or more, a more excellent effect can be obtained.

Examples B1 to B22 and Comparative Examples B1 to B35: ArF Exposure Experiment (Pattern Formation 2)

A composition for forming an organic antireflection film, ARC29SR (manufactured by Brewer Science, Inc.), was applied onto a silicon wafer (12-inch diameter), using a spin coater "ACT-12" manufactured by Tokyo Electron Limited, and baked at 205° C. for 60 seconds to form an antireflection film having a film thickness of 98 nm.

The resist composition (resists 16 to 31) shown in Table 10 was applied onto the obtained antireflection film using the same device, and baked under a PB condition corresponding to each resist composition shown in Table 6 to obtain a resist film having a film thickness corresponding to each resist composition shown in Table 6.

The obtained resist film was subjected to pattern exposure through a square array of 6% halftone masks having a hole portion of 45 nm and a pitch between the holes of 90 nm, using an ArF excimer laser immersion scanner (manufactured by ASML; XT1700i, NA1.20, C-Quad, outer sigma 0.900, inner sigma 0.812, XY deflection). Ultrapure water was used as the immersion liquid.

The resist film after the exposure was baked under a PEB condition corresponding to each resist composition shown in Table 6, developed with a developer corresponding to each resist composition shown in Table 6 for 30 seconds, and then rinsed with pure water for 30 seconds. Thereafter, the resist film was spin-dried to obtain a hole pattern having a pore diameter of 45 nm.

Furthermore, a scanning electron microscope (938011 manufactured by Hitachi High-Technologies Corporation) was used for the measurement of a pattern size.

(Evaluation of Pattern Defects)

The defect distribution on the silicon wafer was detected using UVision5 (manufactured by AMAT), and the shape of the defect was observed using SEMVisionG4 (manufactured by AMAT). Among the observed defects, the number of defects whose hole pattern shape was not normal and which was connected to adjacent holes or had a larger size than that of a target pattern was counted, a defect generation density (count/cm$^2$) was totalized by dividing the number by a scanned area of the defect inspection and evaluated according to the following criteria. The results are shown in Table 10.

A: The generation density is less than 0.05 count/cm$^2$.

B: The generation density is 0.05 count/cm$^2$ or more and less than 0.10 count/cm$^2$.

C: The generation density is 0.10 count/cm$^2$ or more.

(Evaluation of Sensitivity After Long-Term Storage)

Using the resist composition immediately after being produced as described above and the resist composition stored at room temperature for 3 months, the sensitivity was evaluated according to the following procedure.

As a method for evaluating the sensitivity, in the procedure (Pattern Formation 2), the irradiation energy in a case where finishing the hole pattern having a pore diameter of 45 nm was used as a sensitivity.

The difference between the sensitivity in a case where the resist composition immediately after the production was used and the sensitivity in a case where the resist composition stored at room temperature for 3 months was used was evaluated according to the following criteria. The results are shown in Table 10.

A: The difference in the sensitivity is 0 mJ/cm$^2$ or more and less than 0.2 mJ/cm$^2$.

B: The difference in the sensitivity is 0.2 mJ/cm$^2$ or more and less than 0.4 mJ/cm$^2$.

C: The difference in the sensitivity is 0.4 mJ/cm$^2$ or more and less than 0.6 mJ/cm$^2$.

D: The difference in the sensitivity is 0.6 mJ/cm$^2$ or more.

TABLE 10

| | Production method | Resist composition Type | Moisture (% by mass) | $O_2$ in dissolved gas (μg/μL) | Dissolved gas (μg/μL) | Evaluation of selectivity | Evaluation of defects |
|---|---|---|---|---|---|---|---|
| Comparative Example B1 | Comparative production method 1 | Resist 16 | 0.11 | 0.034 | 0.172 | D | A |
| Comparative Example B2 | Comparative production method 2 | Resist 16 | 0.06 | 0.023 | 0.213 | C | C |
| Comparative Example B3 | Comparative production method 3 | Resist 16 | 0.06 | 0.043 | 0.213 | D | C |
| Comparative Example B4 | Comparative production method 4 | Resist 16 | 0.06 | 0.040 | 0.199 | D | B |
| Comparative Example B5 | Comparative production method 5 | Resist 16 | 0.06 | 0.090 | 0.199 | D | B |
| Example B1 | Production method 1 | Resist 16 | 0.06 | 0.029 | 0.199 | C | B |
| Example B2 | Production method 2 | Resist 16 | 0.05 | 0.029 | 0.199 | C | B |
| Example B3 | Production method 3 | Resist 16 | 0.04 | 0.029 | 0.199 | B | B |
| Example B4 | Production method 4 | Resist 16 | 0.04 | 0.027 | 0.181 | B | A |
| Example B5 | Production method 5 | Resist 16 | 0.04 | 0.023 | 0.199 | A | B |
| Example B6 | Production method 6 | Resist 16 | 0.04 | 0.022 | 0.181 | A | A |
| Example B7 | Production method 7 | Resist 16 | 0.04 | 0.022 | 0.181 | A | A |
| Comparative Example B6 | Comparative production method 1 | Resist 17 | 0.11 | 0.034 | 0.172 | D | A |
| Comparative Example B7 | Comparative production method 1 | Resist 18 | 0.11 | 0.034 | 0.172 | D | A |
| Comparative Example B8 | Comparative production method 1 | Resist 19 | 0.11 | 0.034 | 0.172 | D | A |
| Comparative Example B9 | Comparative production method 1 | Resist 20 | 0.11 | 0.034 | 0.172 | D | A |
| Comparative Example B10 | Comparative production method 1 | Resist 21 | 0.11 | 0.034 | 0.172 | D | A |
| Comparative Example B11 | Comparative production method 1 | Resist 22 | 0.11 | 0.034 | 0.172 | D | A |
| Comparative Example B12 | Comparative production method 1 | Resist 23 | 0.11 | 0.034 | 0.172 | D | A |
| Comparative Example B13 | Comparative production method 1 | Resist 24 | 0.11 | 0.034 | 0.172 | D | A |
| Comparative Example B14 | Comparative production method 1 | Resist 25 | 0.11 | 0.034 | 0.172 | D | A |
| Comparative Example B15 | Comparative production method 1 | Resist 26 | 0.12 | 0.035 | 0.175 | D | A |

TABLE 10-continued

|  | Production method | Type | Moisture (% by mass) | O₂ in dissolved gas (μg/μL) | Dissolved gas (μg/μL) | Evaluation of selectivity | Evaluation of defects |
|---|---|---|---|---|---|---|---|
| Comparative Example B16 | Comparative production method 1 | Resist 27 | 0.12 | 0.035 | 0.175 | D | A |
| Comparative Example B17 | Comparative production method 1 | Resist 28 | 0.13 | 0.036 | 0.178 | D | A |
| Comparative Example B18 | Comparative production method 1 | Resist 29 | 0.13 | 0.036 | 0.178 | D | A |
| Comparative Example B19 | Comparative production method 1 | Resist 30 | 0.12 | 0.035 | 0.175 | D | A |
| Comparative Example B20 | Comparative production method 1 | Resist 31 | 0.13 | 0.036 | 0.178 | D | A |
| Comparative Example B21 | Comparative production method 2 | Resist 17 | 0.06 | 0.023 | 0.213 | C | C |
| Comparative Example B22 | Comparative production method 2 | Resist 18 | 0.06 | 0.023 | 0.213 | C | C |
| Comparative Example B23 | Comparative production method 2 | Resist 19 | 0.06 | 0.023 | 0.213 | C | C |
| Comparative Example B24 | Comparative production method 2 | Resist 20 | 0.06 | 0.023 | 0.213 | C | C |
| Comparative Example B25 | Comparative production method 2 | Resist 21 | 0.06 | 0.023 | 0.213 | C | C |
| Comparative Example B26 | Comparative production method 2 | Resist 22 | 0.06 | 0.023 | 0.213 | C | C |
| Comparative Example B27 | Comparative production method 2 | Resist 23 | 0.06 | 0.023 | 0.213 | C | C |
| Comparative Example B28 | Comparative production method 2 | Resist 24 | 0.06 | 0.023 | 0.213 | C | C |
| Comparative Example B29 | Comparative production method 2 | Resist 25 | 0.06 | 0.023 | 0.213 | C | C |
| Comparative Example B30 | Comparative production method 2 | Resist 26 | 0.06 | 0.023 | 0.217 | C | C |
| Comparative Example B31 | Comparative production method 2 | Resist 27 | 0.06 | 0.023 | 0.217 | C | C |
| Comparative Example B32 | Comparative production method 2 | Resist 28 | 0.07 | 0.024 | 0.221 | D | C |
| Comparative Example B33 | Comparative production method 2 | Resist 29 | 0.07 | 0.024 | 0.221 | D | C |
| Comparative Example B34 | Comparative production method 2 | Resist 30 | 0.06 | 0.023 | 0.217 | C | C |
| Comparative Example B35 | Comparative production method 2 | Resist 31 | 0.07 | 0.024 | 0.221 | D | C |
| Example B8 | Production method 6 | Resist 17 | 0.04 | 0.022 | 0.181 | A | A |
| Example B9 | Production method 6 | Resist 18 | 0.04 | 0.022 | 0.181 | A | A |
| Example B10 | Production method 6 | Resist 19 | 0.04 | 0.022 | 0.181 | A | A |
| Example B11 | Production method 6 | Resist 20 | 0.04 | 0.022 | 0.181 | A | A |
| Example B12 | Production method 6 | Resist 21 | 0.04 | 0.022 | 0.181 | A | A |
| Example B13 | Production method 6 | Resist 22 | 0.04 | 0.022 | 0.181 | A | A |
| Example B14 | Production method 6 | Resist 23 | 0.04 | 0.022 | 0.181 | A | A |
| Example B15 | Production method 6 | Resist 24 | 0.04 | 0.022 | 0.181 | A | A |
| Example B16 | Production method 6 | Resist 25 | 0.04 | 0.022 | 0.181 | A | A |
| Example B17 | Production method 6 | Resist 26 | 0.04 | 0.023 | 0.183 | A | A |
| Example B18 | Production method 6 | Resist 27 | 0.04 | 0.023 | 0.183 | A | A |
| Example B19 | Production method 6 | Resist 28 | 0.05 | 0.023 | 0.187 | A | A |
| Example B20 | Production method 6 | Resist 29 | 0.05 | 0.023 | 0.187 | A | A |
| Example B21 | Production method 6 | Resist 30 | 0.04 | 0.023 | 0.183 | A | A |
| Example B22 | Production method 6 | Resist 31 | 0.05 | 0.023 | 0.187 | A | A |

As shown in Table 10, it was confirmed that a desired effect can be obtained by the production method of the embodiment of the present invention.

Above all, from the comparison of Examples B1 to B3, it was confirmed that in a case where the step 3 is carried out, a more excellent effect can be obtained.

Furthermore, from the comparison of Examples B3 and B4, it was confirmed that in a case where the difference between the atmospheric pressure inside the stirring tank and the atmospheric pressure outside the stirring tank is 0.8 kPa or less, a more excellent effect can be obtained.

In addition, from the comparison of Examples B3 and B5 and the comparison of Examples B4 and B6, it was confirmed that in a case where the inert gas concentration in the gas is 95% by volume or more, a more excellent effect can be obtained.

Examples C1 to C23 and Comparative Examples C1 to C37: EUV Exposure Experiment (Pattern Formation 3)

A composition for forming an organic antireflection film, AL412 (manufactured by Brewer Science, Inc.), was applied onto a silicon wafer (12-inch diameter), using a spin coater "ACT-12" manufactured by Tokyo Electron Limited, and baked at 205° C. for 60 seconds to form an antireflection film having a film thickness of 200 nm.

The resist composition (resists 32 to 48) shown in Table 11 was applied onto the obtained antireflection film using the same device, and baked under a PB condition corresponding to each resist composition shown in Table 7 to obtain a resist film having a film thickness corresponding to each resist composition shown in Table 7.

The obtained resist film was subjected to pattern exposure through a square array with masks having a hole portion of 28 nm and a pitch between the holes of 55 nm, using an EUV exposure device (manufactured by Exitech Ltd., Micro Exposure Tool, NA 0.3, Quadrupol, outer sigma 0.68, inner sigma 0.36).

The resist film after the exposure was baked under a PEB condition corresponding to each resist composition shown in Table 7, developed with a developer corresponding to each resist composition shown in Table 7 for 30 seconds, and then rinsed with pure water for 30 seconds. Thereafter, the resist film was spin-dried to obtain a hole pattern having a pore diameter of 28 nm.

Furthermore, a scanning electron microscope (938011 manufactured by Hitachi High-Technologies Corporation) was used for the measurement of a pattern size.

(Evaluation of Pattern Defects)

The defect distribution on the silicon wafer was detected using UVision5 (manufactured by AMAT), and the shape of the defect was observed using SEMVisionG4 (manufactured by AMAT). Among the observed defects, the number of defects whose hole pattern shape was not normal and which was connected to adjacent holes or had a larger size than that of a target pattern was counted, a defect generation density (count/cm$^2$) was totalized by dividing the number by a scanned area of the defect inspection and evaluated according to the following criteria. The results are shown in Table 11.

A: The generation density is less than 0.05 count/cm$^2$.
B: The generation density is 0.05 count/cm$^2$ or more and less than 0.10 count/cm$^2$.
C: The generation density is 0.10 count/cm$^2$ or more.

(Evaluation of Sensitivity After Long-Term Storage)

Using the resist composition immediately after being produced as described above and the resist composition stored at room temperature for 3 months, the sensitivity was evaluated according to the following procedure.

As a method for evaluating the sensitivity, in the procedure (Pattern Formation 3), an irradiation energy upon finishing the hole pattern having a pore diameter of 28 nm was used as the sensitivity.

The difference between the sensitivity in a case where the resist composition immediately after the production was used and the sensitivity in a case where the resist composition stored at room temperature for 3 months was used was evaluated according to the following criteria. The results are shown in Table 11.

A: The difference in the sensitivity is 0 mJ/cm$^2$ or more and less than 0.2 mJ/cm$^2$.
B: The difference in the sensitivity is 0.2 mJ/cm$^2$ or more and less than 0.4 mJ/cm$^2$.
C: The difference in the sensitivity is 0.4 mJ/cm$^2$ or more and less than 0.6 mJ/cm$^2$.
D: The difference in the sensitivity is 0.6 mJ/cm$^2$ or more.

TABLE 11

| | Production method | Type | Moisture (% by mass) | O$_2$ in dissolved gas (µg/µL) | Dissolved gas (µg/µL) | Evaluation of selectivity | Evaluation of defects |
|---|---|---|---|---|---|---|---|
| Comparative Example C1 | Comparative production method 1 | Resist 32 | 0.12 | 0.035 | 0.173 | D | A |
| Comparative Example C2 | Comparative production method 2 | Resist 32 | 0.06 | 0.023 | 0.216 | C | C |
| Comparative Example C3 | Comparative production method 3 | Resist 32 | 0.06 | 0.043 | 0.216 | D | C |
| Comparative Example C4 | Comparative production method 4 | Resist 32 | 0.06 | 0.040 | 0.202 | D | B |
| Comparative Example C5 | Comparative production method 5 | Resist 32 | 0.06 | 0.091 | 0.202 | D | B |
| Example C1 | Production method 1 | Resist 32 | 0.06 | 0.029 | 0.202 | C | B |
| Example C2 | Production method 2 | Resist 32 | 0.05 | 0.029 | 0.202 | C | B |
| Example C3 | Production method 3 | Resist 32 | 0.04 | 0.029 | 0.202 | B | B |
| Example C4 | Production method 4 | Resist 32 | 0.04 | 0.027 | 0.182 | B | A |
| Example C5 | Production method 5 | Resist 32 | 0.04 | 0.023 | 0.202 | A | B |
| Example C6 | Production method 6 | Resist 32 | 0.04 | 0.022 | 0.182 | A | A |
| Example C7 | Production method 7 | Resist 32 | 0.04 | 0.022 | 0.182 | A | A |
| Comparative Example C6 | Comparative production method 1 | Resist 33 | 0.12 | 0.035 | 0.173 | D | A |
| Comparative Example C7 | Comparative production method 1 | Resist 34 | 0.12 | 0.035 | 0.174 | D | A |
| Comparative Example C8 | Comparative production method 1 | Resist 35 | 0.12 | 0.034 | 0.172 | D | A |
| Comparative Example C9 | Comparative production method 1 | Resist 36 | 0.12 | 0.035 | 0.174 | D | A |
| Comparative Example C10 | Comparative production method 1 | Resist 37 | 0.12 | 0.035 | 0.173 | D | A |
| Comparative Example C11 | Comparative production method 1 | Resist 38 | 0.12 | 0.035 | 0.173 | D | A |
| Comparative Example C12 | Comparative production method 1 | Resist 39 | 0.12 | 0.035 | 0.174 | D | A |
| Comparative Example C13 | Comparative production method 1 | Resist 40 | 0.13 | 0.035 | 0.176 | D | A |
| Comparative Example C14 | Comparative production method 1 | Resist 41 | 0.13 | 0.035 | 0.176 | D | A |

TABLE 11-continued

| | | | Resist composition | | | Evaluation | |
|---|---|---|---|---|---|---|---|
| | Production method | Type | Moisture (% by mass) | $O_2$ in dissolved gas (μg/μL) | Dissolved gas (μg/μL) | Evaluation of selectivity | Evaluation of defects |
| Comparative Example C15 | Comparative production method 1 | Resist 42 | 0.12 | 0.035 | 0.173 | D | A |
| Comparative Example C16 | Comparative production method 1 | Resist 43 | 0.12 | 0.035 | 0.174 | D | A |
| Comparative Example C17 | Comparative production method 1 | Resist 44 | 0.12 | 0.035 | 0.173 | D | A |
| Comparative Example C18 | Comparative production method 1 | Resist 45 | 0.12 | 0.034 | 0.172 | D | A |
| Comparative Example C19 | Comparative production method 1 | Resist 46 | 0.12 | 0.035 | 0.174 | D | A |
| Comparative Example C20 | Comparative production method 1 | Resist 47 | 0.12 | 0.035 | 0.173 | D | A |
| Comparative Example C21 | Comparative production method 1 | Resist 48 | 0.12 | 0.035 | 0.173 | D | A |
| Comparative Example C22 | Comparative production method 2 | Resist 33 | 0.06 | 0.023 | 0.216 | C | C |
| Comparative Example C23 | Comparative production method 2 | Resist 34 | 0.06 | 0.024 | 0.218 | C | C |
| Comparative Example C24 | Comparative production method 2 | Resist 35 | 0.06 | 0.023 | 0.216 | C | C |
| Comparative Example C25 | Comparative production method 2 | Resist 36 | 0.06 | 0.024 | 0.218 | C | C |
| Comparative Example C26 | Comparative production method 2 | Resist 37 | 0.06 | 0.023 | 0.216 | C | C |
| Comparative Example C27 | Comparative production method 2 | Resist 38 | 0.06 | 0.023 | 0.216 | C | C |
| Comparative Example C28 | Comparative production method 2 | Resist 39 | 0.06 | 0.024 | 0.218 | C | C |
| Comparative Example C29 | Comparative production method 2 | Resist 40 | 0.07 | 0.024 | 0.221 | D | C |
| Comparative Example C30 | Comparative production method 2 | Resist 41 | 0.07 | 0.024 | 0.221 | D | C |
| Comparative Example C31 | Comparative production method 2 | Resist 42 | 0.06 | 0.023 | 0.216 | C | C |
| Comparative Example C32 | Comparative production method 2 | Resist 43 | 0.06 | 0.024 | 0.218 | C | C |
| Comparative Example C33 | Comparative production method 2 | Resist 44 | 0.06 | 0.024 | 0.217 | C | C |
| Comparative Example C34 | Comparative production method 2 | Resist 45 | 0.06 | 0.023 | 0.216 | C | C |
| Comparative Example C35 | Comparative production method 2 | Resist 46 | 0.06 | 0.024 | 0.218 | C | C |
| Comparative Example C36 | Comparative production method 2 | Resist 47 | 0.06 | 0.023 | 0.216 | C | C |
| Comparative Example C37 | Comparative production method 2 | Resist 48 | 0.06 | 0.023 | 0.216 | C | C |
| Example C8 | Production method 6 | Resist 33 | 0.04 | 0.022 | 0.182 | A | A |
| Example C9 | Production method 6 | Resist 34 | 0.04 | 0.022 | 0.183 | A | A |
| Example C10 | Production method 6 | Resist 35 | 0.04 | 0.022 | 0.181 | A | A |
| Example C11 | Production method 6 | Resist 36 | 0.04 | 0.022 | 0.183 | A | A |
| Example C12 | Production method 6 | Resist 37 | 0.04 | 0.022 | 0.182 | A | A |
| Example C13 | Production method 6 | Resist 38 | 0.04 | 0.022 | 0.182 | A | A |
| Example C14 | Production method 6 | Resist 39 | 0.04 | 0.022 | 0.183 | A | A |
| Example C15 | Production method 6 | Resist 40 | 0.04 | 0.023 | 0.186 | A | A |
| Example C16 | Production method 6 | Resist 41 | 0.04 | 0.023 | 0.186 | A | A |
| Example C17 | Production method 6 | Resist 42 | 0.04 | 0.022 | 0.182 | A | A |
| Example C18 | Production method 6 | Resist 43 | 0.04 | 0.022 | 0.183 | A | A |
| Example C19 | Production method 6 | Resist 44 | 0.04 | 0.022 | 0.183 | A | A |
| Example C20 | Production method 6 | Resist 45 | 0.04 | 0.022 | 0.181 | A | A |
| Example C21 | Production method 6 | Resist 46 | 0.04 | 0.022 | 0.183 | A | A |
| Example C22 | Production method 6 | Resist 47 | 0.04 | 0.022 | 0.182 | A | A |
| Example C23 | Production method 6 | Resist 48 | 0.04 | 0.022 | 0.182 | A | A |

As shown in Table 11, it was confirmed that a desired effect can be obtained by the production method of the embodiment of the present invention.

Above all, from the comparison of Examples C1 to C3, it was confirmed that in a case where the step 3 is carried out, a more excellent effect can be obtained.

Furthermore, from the comparison of Examples C3 and C4, it was confirmed that in a case where the difference between the atmospheric pressure inside the stirring tank and the atmospheric pressure outside the stirring tank is 0.8 kPa or less, a more excellent effect can be obtained.

In addition, from the comparison of Examples C3 and C5 and the comparison of Examples C4 and C6, it was confirmed that in a case where the inert gas concentration in the gas is 95% by volume or more, a more excellent effect can be obtained.

EXPLANATION OF REFERENCES

10: stirring tank
12 stirring shaft
14 stirring blade
16 circulation piping
18 filter
20 discharge piping
22 discharge nozzle

What is claimed is:

1. A method for producing a radiation-sensitive resin composition comprising:
   a step 1 of putting at least a resin having a polarity that increases by an action of an acid, a photoacid generator, and a solvent into a stirring tank; and
   a step 2 of producing a radiation-sensitive resin composition by stirring and mixing the resin having a polarity that increases by the action of an acid, the photoacid generator, and the solvent in the stirring tank under a gas having an inert gas concentration of 90% by volume or more,
   wherein in the step 2, an atmospheric pressure inside the stirring tank is higher than an atmospheric pressure outside the stirring tank, and
   in the step 2, a difference between the atmospheric pressure inside the stirring tank and the atmospheric pressure outside the stirring tank is 2.0 kPa or less.

2. The method for producing a radiation-sensitive resin composition according to claim 1,
   wherein the inert gas concentration in the gas is 95% by volume or more.

3. The method for producing a radiation-sensitive resin composition according to claim 1,
   wherein the difference between the atmospheric pressure inside the stirring tank and the atmospheric pressure outside the stirring tank is 0.8 kPa or less.

4. The method for producing a radiation-sensitive resin composition according to claim 1,
   wherein a gas in the stirring tank is substituted with the gas having an inert gas concentration of 90% by volume or more before the step 1.

5. The method for producing a radiation-sensitive resin composition according to claim 1,
   wherein a gas in the stirring tank is substituted with the gas having an inert gas concentration of 90% by volume or more in the step 1.

6. The method for producing a radiation-sensitive resin composition according to claim 1,
   wherein a gas in the stirring tank is substituted with the gas having an inert gas concentration of 90% by volume or more between the step 1 and the step 2.

7. The method for producing a radiation-sensitive resin composition according to claim 1,
   wherein a concentration of solid contents of the radiation-sensitive resin composition is 10% by mass or more.

8. The method for producing a radiation-sensitive resin composition according to claim 1,
   wherein the resin having a polarity that increases by the action of an acid has a repeating unit derived from hydroxystyrene.

* * * * *